United States Patent
Ware et al.

(10) Patent No.: US 9,563,597 B2
(45) Date of Patent: Feb. 7, 2017

(54) HIGH CAPACITY MEMORY SYSTEMS WITH INTER-RANK SKEW TOLERANCE

(71) Applicant: Rambus Inc., Sunnyvale, CA (US)

(72) Inventors: Frederick A. Ware, Los Altos Hills, CA (US); Ely K. Tsern, Los Altos, CA (US); Brian S. Leibowitz, San Francisco, CA (US); Wayne Frederick Ellis, Campbell, CA (US); Akash Bansal, Santa Clara, CA (US); John Welsford Brooks, San Jose, CA (US); Kishore Ven Kasamsetty, Cupertino, CA (US)

(73) Assignee: Rambus Inc., Sunnyvale, CA (US)

( * ) Notice: Subject to any disclaimer, the term of this patent is extended or adjusted under 35 U.S.C. 154(b) by 144 days.

(21) Appl. No.: 14/386,561

(22) PCT Filed: Dec. 20, 2012

(86) PCT No.: PCT/US2012/071036
§ 371 (c)(1),
(2) Date: Sep. 19, 2014

(87) PCT Pub. No.: WO2013/141921
PCT Pub. Date: Sep. 26, 2013

(65) Prior Publication Data
US 2015/0089164 A1  Mar. 26, 2015

Related U.S. Application Data

(60) Provisional application No. 61/612,667, filed on Mar. 19, 2012.

(51) Int. Cl.
G06F 12/00 (2006.01)
G06F 13/42 (2006.01)
(Continued)

(52) U.S. Cl.
CPC ....... *G06F 13/4234* (2013.01); *G06F 13/1647* (2013.01); *G06F 13/1657* (2013.01);
(Continued)

(58) Field of Classification Search
USPC .......................................................... 711/149
See application file for complete search history.

(56) References Cited

U.S. PATENT DOCUMENTS 5,895,481 A * 4/1999 Yap .......................... G11C 8/18
                                                              365/193
7,050,316 B1    5/2006 Lin et al.
(Continued)

FOREIGN PATENT DOCUMENTS

EP              2413328 A1     2/2012
WO    WO-2010-080172 A1        7/2010

OTHER PUBLICATIONS

Guo et al., "Resistive Computation: Avoiding the Power-Wall with Low-Leakage, STT-MRAM Based Computing," Proceedings of the 37th Annual International Symposium on Computer Architecture (ISCA), Jun. 19-23, 2010, pp. 371-382. 12 pages.
(Continued)

*Primary Examiner* — Mardochee Chery
(74) *Attorney, Agent, or Firm* — Charles Shemwell

(57) ABSTRACT

In a multirank memory system in which the clock distribution trees of each rank are permitted to drift over a wide range (e.g., low power memory systems), the fine-interleaving of commands between ranks is facilitated through the use of techniques that cause each addressed rank to properly sample commands intended for that rank, notwithstanding the drift. The ability to perform such "microthreading" provides for substantially enhanced memory capacity without sacrificing the performance of single rank systems. This
(Continued)

disclosure provides methods, memory controllers, memory devices and system designs adapted to these ends.

18 Claims, 28 Drawing Sheets

(51) Int. Cl.
    *G11C 7/10* (2006.01)
    *G11C 5/02* (2006.01)
    *G11C 29/02* (2006.01)
    *G06F 13/16* (2006.01)
    *G11C 5/04* (2006.01)

(52) U.S. Cl.
    CPC ............... *G11C 5/02* (2013.01); *G11C 7/10* (2013.01); *G11C 7/1072* (2013.01); *G11C 29/023* (2013.01); *G11C 29/028* (2013.01); *G11C 5/04* (2013.01); *G11C 2207/2254* (2013.01)

(56) References Cited

U.S. PATENT DOCUMENTS

| | | |
|---|---|---|
| 7,405,949 B2 | 7/2008 | Lee et al. |
| 7,464,282 B1 | 12/2008 | Abdollahi-Alibeik et al. |
| 2002/0178411 A1* | 11/2002 | Kohda .............. H04L 12/2697 714/712 |
| 2003/0099093 A1 | 5/2003 | Kuzmenka |
| 2007/0247935 A1 | 10/2007 | Ware et al. |
| 2008/0175071 A1 | 7/2008 | Lee et al. |
| 2009/0138646 A1 | 5/2009 | Ware et al. |
| 2009/0161475 A1 | 6/2009 | Kim et al. |
| 2010/0020583 A1 | 1/2010 | Kang et al. |
| 2010/0095057 A1 | 4/2010 | Li et al. |
| 2010/0110744 A1 | 5/2010 | El Baraji et al. |
| 2010/0220536 A1 | 9/2010 | Coteus et al. |
| 2010/0226185 A1 | 9/2010 | Lee |
| 2011/0299317 A1* | 12/2011 | Shaeffer ............ G11C 13/0002 365/106 |
| 2014/0192583 A1* | 7/2014 | Rajan ..................... G11C 7/10 365/63 |

OTHER PUBLICATIONS

PCT International Search Report and Written Opinion dated Apr. 30, 2013 in International Application No. PCT/US2012/071036. 17 pages.

PCT International Preliminary Report on Patentability dated Oct. 2, 2014 (Chapter I) in International Application No. PCT/US2012/071036. 11 pages.

\* cited by examiner

HIGH CAPACITY MEMORY SYSTEMS WITH INTER-RANK SKEW TOLERANCE

CROSS REFERENCE TO RELATED APPLICATIONS

Pursuant to 35 U.S.C. §§365 and 371, this application is a United States National Stage Application that claims priority to International Application No. PCT/US2012/071036 filed Dec. 20, 2012, which claims priority to U.S. Provisional Patent Application No. 61/612,667 filed Mar. 19, 2012. Each of the above-identified patent applications is hereby incorporated by reference in its entirety.

BACKGROUND

In memory systems having multiple memory ranks operating in independent time domains and coupled to a shared command path, delay is generally imposed between commands transmitted to different memory ranks to accommodate time-domain switching. While memory systems have historically enjoyed surplus command bandwidth that could be devoted to time domain switching (i.e., rendering the switching transparent), demand for reduced transaction granularity in modern systems is consuming the surplus, driving up command path utilization to the point where insufficient time remains to accommodate time-domain switching. As a result, memory controllers that employ micro-threading, module-threading or otherwise require high command signaling bandwidth are increasingly forced to insert delays or "bubbles" between commands directed to different memory ranks, thus incurring timing penalties that increase memory latency and reduce data throughput. In some cases, designers are limiting memory systems to a single rank to avoid such rank-switch timing penalties, sacrificing memory capacity to avoid compromised performance.

DETAILED DESCRIPTION

I. Overview

Figure 1A:
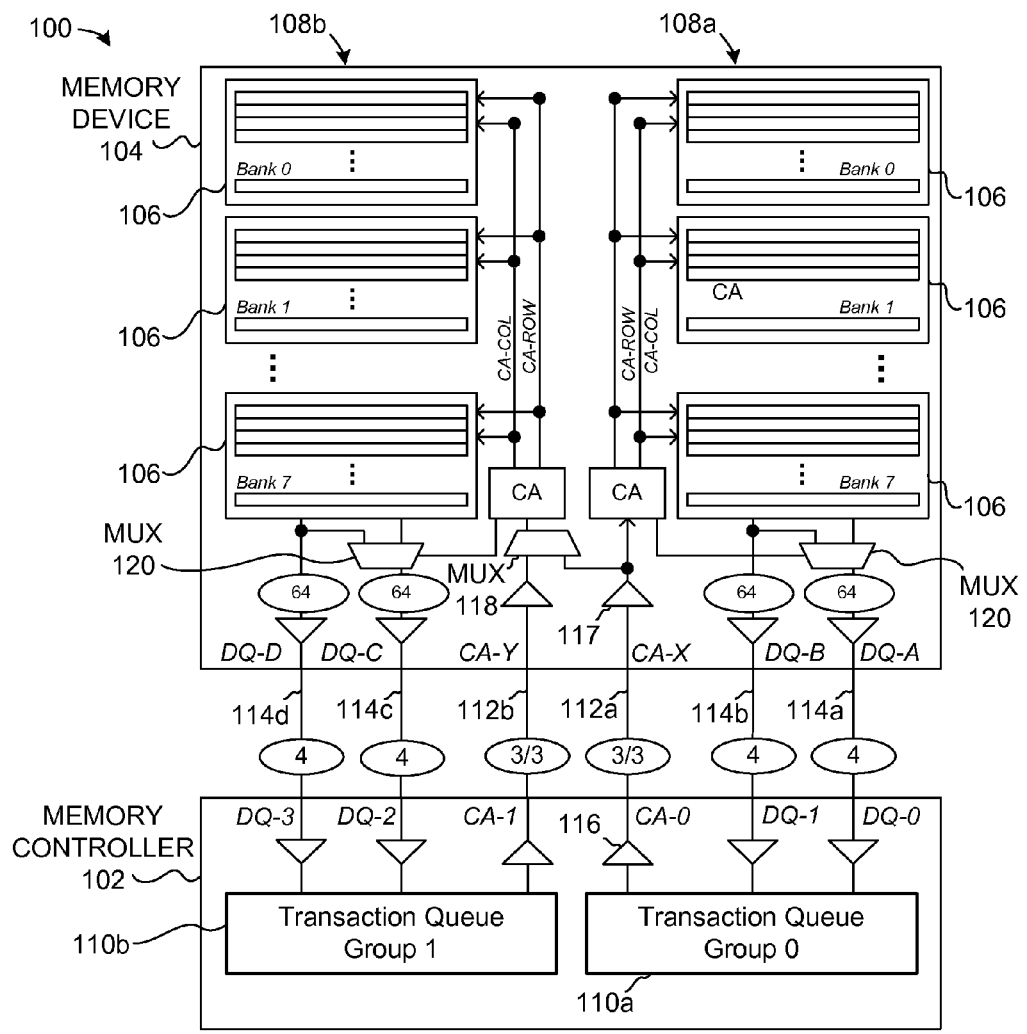
FIG. 1A shows a layout of a memory system rooted in a single, full-width memory component (e.g., a single memory device).

This disclosure provides a number of techniques and structures to facilitate increase in effective memory system capacity and/or more efficiently interleave commands directed to different memory ranks, particularly in low-power memory systems and devices. The techniques provided by this disclosure may be applied to memory devices, memory controllers, memory systems, signaling interfaces, and other types of synchronous digital systems.

Generally speaking, multiple-rank ("multirank") memory designs are facilitated using techniques to compensate for inter-rank clock skew, in a manner that permits effective rank-specific fine-interleaving of commands in a shared-CA path system. Three embodiments described below include (a) accompanying commands with a phase-calibrated timing signal specific to each rank, (b) sending certain commands via dedicated links only to an addressed rank, while other commands are sent over shared links to multiple ranks, and (c) using calibrated CA sampling instants or slots that can be assigned to individual ranks or memory devices. Other embodiments, techniques and features will become apparent from the discussion below.

A number of techniques disclosed herein are directed to memory systems that lack timing compensation for internal clock trees or buffers (i.e., open-loop clock distribution architecture) so that internal clocks are permitted to drift substantially relative to an input timing source and independently of similar internal clock drift in other devices. In cases where such drifting internal clocks are used to sample incoming commands, it becomes difficult to distribute a command over a shared link and yet have an addressed rank of memory components sample the command at precisely the right time. Herein, "memory rank" or "rank of memory components" refers to a set of one or more discrete integrated-circuit memory components that is selected for read or write access as a unit, as in a collection of memory chips coupled to a shared chip-select line or otherwise enabled to concurrently execute a command from a control component). Note that without techniques such as provided herein, it becomes difficult to perform inter-rank fine-interleaving of commands due to the need to change controller component timing compensation from rank to rank. To use an example specific to DRAM, in a multirank system having a point-to-multipoint (PtMP) command (CA) path, with these techniques, it becomes possible to open a row in a second rank prior to a column access or precharge in a first rank. Without these techniques, given the inter-rank clock skew issue just mentioned, it is prohibitive to perform this type of fine-grained command interleaving between ranks over a shared CA path.

To provide some further examples of the techniques specifically mentioned in the last paragraph:

(a) A phase-calibrated timing signal can be sent in a manner dedicated to each rank; such a timing signal is adjusted/deliberately selected by the memory controller so as to offset inter-rank skew, thus causing each rank to sample a shared CA path at a corresponding valid CA sampling time for that rank. That is, each memory rank samples the shared CA path at respective times that are (or may be) offset from one another to compensate for controller-to-rank CA propagation time differences and skews from rank-internal delays between the memory ranks.

(b) One or more signaling links that constitute a first portion of a multi-link CA path can be dedicated to individual memory ranks, while one or more signaling links that constitute a second portion of the CA path can be shared across ranks. In one embodiment, division of the multi-link CA path into dedicated and shared portions permits issuance of particular classes of commands or portions of commands to a specific rank only, e.g., a precharge or other command (e.g., refresh) not requiring data interchange can be sent on the dedicated CA link(s) while column access commands can be sent on the shared link(s).

(c) Each memory rank (or device) can be assigned a respective timing slot for the shared CA path, with the effective rate of multiple-command transmission reduced because of these timing slots. For example, in one embodiment, every command bit is repeated in successive timing slots, with each memory device being assigned a slot and a forwarded clock shifted in a manner common to both memory devices to optimize sampling of these slots by the aggregate ranks. Note that because of the effective slowdown in the time it takes to transfer each command, it is as if the CA path was run at half-rate, but doing so facilitates fine-interleaving of commands.

These techniques are specific examples of ways or means for compensating for or otherwise mitigating inter-rank timing drift. Generally speaking, for the techniques just-mentioned, there is at least one CA link that is shared by multiple memory ranks, and at least one specific CA link that is operated in a manner not requiring memory controller change of transmit phase specific to each addressed rank. Depending on embodiment, these shared and separate CA link(s) can be the same links, or they can be mutually-exclusive links. Note also that while many embodiments below focus on drift between respective ranks CA sampling instants for a shared link, the techniques presented herein can be applied to any form of offset between respective ranks' sampling instants, for example, due to manufacturing differences. Otherwise stated, the application of the techniques described herein to "drift" are optional, but many of the embodiments presented below will apply the techniques described herein to compensate for offset in the form of drift.

As was alluded to above, each rank can have one or more low power memory devices and, as such, each such memory device typically does not include a PLL to compensate for internal clock drift. Without built-in phase regulation, these memory devices are generally susceptible to clock drift up to and often exceeding a unit interval (UI), and may require clock cycle number and phase alignment circuitry. Note that integer clock cycle offset between ranks and framing boundaries for transmitted data words is generally not addressed by this disclosure, e.g., see US Publication No. 20110235459, application Ser. No. 13/132,091, internationally applied for on Jul. 9, 2009 on behalf of inventors Frederick A. Ware, Robert E. Palmer and John W. Poulton, and assigned to the same assignee as the present disclosure; this publication and associated application are hereby incorporated by reference. Note that the techniques discussed in that publication and associated can be used with the multi-rank techniques discussed herein, for example, to implement clock stoppage modes, ensure state preservation in low power memory devices, handle packet framing issues and otherwise address integer clock cycle components of timing drift. Note further that, as discussed in this disclosure, each memory rank may be constituted by a single memory device (i.e., memory die or integrated circuit) or a group of memory devices as in, for example, a memory module or integrated stack or assembly of memory devices. Finally, much of the discussion below will focus on dynamic random access memory (DRAM) specifically, but the inter-rank deskew principles presented herein can by extension be applied to other forms of memory.

Generally speaking, the multirank memory system presents a design where two or more such memory devices share CA and DQ resources. Rather than simply wait an extended period of time for a rank switch (e.g., $t_{rc}$~20 or more processor clock cycles), the techniques outlined above and described in further detail below permit reduction of this "rank switch bubble" to a much shorter time interval (e.g., 2-3 processor cycles—intervals primarily used for termination and driver switch). As a consequence, notwithstanding the low power context, it becomes much easier to perform rank switches (i.e., changing the target of signal transmission from one rank to another) without completely closing out a transaction or burst for a prior rank; that is, it becomes much easier to perform fine-interleaving of commands between memory ranks. For example, in a DRAM implementation, a control component may transmit a column access request (for a first transaction) to a first rank, then transmit a row activation request to a second rank (for a second transaction), and then transmit a precharge request to the first rank (to close out the first transaction), all without inserting large rank switch bubble(s) between the request transmissions.

II. Introduction to One Exemplary Platform

A. Threading and CA Management

It is noted that many of the memory controllers and memory devices discussed below are multimodal, supporting both single and multi-rank memory architectures. Thus, to introduce the inter-rank drift compensation principles discussed herein, it would be helpful to first introduce the operation of a single rank implementation.

FIG. 1A shows a system layout 100, including a memory controller 102, a memory device 104, and signal routing 112a-b/114a-d. In one implementation of system 100, memory device 104 is a DRAM (dynamic random access memory) integrated circuit, and the routing 112a-b/114a-d is either implemented as a printed circuit board trace or as routing in a multiple chip package or system in-package. The memory device 104 includes sixteen memory banks 106, with the memory banks arranged into two bank groups or bank sets 108a and 108b, one seen at the left-side of the memory device and one seen at the right-side. Note that each memory bank typically has its own dedicated sense amplifier (that is, the banks typically do not share sense amplifiers with other memory banks). Memory banks can share some buffers and other resources used to transfer data between the array and 10 circuitry, while respective bank groups (e.g., 108a, 108b) typically have independent circuitry to transfer data between the array and 10 circuitry. Thus, bank groups are such that it is typically possible to independently perform a transaction in one memory bank group (e.g., 108a) while a second transaction is ongoing in the other memory bank group (e.g., 108b), and to direct commands between these groups (e.g., multiple commands that make up a read or write transaction, such as activate, column access, or precharge commands, as well as other types of commands such as refresh commands, configuration commands, etc.). Note that while much of the description above is specific to DRAM, many other memory forms exist which utilize transactions that themselves are made up of multiple commands; flash memory, for example, programs memory cells by using repeated cycles of incrementally programming and verifying cell contents. Other analogies also exist, both in volatile memory and non-volatile memory; the techniques presented herein are equally applicable to all such memory forms.

In the particular configuration seen in FIG. 1A, there is a dedicated CA (command and address) path 112a/112b coupling each bank group 108a/108b to the memory controller 102, with the memory controller using a dedicated transaction queue 110a/110b to manage independent transactions with each bank group or bank set. A latency is associated with bank, row or column (i.e., defined time constraints) before another command can be issued to the same destination, and the memory controller uses the transaction queues to manage the commands that make up concurrent memory transactions in the respective bank groups, to match read data as it is retrieved with specific transactions in the queue, and perform related error processing. As depicted by FIG. 1A, there are sixteen bidirectional data (DQ) links arranged as four distinct DQ paths (114a/114b/114c/114d), and two separate sets of three-link CA paths (112a/112b). Four DQ ports (DQ-0, DQ-1, DQ-2 and DQ-3) of the memory controller respectively connect to four corresponding DQ ports DQ-A, DQ-B, DQ-C and DQ-D) on the memory device via a respective DQ path, while two CA ports (CA-0 and CA-1) of the memory controller respectively connect to two corresponding CA ports (CA-X and CA-Y). Note also that signal output drivers and receivers (e.g., CA-0 output driver 116 and CA-X receiver 117) show the direction of flow of data and commands for the read case, with simple extension to the write case (i.e., output drivers and receivers associated with the DQ path are simply reversed). As implied by the labels "64" seen within memory device 104, each 4-bit DQ path 114a/114b/114c/114d is used to convey a 64-bit read or write data word in connection with a memory read or write transaction, with a 16-to-1 serialization or 1-to-16 deserialization being effected by multiplexing circuitry within memory device 104 and memory controller 102. Each CA link in this embodiment is used to convey command/address information at DQ signaling rates. Thus, in such a "full-width mode," with each 24-bit command packet carried over a respective CA path, two sets of DQ paths are associated with the CA path so that the addressed bank set can exchange two 64-bit data words with the control component (or equivalently, a single 128-bit data word). Note that the number of paths and signaling rates can be varied, relative to each other or otherwise. In the depicted implementation, the transmit and receive clocks operate at double data rate (DDR) using a 1.6 gigahertz clock, meaning that each of the CA and DQ links conveys information at a signaling rate of 3.2 gigabits per second (Gb/s), with eight DQ links in total carrying up to 128 bits in eight clock cycles. In one embodiment, a clock signal is transmitted (forwarded) from the memory controller 102 to the memory device 104, as are one or more power mode (PM) signals. Such signals are omitted from FIG. 1A to avoid obscuring other features. In alternate implementations, there can also be data mask, chip select and other forms of signal lines that couple the memory controller 102 with the memory device 104. Note that instead of forwarding a clock from memory controller to memory device, some designs can also use a clock provided from a source external to these two components.

In the system of FIG. 1A and for the other systems described below, it is generally desirable to have a single component (e.g., memory controller or memory device) be usable in multiple, different configurations and in multiple types of systems. Accordingly, the memory controller and memory device embodiments shown in FIG. 1A permit several memory devices to be used for a given memory controller and/or memory device design, potentially as many as four. To accommodate four memory devices, for example, each of the four memory controller ports can be coupled to a single memory device.

Figure 1B:
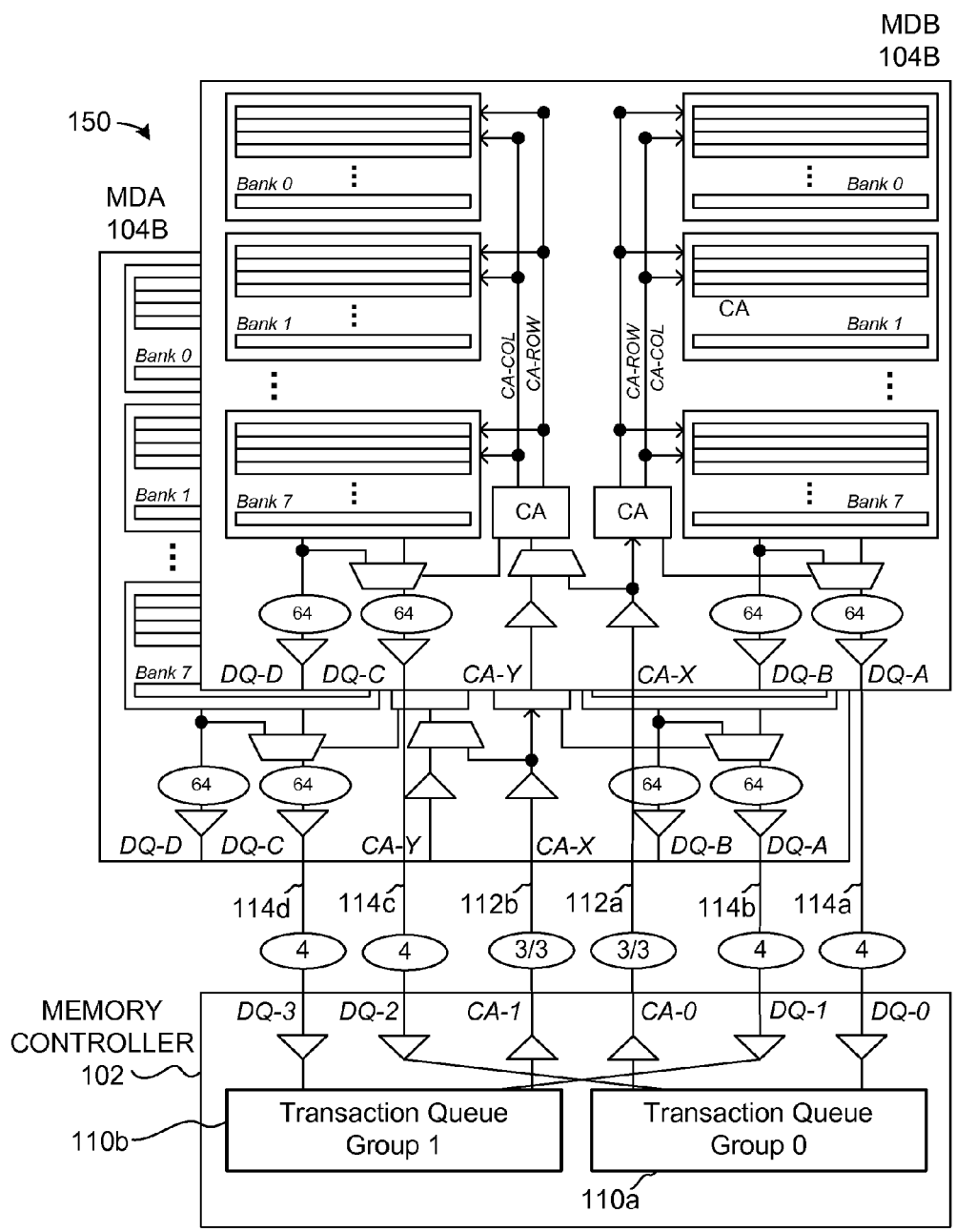
FIG. 1B shows a layout of a memory system rooted in two, half-width memory components.

FIG. 1B illustrates an expanded configuration, where a memory system 150 using the same memory controller 102 from FIG. 1A now supports two memory devices 104a and 104b. Note that many of the reference numerals from FIG. 1A have been omitted from FIG. 1B (such as numbering for banks and bank groups), but it should be assumed that the design of each memory device 104a/104b in FIG. 1B is identical to memory device 104 from FIG. 1A, with path routing configured slightly differently to enable the expanded configuration.

More specifically, each memory device has two of its four DQ ports left unconnected (i.e., ports DQ-B and DQ-D), while the remaining two ports (DQ-A and DQ-C) respectively connect to DQ ports (DQ-0, DQ-1, DQ-2 and DQ-3) of the memory controller 102. Similarly, one CA port (CA-Y) of each memory device 104a/104b is left unconnected, while the remaining ports (CA-X) respectively connect to ports CA-0 and CA-1 of the memory controller. Thus, each transaction queue 110a/110b drives an individual memory device 104a/104b, with transactions now threaded (i.e., sharing the same command path) between left and right bank sets in each memory device. Alternatively, the left and right sets can be run in lock-step, as providing respective slices or subranks of a larger memory word. Note that, in these embodiments, each CA path is point-to-point (PtP) and connects the memory controller with only a single destination; thus, there are no inter-rank time domain switching requirements for the CA paths, i.e., the controller can periodically update phase codes used to mitigate inter-link skew in each CA path, but does not need to change those codes when there is fine-interleaving of commands between the left and right bank sets.

Returning briefly to FIG. 1A, this arrangement is enabled by configuring the memory device 104, and more specifically CA multiplexer 118 and DQ multiplexers 120, to selectively route commands from port CA-X onto either of two internal bank group busses (CA-row and CA-column) and between the banks in each set and either port DQ-A/DQ-C or DQ-B/DQ-D, to support the desired mode; for the configuration of FIG. 1A, these multiplexers are to command a respective first selection, and for the configuration of FIG. 1B, these multiplexers are to command a respective second selection. Similarly, the routing within the memory controller 102 can be programmatically defined to route data corresponding to either transaction queue 0 commands or transaction queue 1 commands with ports DQ-1 or DQ-2 to conform to the desired mode (that is, the one or two memory device configuration).

The configurations seen in FIG. 1A and FIG. 1B each support concurrent processing of multiple memory transaction threads. In the configuration of FIG. 1A, there is no conflict between these threads, i.e., each CA path 112a/112b is serviced by a unique bank set 108a/108b, with data being exchanged using two affiliated sets of DQ links 114a/114b and 114c/114d, as appropriate. To the extent there is inter-link skew (e.g., skew between CA links or DQ links routed to the same destination), the controller can use phase codes (i.e., values applied to control clock phase) that are determined once during calibration and then set until the next calibration, with these codes enabling data and commands to be transmitted (and received in the case of data) by the memory controller in a manner that allows internal transmit and receive clocks within an attached rank of memory components to drift freely with respect to timing signals within the controller and/or other attached ranks of memory components. With the embodiment of FIG. 1B, while two of the 4-link DQ paths are coupled to each of two dedicated memory devices, once again, because data exchanged on these paths correspond with different CA paths, skew-related timing issues can be addressed using different DQ phase codes for the respective DQ path 114a/114b/114c/114d. Note that for the embodiment of FIG. 1B, each transaction queue can provide fine-interleaving of commands to bank resources that share a common CA path (i.e., to left and right bank sets for the corresponding memory device. With the increased capacity (i.e., the addition of a memory device as presented by FIG. 1B), bank depth or number of columns or row depth is effectively doubled in each memory device because each bank is now operated at half-width. Note that the number of supportable concurrent threads remains constant irrespective of configuration (i.e., up to two independent concurrent threads in each of the configurations of FIGS. 1A and 1B). There also exist alternative configurations.

B. Issues in Increasing System Capacity

Recent trends have indicated a significant demand for systems to support increased memory capacity in a broad range of applications, particularly for portable games, notebook computers and other applications, which may or may not be limited by the same size constraints as, for example, the mobile phone market. Note also that many manufacturers have both mobile phone (e.g., smart phone) and other portable device applications, and so there is a desire for one memory architecture to support each of these platforms in a flexible manner, that is where a single memory device and memory controller design can support multiple configurations.

The design principles described above in FIGS. 1A and 1B are additionally extended through techniques that permit a single memory controller footprint and memory device footprint to support both PtP and Pt2P configurations in both CA path connections. A design challenge as alluded to earlier is presented in that, in situations where intra-rank clock drift can occur (such as in low power memory devices), performance of rank switching can conventionally entail a rather substantial performance loss. That is, without a PLL structure on each memory device to counteract drift, it conventionally becomes impractical to fine-interleave commands to different ranks over a shared (i.e., PtMP) CA path.

The designs presented herein provide several enhancement techniques to permit these systems to operate with additional memory devices and thus significantly enhanced capacity. That is, as alluded to earlier, techniques are used to both permit this clock drift to occur, yet cause CA sampling by each addressed rank in a manner that corrects for inter-rank clock skew. Three specific techniques for doing this will be explained in detail further below, and other techniques will be apparent from this discussion.

Note that many of the integrated circuits presented below are multimodal; that is, in furtherance of the trends mentioned above, the devices presented below are advantageously employed in the PtP CA configurations presented in FIGS. 1A and 1B, as well as in the additional (partially or fully) PtMP CA configurations presented in the other FIGs. Providing base designs that support legacy as well as next generation layouts promotes the adoption of memory devices that will survive design evolutions and facilitate cross-platform adoption (e.g., to smart phones, notebook computers, portable gaming devices and other systems). Below, FIGS. 2A-2E will be used to introduce this layout flexibility, followed by a detailed discussion of some exemplary mitigation techniques that facilitate multirank designs with fine transaction interleaving.

C. Layout Considerations

FIGS. 2A-2E show various stacked memory systems especially suitable to portable devices; they are provided as examples only, the illustrated principles can be applied to other memory systems, stacked or otherwise. Note that the configurations illustrated in FIGS. 2A-2E advantageously employ one design for a memory controller and one design for 1 to 8 memory devices, though this is not required for all implementations. Configuration for the chosen system design can be established by programmable configuration (e.g., connecting certain paths but not others, programmable mode register configuration, dynamic programing, setting a one-time fuse, mounting or packaging, or in any other desired manner, whether performed at time of manufacture, first use, boot up, mounting or packaging, or dynamically).

Figure 2A:
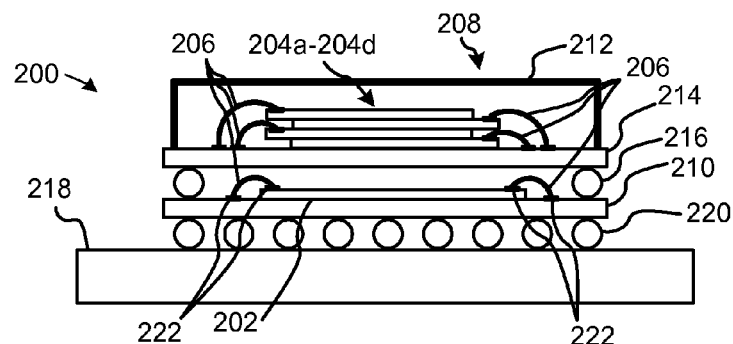
FIG. 2A shows a first configuration for a stacked memory system.

FIG. 2A shows a memory system layout 200 having a memory controller 202 and four DRAM memory devices 204a-d (e.g., dice), each electrically connected with the controller with a dedicated point-to-point (PtP) arrangement (such as by wire bond connections 206). Each memory device can be a discrete memory die, packaged or otherwise, and if desired, the devices can be stacked atop one another in a system-on-a-chip (SOC) or system-in-package (SIP) configurations, as denoted by numeral 208. For example, FIG. 2A shows the memory controller 202 stacked atop a first substrate 210 and four memory devices (i.e., dice) 204a-d mounted together as a single (encapsulated) stacked assembly 212, atop a second substrate 214. The second substrate 214 is directly mounted to the first substrate 210 using solder balls 216 or another structure providing both electrical interconnection and mechanical stability, e.g., by supporting the second substrate outside the periphery of the memory controller 202 as in this case. The entire stacked assembly can then be mounted to a printed circuit board (PCB) 218, again using solder ball interconnection 220 or other means of electrical and structural support. Note that in FIG. 2A, each PtP wire bond connection 206 couples the pertinent integrated circuits together via a pair of respective signaling pads 222 (such as is illustrated in the case of the controller only, for drawings-simplicity). The configuration seen in FIG. 2A can include a Mobile XDR memory controller and memory devices as introduced above and represent a first mode configuration in which the memory controller and memory devices are operated in a traditional, or low memory capacity manner, where only PtP CA connections are used. Note that four memory devices may be implemented for example by splitting the CA path, e.g., programmatically adjusting the depicted 3-link path to instead use increase serialization and use one link for each of two memory devices.

Figure 2B:
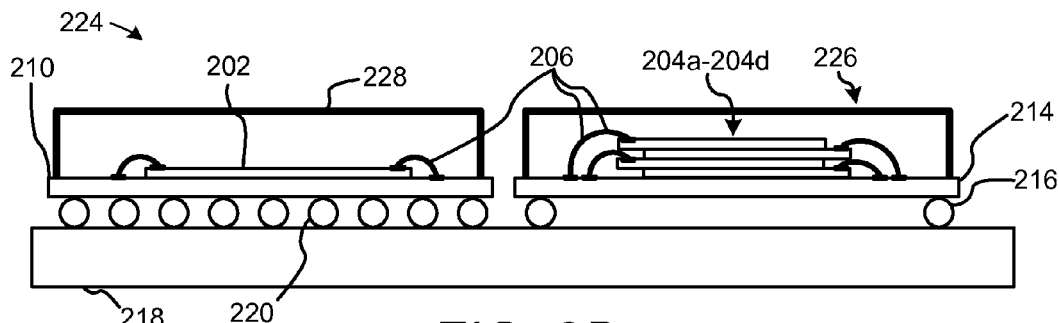
FIG. 2B shows a second configuration for a stacked memory system.

FIG. 2B shows a similar system 224, but with the memory controller 202 removed and laterally displaced from a stack 226 containing memory devices 204a-d. As before, the memory dice can be mounted atop a common substrate 214, which in turn is mounted to a PCB 218 by an appropriate electrical and mechanical mounting structure such as solder balls 220. As before, each of the memory controller 202 and memory devices 204a-d can be wire bonded or otherwise connected to their supporting substrates, per numeral 206. The configuration of FIG. 2B is, from a digital perspective, identical to the configuration of FIG. 2A, except that the layout is slimmer and signals between the memory controller 202 and memory devices 204a-d travel through circuit board traces (not shown in FIG. 2B); that is, FIG. 2A represents the same mode settings of the memory controller and memory devices. Once again, the depicted configuration is one configuration that is especially suitable for cell phones, particularly because of its slim design. Note that the memory controller is optionally encapsulated in this configuration, as indicated by reference numeral 228.

Figure 2C:
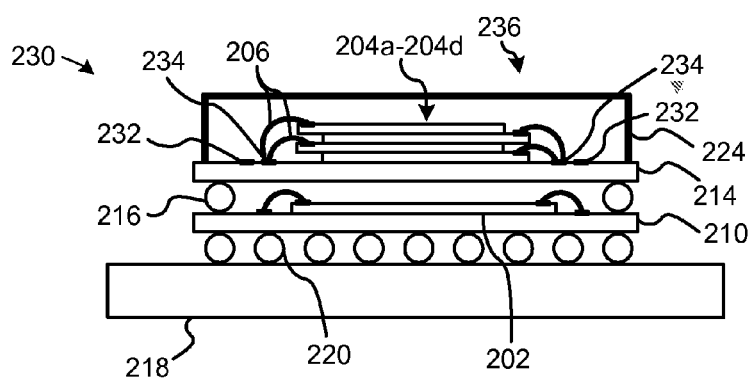
FIG. 2C shows a third configuration for a stacked memory system.
Figure 2D:
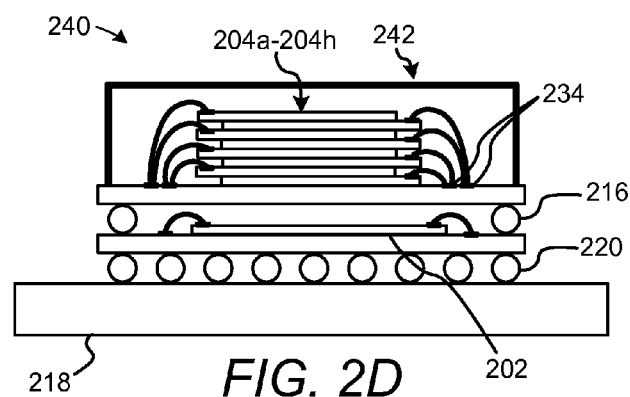
FIG. 2D shows a fourth configuration for a stacked memory system.
Figure 2E:
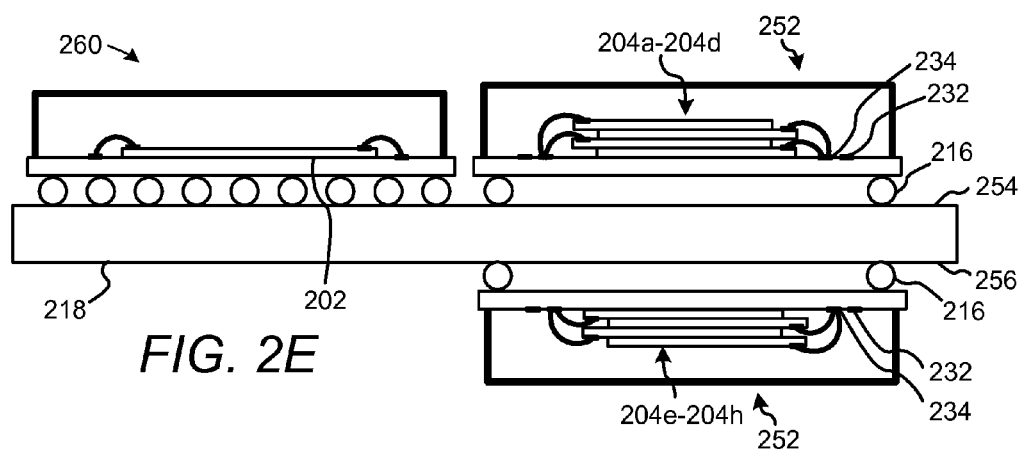
FIG. 2E shows a fifth configuration for a stacked memory system.

In accordance with the teachings of this disclosure, each of the memory controller 202 and the memory devices 204a-d seen in FIGS. 2A and 2B support enhanced capacity which is depicted in part by FIGS. 2C-2E. That is, the same memory controller and memory devices may be used in FIGS. 2C-2E except that the mode configuration of these devices and some of the external pathways and bonding that connect the integrated circuits are changed. These devices use Pt2P CA path connections and techniques for mitigating inter-rank skew. The capability of supporting both configurations (e.g., per FIGS. 2A-2B and FIGS. 2C-2E) is built into a single memory controller and/or memory device design, and is adapted by configuration at manufacture, power-up, or dynamically.

In particular, FIG. 2C shows a memory system 230 having a memory controller 202 and four memory devices or dice 204a-d, just as with FIG. 1A. These circuits can be wire bonded to supporting substrates (210 and 214, respectively) using wire bonding 206 or another suitable technique, with each of these substrates being stacked atop a PCB 218 using solder ball mounting or another suitable mounting technology (216/220, respectively). In the case of this embodiment, however, note that the wire bonding represents a Pt2P CA configuration and that some bonding pads 232 of each substrate are left open, that is, are not connected, while others 234 share couplings to two memory devices. For a memory controller that supports this configuration, the memory controller can be used with four memory devices 204a-d, or with any number of 2-8 or more memory devices, as with the exemplary eight memory device configuration illustrated in FIGS. 2D and 2E. In these respective systems 240/250, each memory device is respectively labeled 204a-h. That is, a given memory controller can be used either with a four-die stacked assembly 236 (FIG. 2C), with an eight-die stacked assembly 242 (FIG. 2D) or with two four-die stacked assemblies 252 (FIG. 2E), mounted to respective sides (254/256) of PCB 218. Clearly, other configurations are possible. As will be explained further below, this flexibility and the increased capacity can be provided without substantial performance impact using techniques that use per rank CA sampling instants (or command initiation) using phase-calibrated, rank specific signals so as to minimize rank-switch bubbles; that is, notwithstanding the Pt2P configurations seen in these latter figures and the increased capacity, threading and fine-interleaving can be performed with nearly the same efficiency as it can with the single rank PtP configurations. Note that the same components of FIGS. 1A, 1B and 2B permit system expansion in this manner, that is, supporting use of up to eight or more memory devices 204a-h, with these devices coupled with the controller in a Pt2P configuration. As mentioned, in one embodiment, a single, multimodal memory controller design and/or memory device design can support each of these designs, providing for support of legacy as well as future designs. Also, note that in the depicted designs, CA path routing is similar to or nearly identical for ranks sharing a CA, but differ in wire bonding (or other die mounting methodology). That is, in the implementation of FIG. 2C-2E, the CA routing difference between memory devices (or ranks) is minimal, and is primarily due to the difference in wire bond length and geometry for the two devices (as well as any differences in on-chip input capacitance); the difference is due to an extra length of wire bond to the second device which may only be approximately 1 mm long. Further, if the wire bond configuration does cause some effective delay between the devices or ranks sharing the same CA path, it is possible to design such that the delay variation is to some degree common on all links making up a CA particular path.

D. Use of a Per Rank, Phase-Calibrated Signal

Figure 3A:
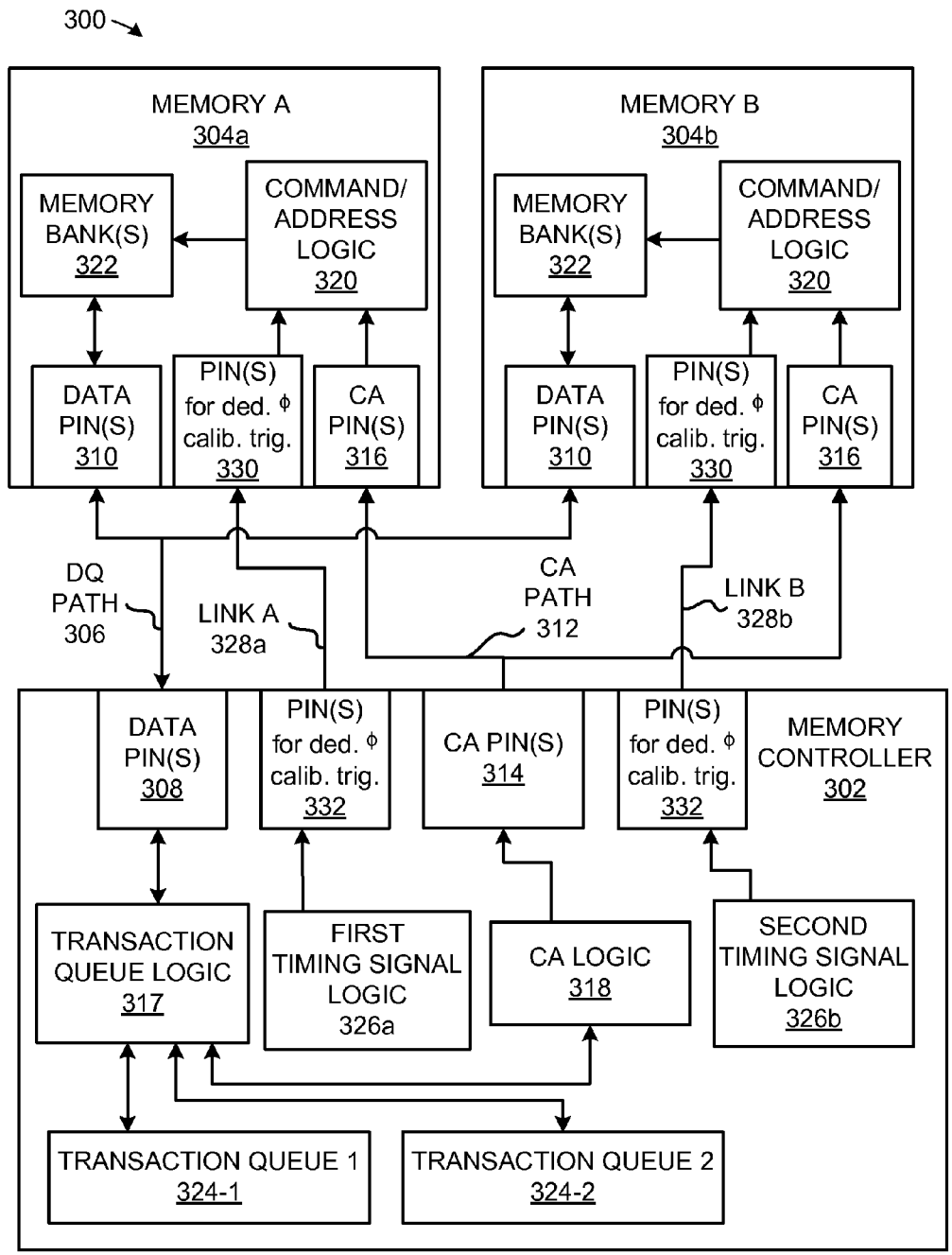
FIG. 3A shows a block diagram of an embodiment that uses phase-calibrated rank-specific timing signals.

FIG. 3A illustrates an embodiment of a system 300 that uses a timing signal dedicated to each memory rank (A or B) to mitigate inter-rank clock skew. In this embodiment, it should once again be assumed that each of memory rank A or B can be one or several DRAM integrated circuit(s) each having one or more respective banks of memory. A memory controller is designated 302 in this Figure, a first rank of memory is rank A (having at least one memory device 304a) and a second rank of memory is rank B (having at least one memory device 304b). It can also be assumed that each memory device 304a/b is a low power memory device, such that the clock distribution tree of each memory device experiences drift relative to a timing signal input that can approach, or even be greater than, a unit interval (UI, i.e., a time interval over which a data bit or multi-bit symbol is output from a transmission source, sometimes called a "bit time" or "symbol time"), all within normal operating parameters. That is to say, in a typical implementation, there is no PLL on board each memory device to mitigate clock drift, and with such drift, the sampling point of each rank (or individual memory device) of the respective, shared CA path also drifts. Note that the clock distribution tree is not separately depicted in FIG. 3A.

In this embodiment, the memory controller 302 communicates with the memory ranks A/B via a shared DQ path 306, notwithstanding this drift. That is, the memory controller sends write data from data pin(s) 308 to data pin(s) 310 corresponding to each addressed one of the memory ranks A/B, and receives read data back in the opposite direction responsive to memory read commands. Per-pin phase adjustment at the memory controller 302 is applied to compensate for inter-lane DQ signal skew (i.e., timing skew between signals transmitted by a memory component or rank of memory components on respective DQ links) and also to correct inter-rank DQ skew. For example, each data pin can have a dedicated transmit and/or sampling phase adjustment used to time write data transmission so as to arrive at all memory DQ inputs in a levelized manner (i.e., such that a single timing signal edge or phase-aligned set of timing signal edges may be applied to sample the write data at all DQ inputs), and to time read data sampling to occur at an optimal sampling instant (i.e., latching the conveyed read data at the temporal midpoint between data eye opening and closing, or at a time otherwise selected to maximize signaling margin), notwithstanding memory rank of origin. Depending on the rank that write data is to be transmitted to or read data is to be received from, the memory controller loads a previously calibrated phase value or gates a clock having a per-rank, per-pin phase in a manner that data will be transmitted or sampled at the appropriate time given the rank that is at issue. The memory controller also communicates commands to both memory ranks 304a/304b over a shared CA path 312. That is, commands originate from the memory controller via CA pins 314 and are received at constituent devices of an addressed memory rank via CA pins 316. However, neither rank can respond to commands intended for it unless it can properly sample and interpret such commands. Note that the CA path in this embodiment operates at DQ rates, i.e., at 3.2 Gps, and internal clock drift could potentially corrupt the sampling phase used for CA path sampling at any one of the memory devices (304a/304b). For example, if inter-rank clock drift (i.e., due to different internal delays in transmit or receive clock signals relative to arrival of a reference timing signal) is on the order of about ½ UI, it could render commands unintelligible by one or both ranks without some form of mitigation.

To ensure proper CA path sampling phase in this embodiment, each rank of memory receives a dedicated timing signal via a dedicated path (Link A/Link B), respectively labeled 328a and 328b in FIG. 3A. That is to say, the memory controller addresses inter-rank clock skew by calibrating a clock tree phase offset for one or both memory ranks, and by adjusting a per-rank timing signal unique to each rank as appropriate; in this manner, drift differences between ranks can be normalized such that each rank can sample the CA path 312 at exactly the appropriate time (e.g., in the center of a "data eye" associated with bits which make up transmitted commands). Note that inter-lane CA skew common to the multiple ranks can be addressed by per-pin CA transmit phase adjustment (i.e., using a memory-controller-side phase mixer for each CA pin), and that inter-rank DQ skew can be addressed by per-pin, per-rank DQ phase adjustment in each of transmit and receive directions.

Because each memory rank can be guaranteed proper reception of commands, it becomes possible to reduce the size of a timing bubble that might otherwise be needed in the event of a rank switch. That is, by addressing the inter-rank skew issue in a low power device, a fine-interleaved command can much more easily be directed to, and reliably received by, a new memory rank in the event of a rank switch. For example, as introduced earlier, if rank A is in the process of responding to a data read, a precharge, activation or similar command (or even a row activation command) can be transmitted to rank B and be immediately processed notwithstanding any timing drift between ranks.

Note that the signal Link A/Link B dedicated to each rank A/B, respectively, can be any type of phase-calibrated signal 328a/b that triggers sampling at an addressed rank or otherwise initiates processing; it can, for example, be a phase-calibrated strobe signal or another signal or mechanism for informing an addressed memory rank that it is currently or imminently being transmitted a command.

When a command is to be transmitted by the memory controller to an addressed one of the memory ranks A/B, i.e., from transaction queue logic 317, the pertinent command is generated by CA logic 318 and transmitted via one or more CA pins 314 to both rank A and rank B in a Pt2P manner. The CA logic formats command packets for transmission over the various CA links, stores calibrated phase values for each link in a register to correct intra-link skew correlated between the ranks, and applies these values to a per-link phase interpolator to generate pertinent transmit timing for the associated link; the transmit timing coupled with per-rank clocks, offset to counteract skew, ideally results in simultaneous arrival and sampling of all three CA links at the addressed memory rank. First and second timing signal logic 326a/326b operates in the background in this embodiment to ensure that each rank is always getting the pertinent clock information via per-rank pins 332; as mentioned earlier, other variants also exist, e.g., this per-rank signal could be configured as a phase-calibrated strobe, or other signal to ensure proper CA reception by an addressed rank. The use of a generally-running clock signal works well for this purpose, since little additional CA adjustment circuitry is needed to ensure each rank (A/B) properly receives commands. Note that in addition to the dedicated per-rank signal (Link A/Link B, also labeled 328a/b, respectively), this signal may be accompanied by other links, such as a clock enable signal, power mode signal or other information specific to the particular embodiment. However received, the per-rank trigger is received at the one or more respective memory devices at a respective pin 330, and used to ensure a dedicated timing or sampling phase at the associated rank of memory; received commands are thus processed by command and address logic, fed to memory bank(s) 322, and used to receive data from or transmit data to the external DQ path 306.

The CA path 312 in the illustrated embodiment does not adjust CA transmit phase in dependence upon the addressed rank; that is, in the illustrated embodiment, a tradeoff is made to use a single phase interpolator to transmit CA signals using a CA phase common to both ranks, to avoid bubbles that might otherwise be needed if per-rank phase values were used (i.e., as phase changes would be needed at each change in destination rank).

Note that, as indicated earlier, each rank A/B in this embodiment can be managed to process respective threads of memory transactions—in this regard, a first transaction queue 324-1 can be used to generate fine-interleaved commands for a first set of commands, for interleaving in transaction queue logic 317 with a second set of fine-interleaved commands from a second transaction queue 324-2. In embodiments where each memory device 304a/304b includes multiple banks of memory, it is also possible to define bank groups within each rank or memory device (and to still support fine-interleaving of commands on this basis as well). This will be further elaborated upon below.

To provide an example of fine-interleaving of commands for the embodiment of FIG. 3A, a set of fine commands corresponding to a read request (e.g., activate, column select, precharge commands) can be directed to the first rank of memory ("memory A"). In between any of these commands, an activate, column-select or precharge command can be directed to the second rank of memory ("memory B"). Because these commands are reliably received, they can be used to trigger immediate reaction in the addressed memory rank without substantial processing needed to perform a rank switch. If the fine-interleaved command calls for an effective switch in the DQ path (e.g., the command is a column access command directed to a new rank which will have the effect of driving data out onto the shared DQ path), a short timing bubble (consisting of at most a few, e.g., 2-3 clock processor clock cycles) is allowed for termination switch and driver configuration. Subject to this brief interruption, the shared DQ path 306 can be kept nearly completely busy, i.e., near full bus utilization can be achieved while permitting fine-interleaving.

Figure 3B:
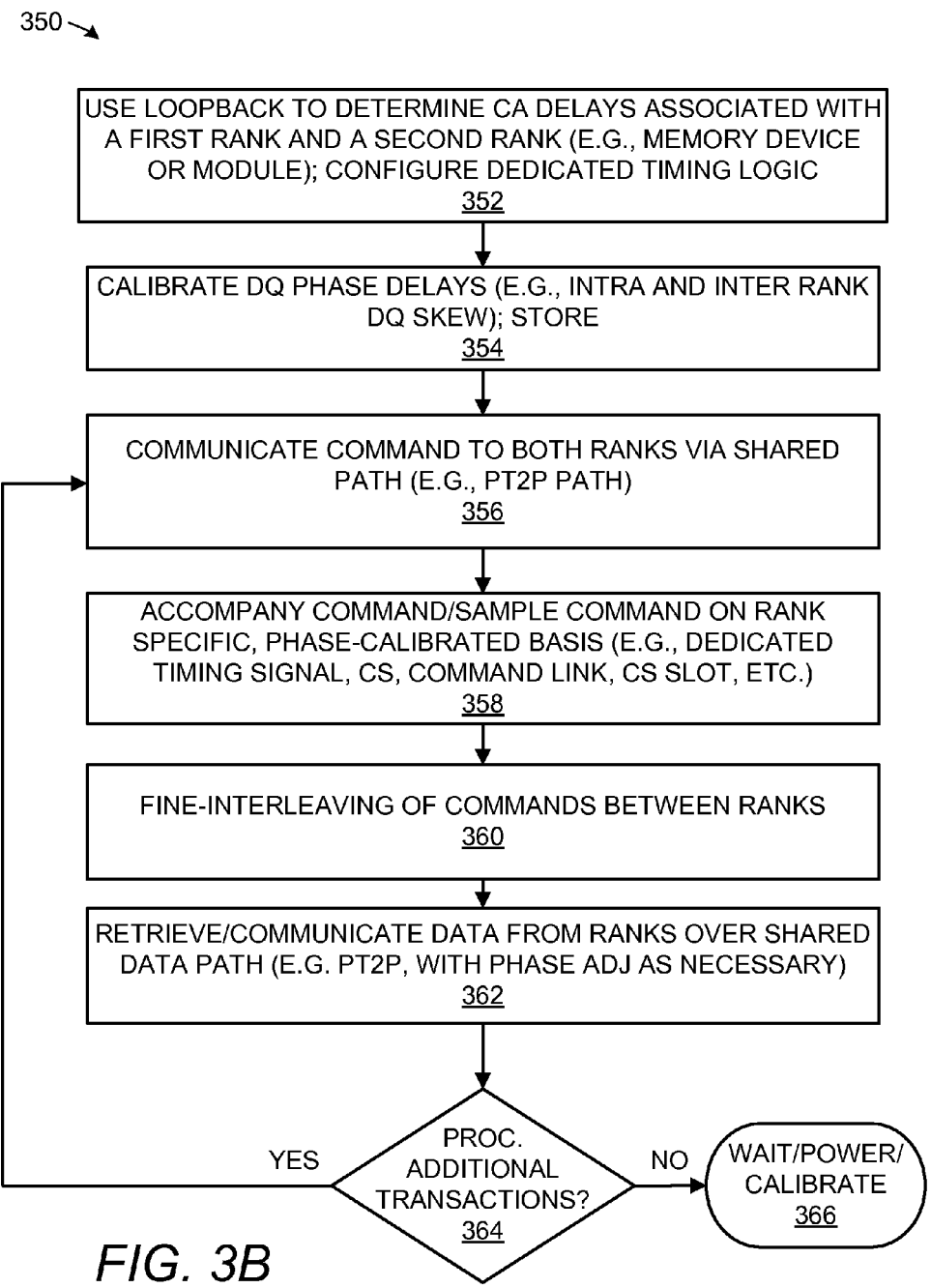
FIG. 3B is a method diagram relating to the use of phase-calibrated rank-specific timing signals.

FIG. 3B further elaborates on these principles, and introduces a general method 350 for performing fine-interleaving in a multiple-rank memory system. First, inter-rank skew as represented by rank-specific CA link sampling times is calculated at step 352. As alluded to by FIG. 3B, associated calibration can be performed using a loopback method where commands send over the shared CA path are looped back by an addressed memory device over the same shared CA path, or over another previously calibrated link, thereby enabling the memory controller to determine a relative offset between the phase of a CA receive clock within the memory device under calibration and an internal memory controller clock, and, by extension, between the phases of CA receive clocks within memory devices of different ranks. Note again that in one embodiment, the CA path is run at the same data rate as the DQ path, though this is not required for all embodiments. Also, note that while several specific loopback calibration techniques will be discussed below, additional detail relating to CA timing calibration techniques can be obtained from US Patent Publication No. 20110238870, application Ser. No. 13/131,557, with an international filing date of Nov. 17, 2009, filed on behalf of inventors Frederick A. Ware, Wayne Richardson and Kishore Kasamsetty; this publication and associated application are hereby incorporated by reference. Once inter-rank timing differences are determined, dedicated memory-controller-resident timing logic is configured so as to enable the memory controller to generate each memory-specific timing signal.

With the inter-rank skew calibrated, the per-link transmit and receive DQ path delays can be calibrated on a per-rank, per-pin basis, as indicated by step 354. Equivalently, these phase values can also be determined dependent on DQ skew between ranks and intra-lane DQ skew for each single rank. These results are stored by the memory controller and loaded into a memory controller register on a per-addressed-rank basis in order to properly time write data transmissions and read data reception.

With calibration completed, the memory controller then communicates with each rank in a normal mode of operation as appropriate via a shared Pt2P CA path, as indicated by step 356. As the depicted method can optionally be practiced as a method of operating a memory controller or optionally practiced as a method of operating a low power memory system, each memory device can be frozen or otherwise placed into one or more power conservation modes if supported by the particular implementation (this optional practice is not separately called out by FIG. 3B). When the memory device or rank being addressed is active (e.g., in an active power mode), the memory controller accompanies each command with a dedicated, phase-calibrated trigger directed to a specific rank of memory, per reference numeral 358. As alluded to previously, in one embodiment, this can be achieved using a dedicated timing signal for each rank, such as one that continuously operates as a clock signal during normal operation (i.e., normal data transmission or bus idle outside of a low power mode). These commands are advantageously sent using fine-interleaving of commands between ranks, per numeral 360. Data is exchanged in association with these commands, with per-lane DQ path phase adjustment as necessary, per block 362. Per decision box 364, the system continues to operate this way until there is either no need for additional transactions, or there is a system power event or a periodic calibration (box 366).

Figure 3C:
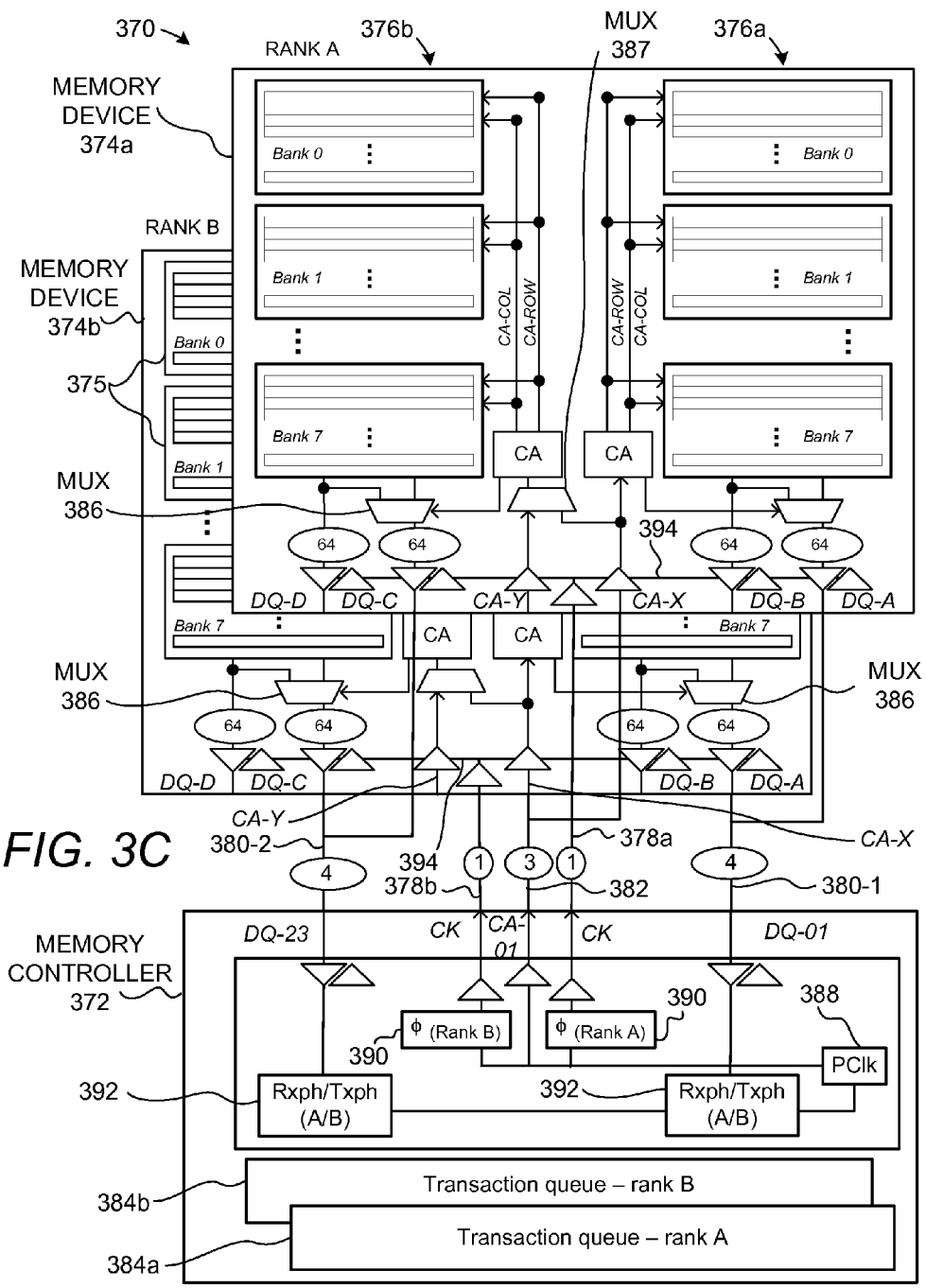
FIG. 3C shows a block diagram of an embodiment that uses a rank-specific timing signal.

FIG. 3C shows another embodiment 370, similar to the embodiment of FIG. 3A, but which organizes memory banks 375 into two bank groups or sets (left and right, 376a/376b) for each memory rank (A/B). It is noted that this embodiment uses memory devices in each rank having the same design as was introduced above in FIG. 1, each memory device 374a/374b with two CA ports (CA-X, CA-Y), four DQ ports (DQ-A, DQ-B, DQ-C and DQ-D), a clock pin (CK) to receive a rank specific clock (378a/378b), and sixteen internal memory banks 375 divided between bank groups 376a/376b. Note that each of two bank groups in each device encompasses eight memory banks. While the configuration uses memory devices having the same basic design as seen in FIG. 1A, the memory devices of FIG. 3C are now wired in a Pt2P configuration, that is, with each of two DQ paths 380-1/380-2 each dedicated to a respective bank group and each coupling both memory devices with the memory controller 372. Similarly, a shared CA path 382 (consisting of three links, as introduced above) couples the memory controller with both memory devices 374a/374b in a Pt2P configuration; as before, the CA path can optionally be run at DQ rates (e.g., 3.2 Gps or faster), and the rank specific clock is a phase-calibrated signal used to mitigate rank-to-rank skew by shifting the clock of one or both ranks in a manner where their respective clock trees (post distribution) are generally aligned. The DQ paths each consist in this embodiment of four conductive links, meaning that for every 24 bit CA packet that is transmitted (over the 3 CA links using DDR transmission), 64 bits are transmitted over each DQ set, with 16-to-1 serialization. It will be recalled in the previous "full-width" example (see FIG. 1B) that 128 bits were transmitted over two DQ paths responsive to each memory access; because 64 bits are transmitted in connection with each read or write access in this example, this mode of operation (not surprisingly) is referred to as "half-width" mode. As depicted in the Figure, each respective clock 378a/b is received by the respective rank, is buffered and otherwise distributed, and is then used to time data transmission and both command and data reception at transmitters and samplers, respectively, of each memory device. That is, as depicted by signal 394 in each memory device, the PVT (process/voltage/temperature) differences between devices still occurs, but is offset by the phase difference in signals 378a/378b, resulting in both memory ranks sampling and transmitting as appropriate at nearly the same time. Note that while DQ phase transmit and receive phase codes can still be used in this embodiment (i.e., a small number of clock cycles is still used for termination switch and driver activation and deactivation), the magnitude or range of these codes is greatly reduced by shifting the clocks of one or both memory devices. Otherwise stated, the memory controller deliberately skews the clocks in a manner that partially or entirely cancels out relative drift between ranks. For this reason, the clock signal at the point where it is used for sampling or data transmission in each memory device is depicted by the same numeral 394, to denote that because of these corrections, these clocks should be highly similar at the point they are used. In this embodiment, the memory controller 372 uses a transaction queue (384a/384b) for each rank to order commands for fine interleaving as has been described earlier, with fine-interleaving between bank sets 376a/376b for each device reflected by the ordering within these queues; alternatively, four queues can also be used. Commands from these queues are then further interleaved on a fine basis, such that the CA path 382 then carries fine-interleaved commands intended for all four bank sets 376a/376b amongst both memory ranks A/B. That is, this embodiment threads commands between ranks, such that fine commands for any memory transaction (e.g., write or read) can be directed to one rank while the other rank is still processing an ongoing transaction, and fine-interleaving to two groups can also be performed within each memory device. The controller addresses drift and otherwise generates clock and timing signals (to time memory-controller-side transmission and sampling and also for forwarding skewed clocks to the respective ranks) by using a processor clock (PCLK, 388); the skew values for per-rank clock forwarding are represented by respective phase interpolators 390 (these phase interpolators include registers for storing calibrated skew phase values). In addition, the memory controller includes per-link DQ phase codes (and associated registers) 392 to address inter-link per-rank, per-direction phase skew in the DQ path.

To illustrate an example operation, while memory rank A is completing a burst of read commands, but before the last data has been transmitted (and before a last precharge command has been sent to memory rank A), an activate command can be interleaved and sent to memory rank B to prepare that rank for an ensuing read, write or other transaction. Thus, a rank switch can be performed without a large bubble during which the DQ paths are left idle; that is, without the fine interleaving, the controller would conventionally (i) await burst completion, (ii) perform CA phase code switch, (iii) send a row activation to a new rank, and finally, following a row to column access delay ($t_{rcd}$) (iv) exchange data. With the deskew techniques mentioned above and with fine-interleaving, a row activation can be requested before the rank switch, with any row to column access delay ($t_{rcd}$) occurring in parallel with prior transactions, and data bus idle time shortened to a few clock cycles (i.e., for DQ phase code switch, driver enablement/disablement and termination adjustment, as appropriate). It thus becomes possible to add memory ranks (thus increasing memory capacity) without loss of performance otherwise incurred when threading transactions between ranks.

As mentioned earlier, the memory controller and memory devices can be multimodal. In this regard, multiplexers 386 for the DQ paths are configured during boot-up, dynamically or at board assembly, to support the desired configuration (as defined by a mode register), with the number of banks, row width and row depth being reconfigured to desired word size. For example, in a first mode in which all four DQ ports are used, a word size of 128 bits can be used as denoted by the number "64" at each memory device DQ port DQ-A, DQ-B, DQ-C AND DQ-D. In a second mode in which only ports DQ-A and DQ-C are active, and in which the multiplexers 386 route memory array data only to these DQ ports, a row size of 64 bits can be used with double the number of rows or banks. A CA multiplexer 387 is set depending on whether a single CA port (CA-X) is used to direct commands to both bank (left and right) groups in each memory device, or whether each bank group is assigned to respective CA ports (CA-X/CA-Y).

The system represented by FIG. 3C provides for a large number of different configuration options. For example, multiple memory devices can each be run as respective slices or "sub-ranks" of a single rank, with a dedicated DQ connection relative to other sub-ranks and with their respective CA in lockstep. Alternatively, the memory controller 372 can manage each CA port independently, resulting in two or more separately managed memory systems (e.g., the system of FIG. 3C can be expanded to four memory devices, including two devices in each of two different CA groups). As the memory controller includes four DQ ports, it further becomes possible to increase capacity to a system having eight memory devices, with four slices, each with two ranks of memory (two memory devices might then be operated as a single bank group, i.e., with threading between devices and ranks. Clearly, in other embodiments, more than two ranks can be used (with application of the principles discussed herein to levelize inter-rank skew), permitting further capacity increases.

The principles above permit fine-interleaving within reads, writes and other types of commands. For example, it is possible to perform a precharge or bank activation for a read command while a write operation has not yet been completed in the other rank, with fine-interleaving, or vice-versa. Similarly, in one embodiment, commands for refresh in one rank are fine interleaved with memory transactions (e.g., reads or writes) in another rank. The techniques provided herein for inter-rank skew correction permit this interleaving without need for an excessive rank switch bubble (which might as a practical matter, preclude the interleaving in the illustrated Pt2P implementation).

Figure 3D:
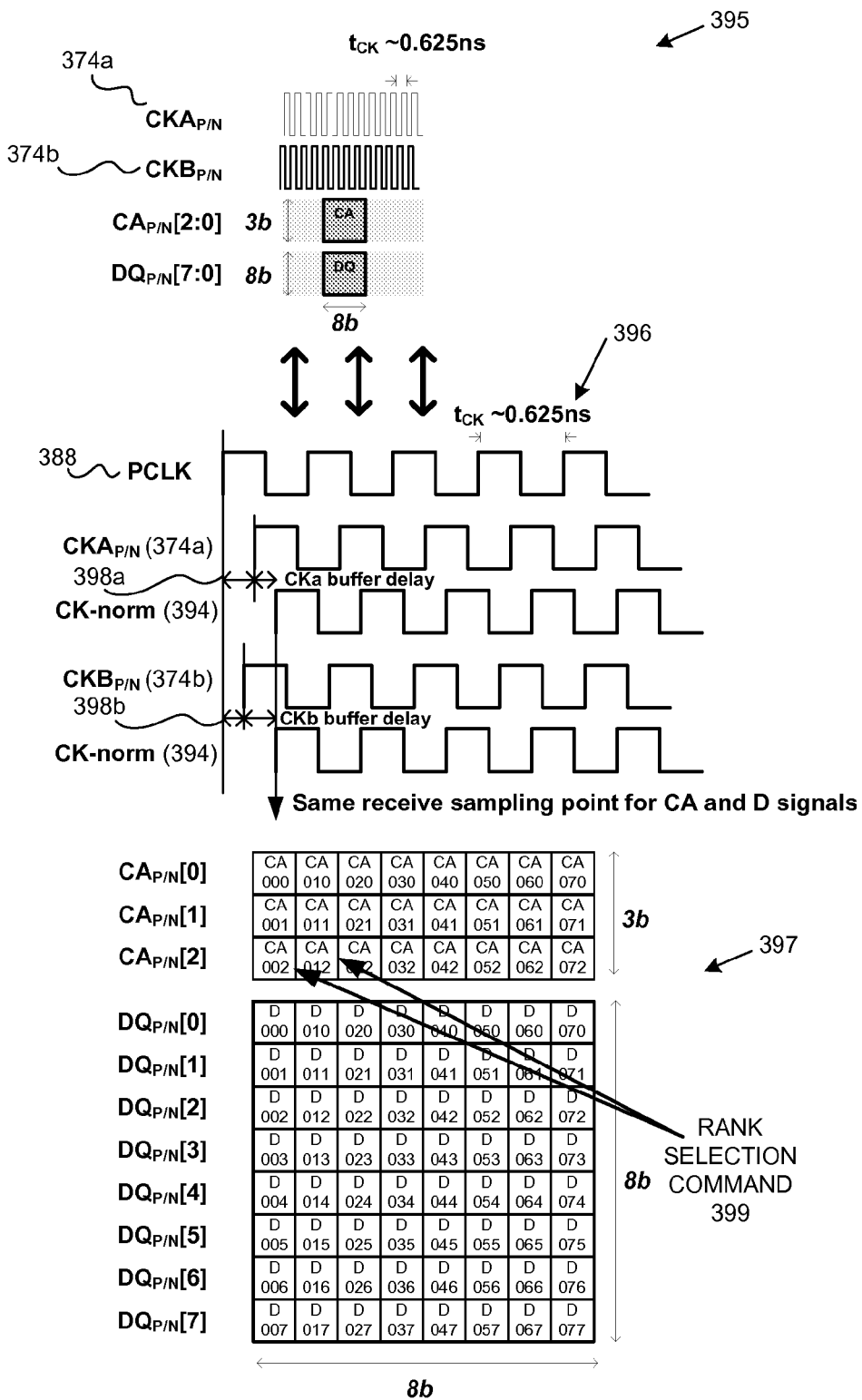
FIG. 3D provides a timing diagram used to explain principles associated with the embodiment of FIG. 3C.

FIG. 3D provides a timing diagram for the embodiment of FIG. 3C. The figure is roughly divided into three vertical parts, 395, 396 and 397, with the uppermost part illustrating the relationship between CA and DQ signaling and the per-rank timing signals (374a/374b), again, assuming a 3.2 Gps signaling rate and the use of DDR signaling. More specifically, each bit of information is transmitted and received on a CA or DQ path as appropriate on either a rising or falling edge of a transmit or receive clock signal, as opposed to SDR (single data rate) signaling in which one bit of information is transmitted/received per transmit/receive clock cycle. Note that in the case of memory controller transmissions, the actual transmit or receive phase will be adjusted on a per-link, per-rank basis to deskew transmissions as described above. The signaling rate corresponds to a clock signal that oscillates at 1.6 Ghz, thus yielding a unit interval (UI) of 0.3125 nanoseconds in a double-data-rate (DDR) signaling system (i.e., transmitting respective bits during high and low phases of the clock signal). The per-rank timing signals 374a and 374b are depicted in relative to each other and relative to the transmission of a CA or DQ packet; note that the timing signal for rank B (CKB, corresponding to signal 374b) is slightly advanced in phase relative to its counterpart 374a for rank A. In the middle section of FIG. 3D, these various timing signals 374a/b are shown in expanded detail, that is, so that a clock period appears magnified and is visually more discernible. Each of the per-rank timing signals 374a/374b is slightly shifted relative to the processor clock (PCLK, 388) to account for buffering delays (i.e., clock tree distribution delay) in each rank of memory (represented respectively as "cka buffer delay" and "ckb buffer delay in the figure); these relative delays vary with respect to process, voltage and temperature (PVT) and can render it difficult to correctly interpret CA signals transmitted at data rates (or at close to data rates). Note that as depicted in the figure, "ckb buffer delay" is somewhat greater than the "cka buffer delay." To mitigate this relative skew and align the clocks post distribution within each memory device, the second timing signal (374b) is transmitted slightly earlier than the timing signal for the other rank (374a), i.e., with offsets relative to the processor clock (PCLK 388) as indicated respectively by numerals 398a and 398b; as the clock trees then delay these signals, this delay combined with the deliberately-induced memory-controller-side skew brings the two timing signals into alignment as represented by the signal 394 labeled "ck-norm." That is, after buffering delays, these signals are ideally exactly aligned in phase with respect to a transmitted command or data value as depicted in the middle of FIG. 3D (e.g., phase offset only due to non-uniform controller-to-rank propagation delays for the different memory ranks).

The bottom portion of the figure 397 also expands on CA and DQ path transmissions for byte-wise serialization. As noted in the figure, the CA path is three bits wide (i.e., three links wide) while the DQ path in the configuration of FIG. 3C is eight bits wide; as mentioned, a sixteen-to-one serialization can be used (i.e., with only 8 bit periods shown, twenty-four CA bits and sixty-four DQ bits will be transmitted in the same period of time as seen in the figure, with the DQ transmit time effectively doubled to transmit 128 DQ bits. As depicted by numeral 399, a rank selection command (or "rank address" or "rank ID") is embedded as part of the command packet; thus, the command is transmitted to all ranks, with the per-rank timing signal used to deskew the ranks and permit correct CA sampling of this shared command packet. An addressed-one of the two ranks (i.e., memory rank corresponding to the embedded rank address) responds to the command, in association with the DQ data transmitted with the command. Thus, notwithstanding the use of a shared CA path (i.e., a Pt2P path in the case of the embodiment of FIG. 3C), and the use of memory device timing signals that can freely drift relative to the processor clock (PCLK), the command and the rank selection can be properly interpreted, permitting the fine-interleaving between ranks referred to above and effectively permitting multithreading in the low power, multi-rank context.

Figure 4A:
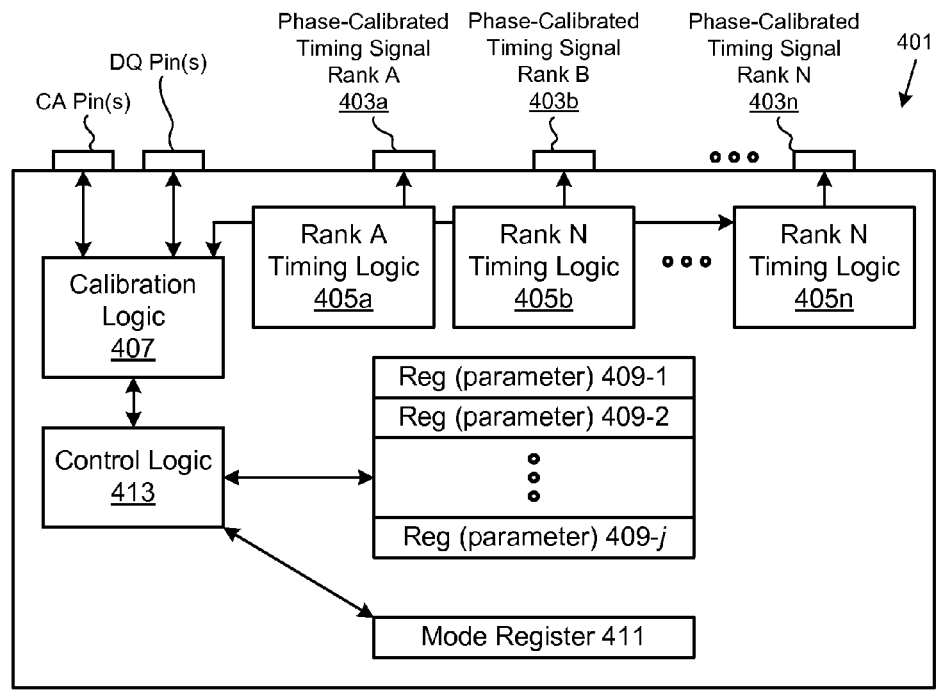
FIG. 4A shows a block diagram of a multi-modal memory controller, usable in either a PtP configuration with a single rank of memory or a PtMP configuration with multiple ranks of memory.

Note that this disclosure also provides a memory controller, memory device and related method suitable for use with the systems mentioned above. For example, a memory controller design that can be used for the memory controller 372 of FIG. 3C is depicted in FIG. 4A, generally identified by reference numeral 401. The memory controller includes an extra-pin 403-1, 403-2, . . . 403-n for each rank of memory to provide the indicated per-rank, phase calibrated timing signal, with at least two such pins being present; in addition, such a memory controller also includes timing logic 405a-n to generate each such signal and calibration logic 407 to calibrate the specific phase needed for each rank in order to levelize inter-rank clock skew. The timing logic can include per-rank phase mixers (e.g., a phase interpolator operating off of a quadrature signal related to PCLK), a multiplexer that selects one of several predetermined phases, a voltage controlled delay line, or other well-known timing phase adjustment circuitry. The calibration logic is typically invoked on a dynamic basis, e.g., every few microseconds, to dynamically determine phase offset for each rank as a response to dynamically varying PVT parameters affecting each rank. During a calibration routine, system operation can be briefly interrupted while the memory controller uses loopback testing (as previously mentioned) to assess phase delays for each rank. Note that there exist a myriad of suitable techniques for supporting such calibration. For example, during calibration, the memory device can be placed in a configuration where each link of a CA path is sampled while the controller transmits a predetermined pattern over such link(s) and varies the rank-specific timing signal at a relatively slow rate (i.e., so as to affect CA sampling instant); the memory device can compare the received bit pattern to a stored representation of the same pattern, and signal the controller (e.g., via relatively slow, side band link) in a manner to indicate the timing signal phase which produced the minimum bit error rate (BER). Many other techniques also exist, and the reader is again referred to US Patent Publication 20110235459, which contains information on various calibration techniques for low power memory devices which can be used to determine inter-rank timing offsets useful for the system of FIG. 3C. Note also that memory controller and memory device circuitry can also be employed to track clock drift comprising integer clock cycles, i.e., the per-rank phase-calibrated timing signal of FIG. 3C can be used to correct inter-rank phase skew, while for drift that exceeds a unit interval, memory controller and memory device circuits can be used as needed to handle framing, command timing and other related issues. Such circuitry is generally identified by the aforementioned US Patent Publication and is omitted from this disclosure for purposes of brevity. In some embodiments, the tracking of integer clock cycle drift disparity is unnecessary, as the memory controller transaction logic and associated queues can account for integer clock cycle skew in connection with transaction ordering, and potentially a slight rank switch bubble increase. As indicated by reference numeral 409-1-*j*, these parameters can be stored in memory controller-accessible registers and used as needed in normal data and command/address signaling operations. Note also that the memory controller 401 optionally includes a mode register 411; that is, as previously mentioned, a single memory controller design can support many different design configurations and footprints, and be applied in either of a PtP configuration (see FIGS. 1A-2E) or PtMP configurations. The mode register can be set or programmed to establish a desired configuration at time of system manufacture or assembly, at boot up, dynamically, or on another basis. For example, if a given memory controller design is to support only a single rank configuration (or otherwise such that a per-rank timing signal is unnecessary), mode register 411 is set to a first value, such that the controller does not generate phase-calibrated per-rank timing (e.g., all timing pins other than one can be set to idle, or all pins can be made to transmit a common timing signal, depending on implementation), and it does not perform per-rank timing calibration. If a second value is set in the register, the memory controller can presume that per-rank timing is to be applied, and it therefore generates the phase-calibrated per-rank timing signals and performs associated timing calibration, as has been described. Note that other mode indicators can be used (e.g., identifying whether individual DQ or CA ports of the controller are to be used, DQ width, threading capabilities provided by the system, and an identification of the values to be used for many other parameters). Together with the various signaling parameters from register set 409-1-*j*, the identified mode is used by control logic 413 to operate the memory controller 401 during normal system operation, to initiate power savings modes (e.g., memory clock stoppage modes as described in the aforementioned US Patent Publication), to perform the various calibrations needed for the system, and for other purposes as needed.

Figure 4B:
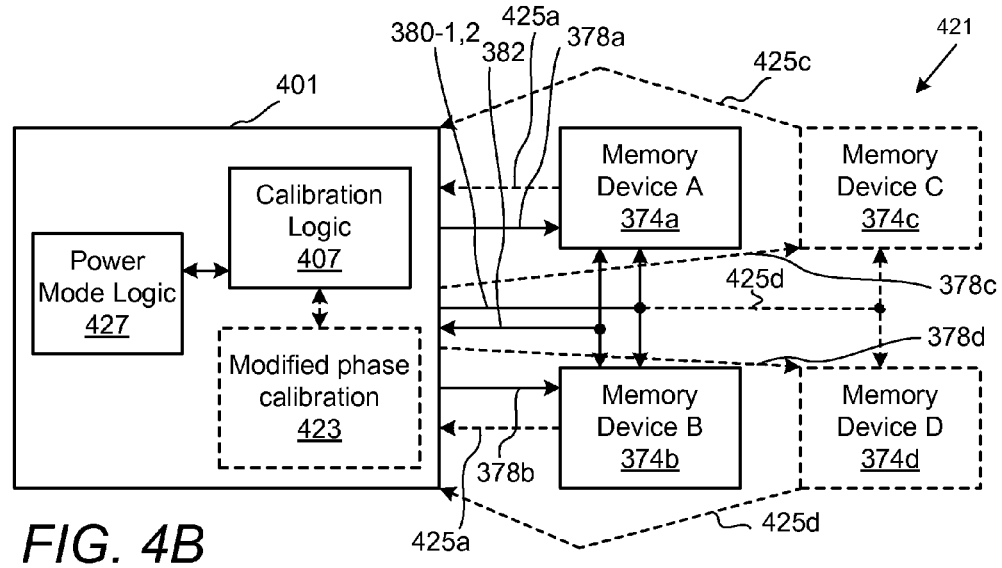
FIG. 4B shows a memory system that uses the multi-modal memory controller from FIG. 4A in a manner where capacity is expanded through increased through operating additional groups of memory, each with a respective DQ connection; these additional groups may be operated independently or as slices (or subranks) of a single memory word.

FIG. 4B uses dashed lines to represent several variations of the techniques described above. That is, solid lines in FIG. 4B represent the system just introduced, while dashed lines are relied upon to indicate some optional configurations. A system 421 includes the memory controller 401 from FIG. 4A and two memory devices 374*a* and 374*b* from FIG. 3C. Both memory devices 374*a*/374*b* share a Pt2P CA path 382 and a Pt2P DQ path 380-1/380-2, and each memory device receives a respective timing signal 378*a*/378*b*. As was the case for the multimodal memory controller 401 just discussed, calibration logic 407 can be used to determine and compensate for inter-rank skew. Capacity can be increased by adding two additional memory devices, 374*c* and 374*d*. These can be added as additional ranks, i.e., to implement a four rank system; alternatively, these additional two memory devices can be controlled via a separate CA path and themselves operated as an independent two rank memory system. In yet another configuration, these two new devices can be operated in lock-step with memory devices 374*a* and 374*b*, such that each memory device operates as a sub-rank of either one or two ranks. As yet another variant, instead of sharing a DQ path, each memory device 378*a*/378*b*/378*c*/378*d* can have a PtP coupling 425*a*/425*b*/425*c* or 425*d* to the memory controller 401 and be operated in quarter-width mode. Note that it is possible to use a combination of these techniques, that is, for example, it is possible to both operate two memory devices as Pt2P ranks and also operate two other memory devices as respective slices driven off of a common CA path. Each of these techniques may employ modified phase calibration logic 423 pertinent to whether PtP or PtMP links are being used. As designated by reference numeral 427, the memory controller also includes power mode circuitry or logic that manages different power modes, for example, by stopping clocks output to each memory device (i.e., pausing or otherwise suspending clock oscillation), issuing a command to implement clock stoppage in a specific memory, or in any other desired manner.

FIGS. 3A-4B have been used to describe a first set of techniques for addressing inter-rank skew. However, there are alternatives to the use of a per-rank timing signal. FIGS. 5A-7B will be used below to show several such alternatives.

E. Use of a Partially-Shared, Partially-Dedicated CA

Figure 5A:
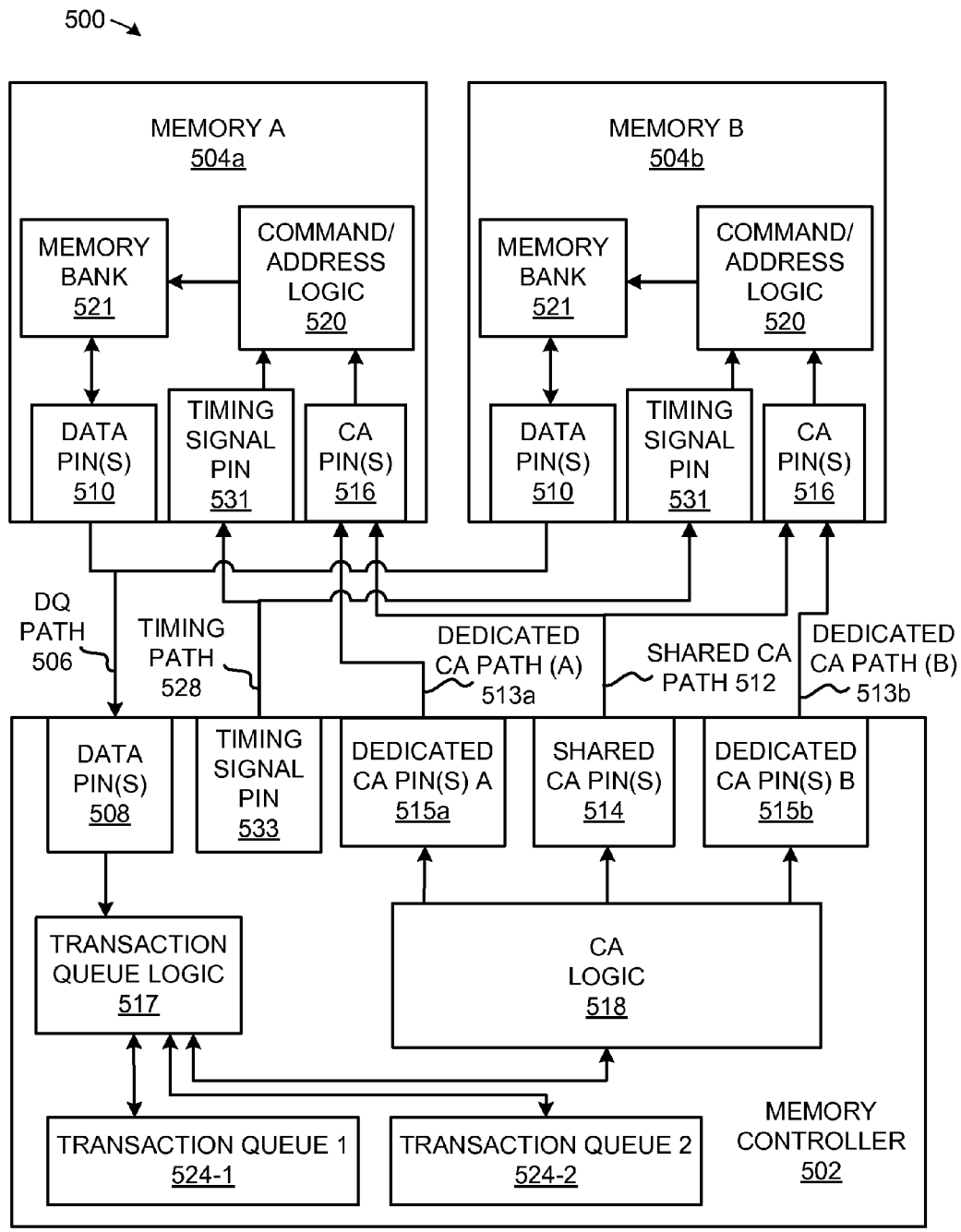
FIG. 5A shows an embodiment that uses both of a command path shared by multiple memory ranks, as well as a phase-calibrated command path dedicated to each memory rank.

FIG. 5A represents another approach to addressing inter-rank clock skew. The embodiment of FIG. 5A shows a system 500 having a memory controller 502 and two memories, 504*a* and 504*b*. As with the embodiments presented earlier, each memory can be a memory device or a memory module having multiple such devices (i.e., integrated circuits). For purposes of discussion, however, it should be assumed that each memory consists of a single memory device, mounted and configured if desired using one of the layout options presented in FIGS. 2A-2C, above.

A shared Pt2P DQ path 506 once again couples one or more DQ pins (508) of the memory controller with corresponding DQ pins (510) for both memories 504*a*/504*b*. Similarly, a shared Pt2P CA path 512 couples one or more shared CA pins 514 of the memory controller with corresponding pins of each memory device. Notwithstanding these similarities, there are two important signal routing differences; first, a clock signal 528 forwarded to a timing pin 531 of each memory device is now a Pt2P signal, meaning that, except for clock propagation time differences as clock signal 528 propagates from the controller to each of memory devices 504*a*/504*b*, each memory device 504*a*/504*b* receives exactly the same input clock phase and, second, the CA path is now split, such that in addition to receiving the shared CA path signal 512, each memory device now also receives a dedicated PtP CA signal 513*a*/513*b*. The rank-specific CA signals and the timing signal are output via memory controller pins 515*a*/515*b* and 533.

Reflecting on the principles discussed earlier, the provision of the Pt2P timing signal link with inter-rank clock tree skew implies that shared Pto2P DQ & CA paths would require a substantial time bubble for a rank switch, that is, for new phase code reloaded for every rank switch required to transmit the stream of commands issued by the memory controller. These time delays might render finely interleaved commands between ranks impractical. However, a solution is in this example provided by splitting the CA path into two components, one of which (512) is PtMP, the other of which (513a/513b) is specific to each rank and is specifically phase-calibrated for each rank; commands and command ordering are then structured in such a manner that fine-interleaving can still to a large extent be performed. To provide a specific introductory example of one way of doing this, certain command fields or commands can be transmitted on the rank-specific CA signal paths, while other command parameters can be transmitted over the shared CA path 512 with changes in transmit phase codes (and attendant delays)depending on addressed rank. The split between what is transmitted on the dedicated CA paths versus shared CA path can vary by embodiment. In one embodiment, address and a brief opcode is transmitted over the dedicated links, while other command parameters are transmitted over the shared path; to a certain extent, command fields transmitted over the dedicated links can be those the memories require first in order to initiate operations, with other fields (i.e., especially for commands with longer packet lengths) following the initial fields. Alternative, certain commands can be transmitted, depending on command type, on the dedicated versus shared links, or vice-versa. While nearly any division between different command types can be used, note that one implementation sends commands not themselves triggering or representing data transfer over the dedicated rank; thus, for example a precharge, refresh, activate, or similar command can be "fine-interleaved" over the dedicated link. Because these commands do not involve data transfer, but do shorten delays that might otherwise be present at a rank switch, this can substantially shorted rank switching delays. Note that a memory device can also use these commands as indicators of an imminent rank switch. While a previous command is completing, memory devices 504a/504b switch their terminations, and the memory controller changes phase codes to change transmit timing over the shared CA path in a manner specific to the addressed rank of memory. A CA path timing bubble still occurs in this example, owing to this switch, but the CA path timing bubble is partially overlapped against transactions still completing and a similar phase code switch occurring for the DQ path. Note that, as will be discussed further below, the memory controller 502 in this example can be modified to add extra per-shared pin CA phase interpolators for each rank of memory (to enable inter-rank time domain switching), as well as logic to parse command packets in a manner suitable to this form of CA latency masking. These functions are contemplated as part of the illustrated CA logic 518 of the memory controller, which distributes shared and rank-dedicated CA signals to controller pins 514, 515a and 515b, as appropriate. Each memory device 504a/504b receives commands and is configured by hardware design (or by dynamic or other configuration) to interpret the command protocol used to break up the CA bits or commands in the manner just described. Thus, one application of the teachings of this disclosure is to provide a system, a memory controller and a memory device design amenable to a split-CA protocol, as just introduced. More details on methods for parsing command packets and performing phase calibration for the rank-specific links will be provided further below. Note that, the memory controller is further depicted as supporting multiple transaction queues (transaction queue 1, 524-1, and transaction queue 2, 524-2) for rank threading as desired. Transaction queue logic 517 orders commands (including fine-interleaved commands) for final transmission to memory via the CA logic 518. Also, as was the case earlier, each memory device 504a/504b receives the commands via CA pins 516, and directs these commands to command/address logic 528 for servicing amongst one or more banks of memory 521 as appropriate.

Figure 5B:
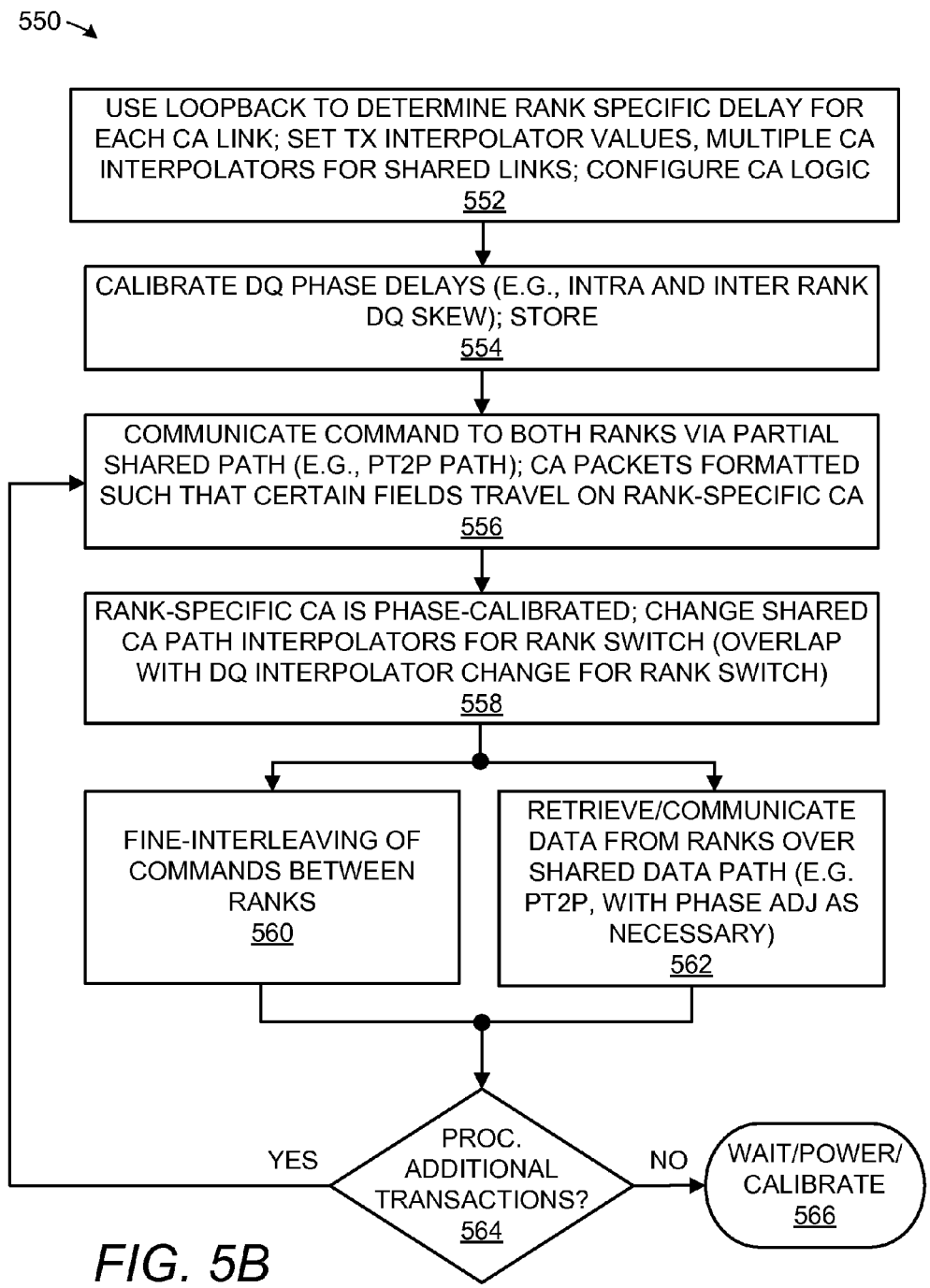
FIG. 5B shows a block diagram of a method used by the embodiment of FIG. 5A.

FIG. 5b illustrates an exemplary method 550 relating to the techniques just introduced. Specifically, a calibration process (such as a CA link loopback process) is performed for each CA link (both dedicated and rank specific) to determine rank specific delays, as indicated by numeral 552. This is to say, in contradistinction to the embodiment where a rank specific timing signal is used, here, each CA link is calibrated for appropriate transmit phase (i.e., to accommodate the timing domain of the destination memory device) on a rank-specific basis. The CA link dedicated to a specific rank will have a single phase interpolator which will be always loaded with the appropriate phase value for the corresponding rank (as updated from time-to-time), and the CA links that make up the shared CA path will have multiple phase interpolators, one for each rank, with the corresponding link-specific phase preloaded (again, as updated from time-to-time). Note therefore that one advantage of this embodiment is its tolerance to rank specific intra-CA link timing skew, for example, due to path length differences. As was the case previously, DQ link calibration is then also performed on a rank specific basis for both transmit and receive directions, per numeral 554 (see again, US Publication No. 20110238870, for a discussion of calibration techniques for CA and DQ links in general). These first two calibration steps can be performed at power-up and preferably are performed dynamically using interrogation of each memory device by the memory controller, and a specifically entered calibration mode, to compensate for temperature and voltage fluctuations, e.g., every few milliseconds or more frequently during normal system operation; normal system operation is then represented with the ensuing steps in FIG. 5B, beginning with step 556. That is, the memory controller, upon receiving a fine-interleaved or other command from a transaction queue logic, formats that command such that specific fields and/or specific commands are organized according to link, with some commands (or fields) being transmitted over the phase-calibrated, rank-specific CA path, and remaining commands or fields being transmitted over the shared path, per numeral 556. For example, as introduced above and as will be elaborated upon below, rank selection can be communicated over the rank-dedicated CA link, which always has the appropriate phase values applied from its single phase interpolator, so there is no time-domain switching delay. As denoted by numeral 558, other commands to be transmitted over the shared path await as appropriate a CA transmit phase code switch, resulting in an associated CA timing bubble hidden (i.e., phase-calibrated or timed in a manner partially or completely redundant to) by ongoing commands and/or an associated DQ transmit or receive phase code realignment to a new rank. The CA packet formatting and timing of CA transmit phase adjustments for rank switches results in a substantial bubble reduction especially for the DQ path relative to what might otherwise be necessary if there were no techniques applied to mitigate inter-rank clock skew, (i.e., it facilitates fine-interleaving of commands as shown at 560), which can therefore be performed per step 562. If read data is to be obtained (or write data is to be transmitted) over the DQ path, this is handled as dictated by the transaction queue using the now-established DQ phases, per numeral 562. Note that operations 560 and 562 can be performed concurrently (at least partly overlapping in time) as indicated by their parallel disposition in FIG. 5B. Alternatively, the operations may be performed one after another. Finally, the system either processes ensuing commands, or enters a state where it performs calibration, idles while it awaits the arrival of additional commands, or performs a power mode adjustment, per numerals 564 and 566.

Figure 5C:
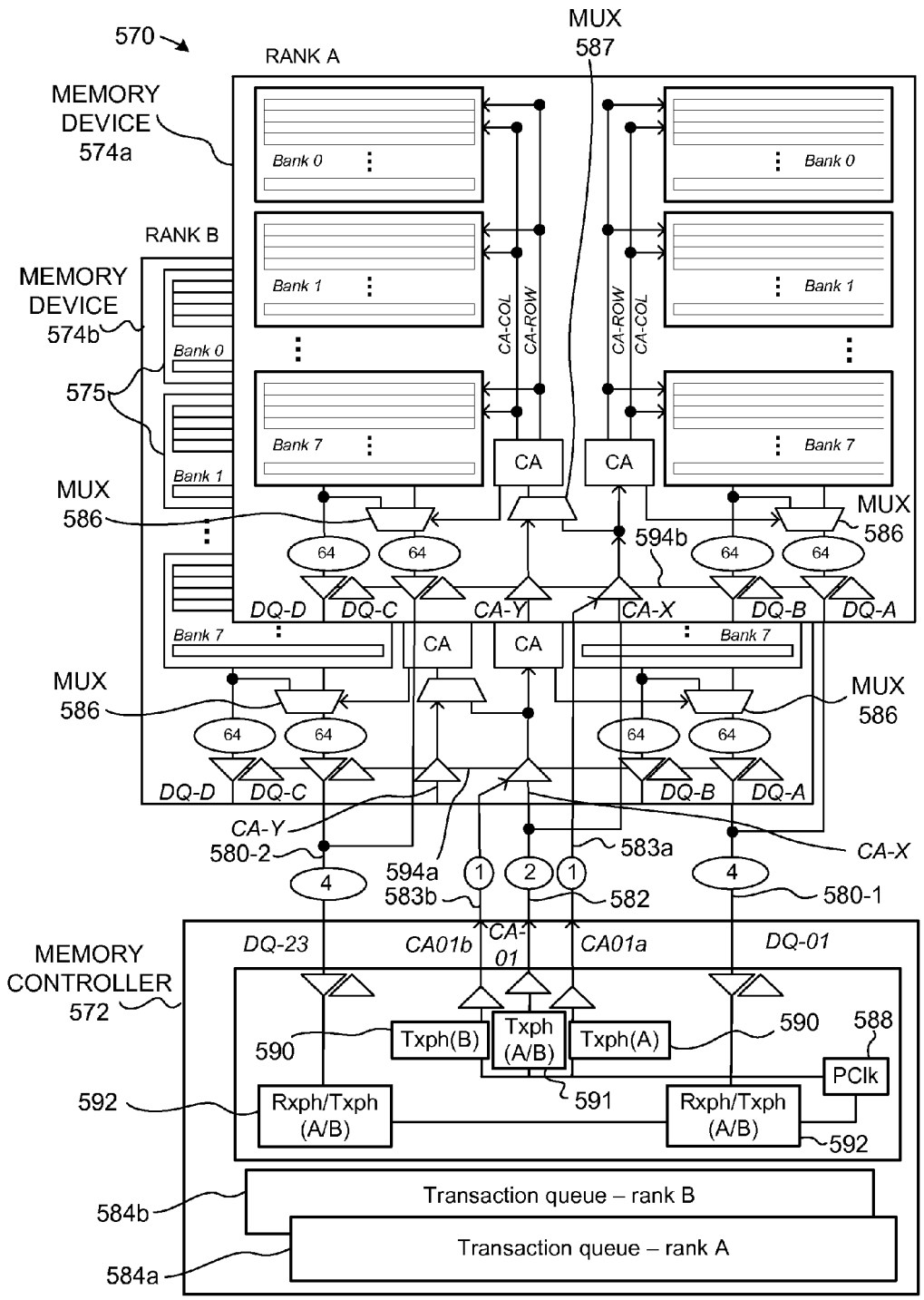
FIG. 5C shows another embodiment that uses both of a command path shared by multiple memory ranks, as well as a phase-calibrated command path dedicated to each memory rank.

FIG. 5C shows a more detailed view of a system 570, which is in many ways similar to the layout presented in FIG. 3C. A memory controller 502 couples to two memory devices 574*a*/574*b* arranged as different ranks (rank A/B). As before, memory modules could be used for each rank (i.e., each having multiple devices), but for purposes of discussion, it should be assumed that each memory is a device (i.e., an integrated circuit, as with the memory controller). Each memory device 574*a*/574*b* includes sixteen banks arranged as two internal groups having independent IO resources; other configurations are also possible. In the depicted arrangement, two DQ paths 580-1 and 580-2 couple the memory controller 502 with both memory devices in a Pt2P configuration, and one CA path 582 couples the memory controller with both memory devices, also in a Pt2P configuration. The CA path is in fact split, and includes a shared (Pt2P) component 582 and at least one rank-specific or rank-dedicated link (583*a*/583*b*) for each rank. As mentioned above, this dedicated link is used to carry specific command fields or specific commands to facilitate fine-interleaving between ranks, with CA phase codes changed for the shared (Pt2P) CA path component 582 at certain rank switches in the stream of command destinations carried by the shared CA component; the memory controller orders commands sent over the shared CA component in a manner where all or a portion of the idle time associated with this phase code change (for the shared CA path component 582) is camouflaged, or hidden by any DQ path rank switch that would need to occur for a rank switch in DQ path source or destination. Note that in the embodiment of FIG. 5C, there are two shared (Pt2P) CA links and one CA link dedicated for each rank, such that each rank gets three CA links as before, and receives 24 bits of command packets (assuming an 8-to-1 serialization) at the same time (i.e., after accounting for controller-to-rank propagation time differences) in which 64 bits of data would be transmitted or received on 8-DQ links (580-1/580-2). If desired, multiple links can also be used for each dedicated path, and this possibility is also represented by path designators 583*a*/583*b*. As was the case before, each memory device can be configured to operate as a single rank, with threading between ranks and fine-interleaving using the CA path (582/583*a*/583*b*) to exchange 64-bit data words with left-and-right bank groups for each memory device, with fine-interleaving of commands both between ranks and between bank groups (e.g., such that fine-interleaving is performed amongst four bank groups, two in each memory device/rank).

Once again, the memory controller 572 and memory devices 574*a*/574*b* support multiple design layouts, such as the layouts seen in FIGS. 2A-2E. That is, expounding on the labels indicated in FIG. 5C, the memory controller is of the same basic design as that shown in FIG. 1A and includes two CA ports (CA-0 and CA-1) and four DQ ports, labeled DQ-1, DQ-2, DQ-3 and DQ-4 (e.g., the labels DQ-01 and DQ-23 in FIG. 5C refer to the fact the each four-link DQ path can arbitrarily be connected to DQ ports DQ-0 or DQ-1, or DQ-2 or DQ-3, respectively). Thus, an extra group of memory devices can be added to the layout indicated in FIG. 5C, using the other (un-illustrated CA port, and using the two controller DQ ports which are left open in the illustrated configuration). The same components can also be operated in a single rank mode, with one half-width or two quarter-width memory devices side-by-side as appropriate. Note that the memory controller physical support for fine-interleaving of commands between ranks is provided by adding a pin for each rank for each CA path to carry a dedicated CA signal to the associated rank.

The upper half of FIG. 5C illustrates additional detail for the memory devices, i.e., each device is seen to use multiplexers 586 which permit the use of different modes (e.g., configuring all four memory-side DQ ports, DQ-A, DQ-B, DQ-C and DQ-D for output of data, or only two ports DQ-A and DQ-B or DQ-C and DQ-D, as illustrated in FIG. 5C). Similarly, a CA multiplexer 587 is configured in dependence on whether one CA port is used to route comments to both internal bank groups or both CA ports (CA-X/CA-Y) are used to address respective bank groups. Note that the labels "64" imply that 64-bit words are exchanged via each DQ port using 16-to-1 serialization (i.e., over four links associated with the DQ port). As discussed elsewhere herein, each memory can also be operated in quarter-width mode, i.e., with only two links used per memory device DQ port, with slicing over each controller DQ port to respective bank groups in each memory device. More detail on such a configuration will be further provided below; for present, it suffices to focus on the two illustrated memory devices to explain the PtMP (e.g., Pt2P) CA configuration of this embodiment.

Returning to the memory controller 572, it is seen that there are two transaction queues 584*a*/584*b*, one operated for each rank (again, four such queues can also be used), with commands subsequently mixed and ordered for fine-interleaved transmission. As indicated by numeral 588, a processor clock is provided as a timing reference to a phase interpolator for each per CA link; in the case of shared links 582, there is a phase interpolator (and associated phase code storage register) 590 for each rank, with enable signals or other means of invoking a phase code switch in connection with a rank switch in addressed commands. In the case of the dedicated links, there is only one phase interpolator 591 and no need to switch between phase codes as a function of addressed rank. For DQ links, note that there is a phase interpolator for each link, for each rank, and for each of transmit and receive directions (for a total of four phase interpolators and phase codes per link), as referenced by numeral 592.

Note that FIG. 5C does not show provision of a timing signal to the memory devices (574*a*/574*b*); in fact, one is provided (it is not illustrated to simplify the figure), and may be provided in the form of the processor clock (PClk) forwarded without modification. That is, the aforementioned interpolators 590/591/592 are used to compensate for clock drift within the memory devices. Note that the clock forwarded from the memory controller to both memory devices is not specifically illustrated in FIG. 5C (see numeral 528 of FIG. 5A), but the clock used for sampling and data transmission in each respective memory device is seen, depicted by different numerals 594*a*/594*b* owing to the PVT variations that cause skew.

Figure 5D:
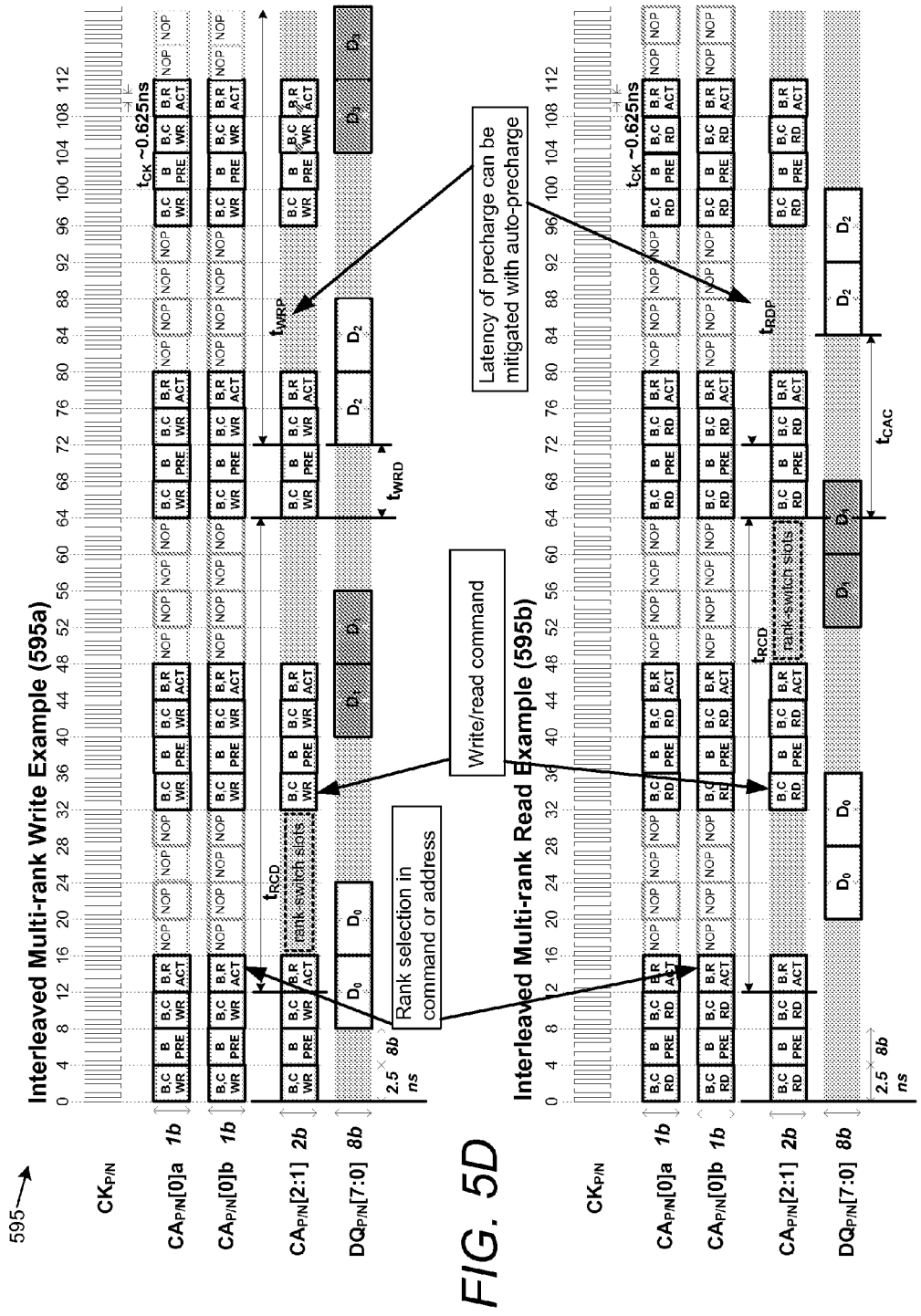
FIG. 5D is a timing diagram used to explain principles of operation of an embodiment that uses both of a command path shared by multiple memory ranks, as well as a phase-calibrated command path dedicated to each memory rank.
Figure 5E:
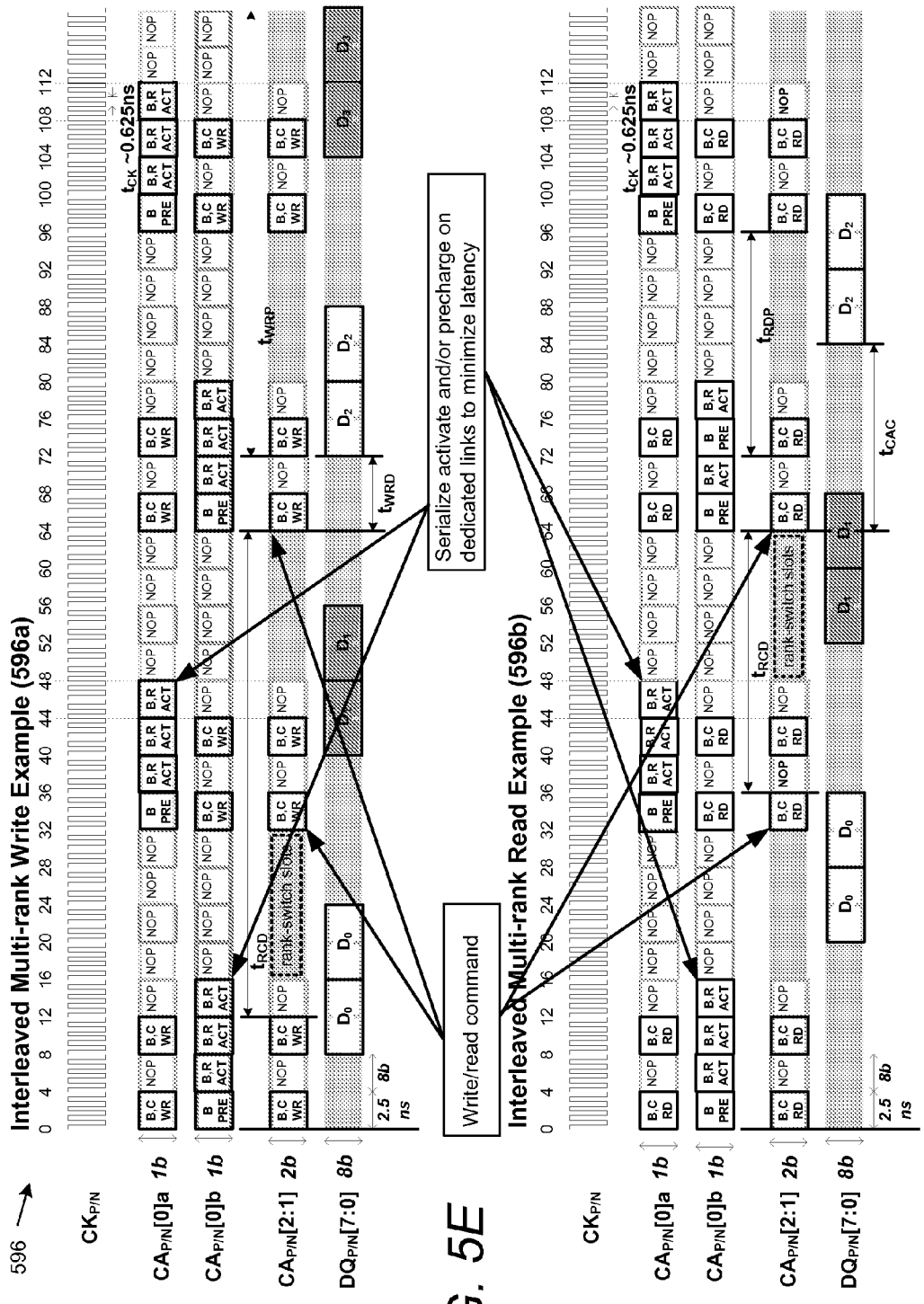
FIG. 5E is a timing diagram similar to the one seen in FIG. 5D.

FIGS. 5D and 5E are used to provide two different examples of command packet formatting that permit reduction of DQ path idle time during a rank switch for write and read data. Note that in these figures, "WR" stands for a write command, "PRE" stands for a precharge command, "ACT" stands for an activate command, "RD" stands for a read command, and "D" represents data transmission in one direction or another (depending on whether the transaction is a read or write transaction; furthermore, the letter "B" indicates that a command is directed to bank as a whole (e.g., to circuitry for the bank as a whole, such as a precharge or activate command), "B,R" indicates that the command is directed to a specific bank and row within that bank, and "B,C" indicates that the command is directed to a specific bank and column address within that bank. First, FIG. 5D provides a timing diagram 595 having an upper-half ("Interleaved Multi-rank Write Example," 595a) and a lower-half ("Interleaved Multi-rank Read Example," 595b). As mentioned earlier, one way to reduce the rank switch timing bubble is to have certain fields carried by a rank-specific CA link to an addressed rank (these links are represented by the acronyms "$CA_{P/N}[0]a$" and "$CA_{P/N}[0]b$"), while other fields are carried by the shared CA links ("$CA_{P/N}[2:1]$"). By appending to an earlier command an indication of an upcoming rank-switch in one or both of the dedicated links, for example, by indicating a successor rank row address for activation, it is possible to begin processing in the successor rank even though data is still being latched or transmitted for the previous rank. Note that the operations for read and write commands is similar—for the case where data "$D_1$" is to be written or read (as appropriate), rank selection and row activation begins as indicated by the arrows labeled "rank selection in command or address." Note that this command is transmitted as part of a request packet, i.e., a read or write command may be concurrently transmitted (and be in processing) for the previously accessed rank. An interval of time later, in an ensuing command packet and within the period labeled "rank switch slots," additional opcodes (e.g., the actual read or write instruction, for a specific column) can be transmitted for the new rank (as labeled for the arrows "read or write command"). Finally, data corresponding to the commands is output onto the DQ path as indicated by "$D_1$." Note that the scheme depicted in FIG. 5D is exemplary only, i.e., there are other ways of parsing command fields so as to fine-interleave commands where one link is phase-calibrated to each specific rank, and whether other command fields are sent out over a shared link.

FIG. 5E presents a second such example. FIG. 5E also provides a timing diagram having an upper-half ("Interleaved Multi-rank Write Example," 596a) and a lower-half ("Interleaved Multi-rank Read Example," 596b). In this example, however, instead of putting specific fields on the rank-specific, phase-calibrated links, certain commands are sent entirely on these links, while other commands are sent over the shared (Pt2P) links. While FIG. 5E indicates that commands over CA links are roughly aligned, this need not be the case, i.e., it is possible to use offset timing between the rank-dedicate (PtP) links and the shared (Pt2P) links. Note that in FIG. 5E, activate (B,C ACT) commands and precharge commands (B PRE) are sent only over the rank-specific, phase calibrated links ("$CA_{P/N}[0]$" for each respective rank), while read and write commands and associated column addresses are sent only over the shared CA links ("$CA_{P/N}[2:1]$"). Thus, as illustrated by the arrows labeled "Serialize activate and/or precharge on dedicated links to minimize latency," commands not involving use of the DQ path can be sent over the phase-calibrated links, completely independently of whether CA shared link phase codes are still linked to the predecessor rank, and completely independently of any driver or termination switch for the DQ path (or associated bubble). That is, this configuration substantially shortens the DQ bubble time that might otherwise be required, because an activate or precharge can be initiated for one rank in parallel with transactions directed to the other rank; then, during the period associated with row activation, phase code change for the shared DQ and CA paths (i.e., the Pt2P paths) can be aligned and performed along with driver and termination switch, effectively stacking these times such that they overlap. Note that as one rank receives an activation command, the other rank can receive a read or write command in parallel, as indicated by the arrows labeled "write or read command," i.e., the effect of this configuration is that activate commands and precharge commands can be effectively hidden during rank switches.

Note that once again, a single memory controller design used for the embodiments of FIGS. 5A-5E can be multimodal, with operation determined by a defined register value. For example, if the memory controller is configured with only a single rank of memory, the memory controller can deactivate one of the rank-specific phase calibrated pins and one set of phase interpolators for the links that would be shared amongst memory ranks in a second mode, and use a single CA phase, calibrated for the single memory rank which is present. The three links in this case can be run in lock step. If the memory controller is configured for multi-rank operation (as reflected by a different defined register value), the controller can use a split-CA path as indicated above, with multiple phase interpolators for the shared CA path component, and with individual, calibrated transmit phase values used for each respective rank-specific CA signal.

F. Use of a Half-Rate, Oversampled CA for Commands

Figure 6A:
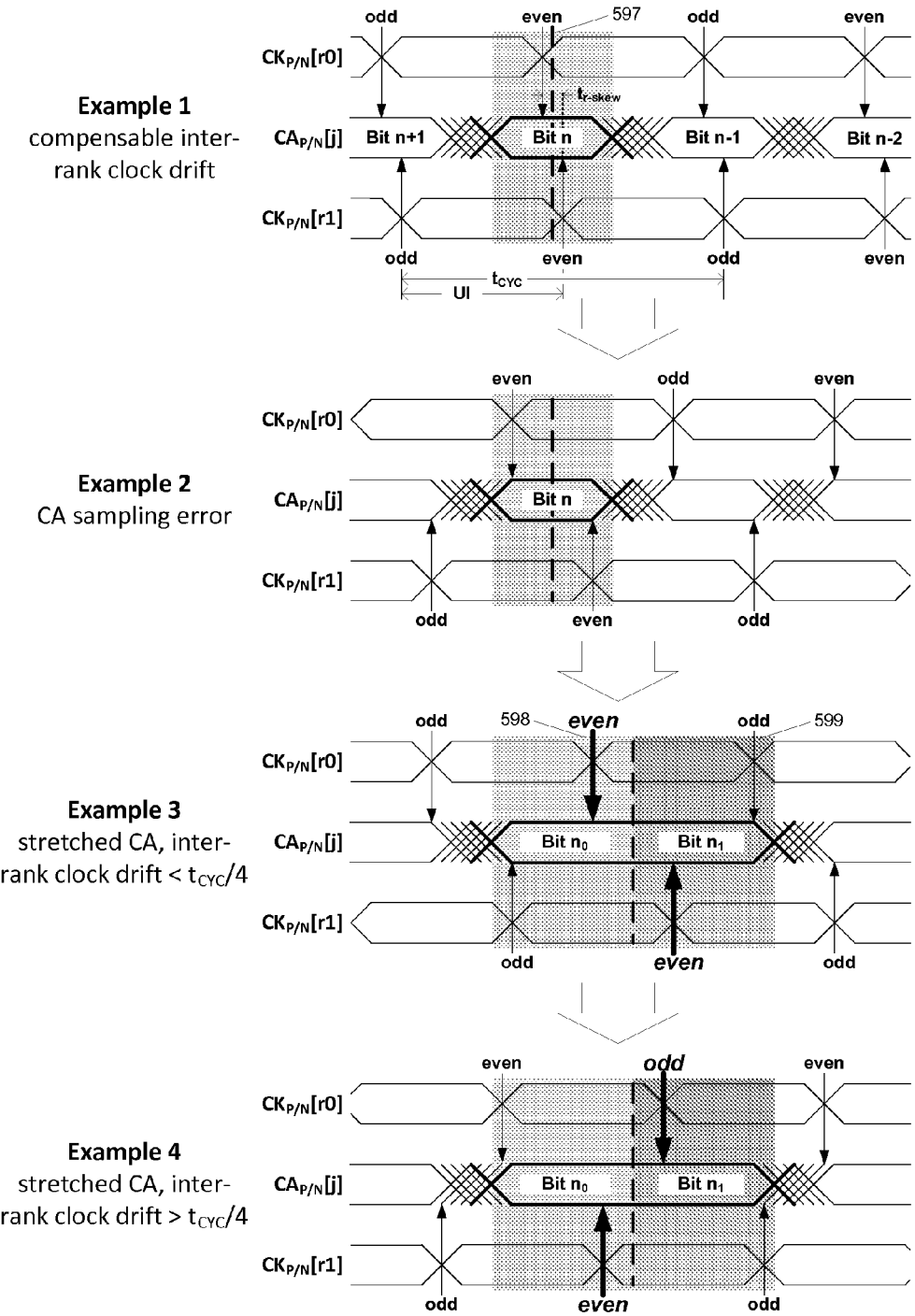
FIG. 6A illustrates an alternative approach to mitigating disruption due to inter-rank clock drift that involves stretching the CA signal eye.

FIG. 6A illustrates, through a sequence of examples 1-4, an alternative approach to mitigating disruption due to inter-rank clock drift (or other offset) that involves stretching the CA signal eye. In example 1, command/address bits are transmitted sequentially over a differential signaling link, $CA_{P/N}[j]$(where subscript "P/N" designates the positive and negative signal conductors of the differential link, and T is the index of a particular link) and is sampled within memory ranks R0 and R1 at respective times indicated by transitions of rank-specific sampling clock signals $CK_{P/N}[r0]$ and CKP/N[r1]. In the embodiment shown, the command/address bits are transmitted at double-data rate (i.e., two bits per clock cycle, $t_{CYC}$) so that the two bits transmitted during a given clock cycle are sampled by respective rising and falling edges of a given sampling clock. Those edges (or transitions) may be viewed as marking the start of respective even and odd phases of the sampling clock cycle and are thus labeled "even" and "odd" in the examples shown in FIG. 6A.

In the embodiment exemplified by FIG. 6A, a controller component forwards a system clock signal to each of the memory ranks via a shared clock link, and each memory device within a given rank includes a clock buffer (or clock tree) to distribute the forwarded, buffered clock in an open loop manner (i.e., no clock feedback to a phase adjustment circuit as in a PLL or DLL) to multiple command/address signal receivers as a rank-specific sampling clock (i.e., $CK_{P/N}[R0]$ within a memory component of rank R0 and $CK_{P/N}[r1]$ within a memory device of rank R1). As explained above, the uncompensated propagation delay through the clock buffer tends to be temperature and process dependent, so that rank-specific sampling clock signals, $CK_{P/N}[R0]$ and $CK_{P/N}[r1]$, drift relative to one another. Consequently, after normalizing the rank-specific clock and CA signal waveforms to account for signal flight-time differences between the controller and respective memory ranks (i.e., illustrating the waveforms as though the controller-to-rank signal propagation times are the same for all memory ranks), the rank specific sampling clock signals are skewed relative to one another. As shown in example 1 of FIG. 6A, when this drift-induced inter-rank clock skew, $t_{r\text{-}skew}$ (or "relative inter-rank clock skew"), is substantially less than a UI (UI=$t_{CYC}$/2 in this example), the controller component may shift the relative transmission times of the forwarded clock and CA signal such to align the ideal sampling instant 597 of each CA signal eye (e.g., the temporal midpoint of each such eye, an example of which is designated "Bit n" in example 1 of FIG. 6A) between the rank-specific sampling clock edges. This calibration approach is referred to herein as "aggregate alignment" as the ideal sampling instant is not necessarily aligned with any one rank-specific sampling clock phase, but rather at a point which yields maximum aggregate signaling margin. In the case of a two-rank system, for example, the clock-to-CA phase offset may be calibrated to establish the ideal sampling instant midway between sampling times effected by rank-specific clock edges and thus $t_{r\text{-}skew}$/2 from each rank-specific sampling instant. In a system of three or more ranks, the clock-to-CA phase offset may be calibrated to establish the ideal sampling instant midway between the two outermost rank-specific clock phases or at the mean, median or other statistical center between the various rank-specific clock phases.

In example 2 of FIG. 6A, the relative inter-rank clock skew has increased to nearly the width of the CA data eye so that, even when the ideal sampling instant is aligned at the midpoint between the rank-specific sampling clock edges (i.e., the nominal best alignment case), sampling errors are likely unless the control component employs rank-specific timing compensation (i.e., switching the CA-to-clock phase alignment according to the addressed memory rank—rank time-domain switching).

Example 3 of FIG. 6A illustrates an approach in which the CA signal eyes are stretched (i.e., widened) to provide additional timing margin and thus enable skew compensation through aggregate alignment despite large relative inter-rank clock skew. In the particular example shown, CA signal eyes are widened by transmitting each CA bit over two unit intervals in succession (i.e., during both the odd and even phases of the clock signal), which may be viewed as transmitting each CA bit twice. Although the CA signaling rate is halved by this operation, the system impact may be negligible, particularly in systems having spare CA bandwidth to begin with. Further, as example 3 shows, the stretched CA signal permits reliable signaling without the complexity and non-deterministic timing of rank time-domain switching. That is, the controller may transmit command/address values in a "rank agnostic" manner (i.e., no rank-dependent changes in CA transmit clock phase)

Still referring to example 3 of FIG. 6A, because the CA signal is transmitted during both phases of a transmit clock signal (i.e., over an interval, $t_{CYC}$, instead of $t_{CYC}$/2), it follows that two successive sampling clock transitions may occur during the CA eye interval. That is, as example 3 illustrates, even clock edge and odd clock edge 598 and 599 occur during the open eye, and though the even clock edge clearly provides more timing margin than the odd clock edge, this may not remain true as the sampling clock phase drifts; note also that irrespective of drift, it may be the case that one rank has better margin using the even or odd sampling phase relative to the other, whether by reason of manufactured-system or device variations, or for other reasons. Accordingly, in one embodiment, the control component can perform a calibration operation to determine which of a set of candidate sampling clock edges provides the greatest signaling margin. This operation can be static (e.g., performed one time at initial operation, or every time a system is started), and in other embodiments, this calibration operation can be dynamically performed during run-time. In one implementation, for example, the controller obtains a measure of the phase offset between memory rank sampling clocks to determine whether their rising edges (e.g., even edges) are offset from one another by more or less than $t_{CYC}$/4 (after normalizing to account for controller-to-rank propagation time differences) and thus whether the even-edge-to-even-edge inter-rank skew is less than or greater than the even-edge-to-odd-edge inter-rank skew (or odd-edge-to-even-edge inter-rank skew). Based on that evaluation, the control component instructs each memory device to sample incoming CA signals in response to either the even or odd sampling clock edges. Thus, in example 3 of FIG. 6A, the even sampling clock edge is applied (following specification of that sampling clock edge by the memory controller) to sample the incoming CA signal within both memory ranks, and the control component performs aggregate alignment on the basis of the phase difference between those clock edges. By contrast, in example 4 of FIG. 6A, the controller component instructs the memory devices within rank R0 to sample incoming CA signals in response to odd sampling clock edges and instructs the memory devices within rank R1 to sample those same CA signals in response to the even sampling clock edges, and performs aggregate alignment on the basis of those sampling clock edges. In either example, the controller component may periodically re-asses inter-rank clock skew and thus change the sampling edge assignment over time to account for non-uniform clock drift between the memory ranks.

Still referring to FIG. 6A, the two sampling clock edges that can be optionally selected to sample an incoming CA signal are referred to herein according to the respective portions or "slots" of the stretched CA bit in which they land. Thus, in examples 3 and 4, each stretched CA bit may be viewed as two separate transmissions of the same bit ("Bit $n_0$" and "Bit $n_1$") that define respective sampling slots. Accordingly, the instruction to the memory device or rank of memory devices to apply a sampling clock based on a selectable edge of a reference clock may be deemed a designation of the transmission slot to be sampled. To provide several examples, the memory device may be programmed to sample in response every "nth" rising edge of a reference clock; alternatively, a rank can be programmed to sample responsive to a falling edge instead of a rising edge, or vice-versa. Also, while the stretched CA approach has been described in terms of a command/address transmission that spans two unit intervals (i.e., each CA bit transmitted twice), the CA transmission interval may be extended even further in alternative embodiments, thus increasing the number of sampling clock edges (or sampling "slots") that may be selected within a given memory rank or memory device.

Figure 6B:
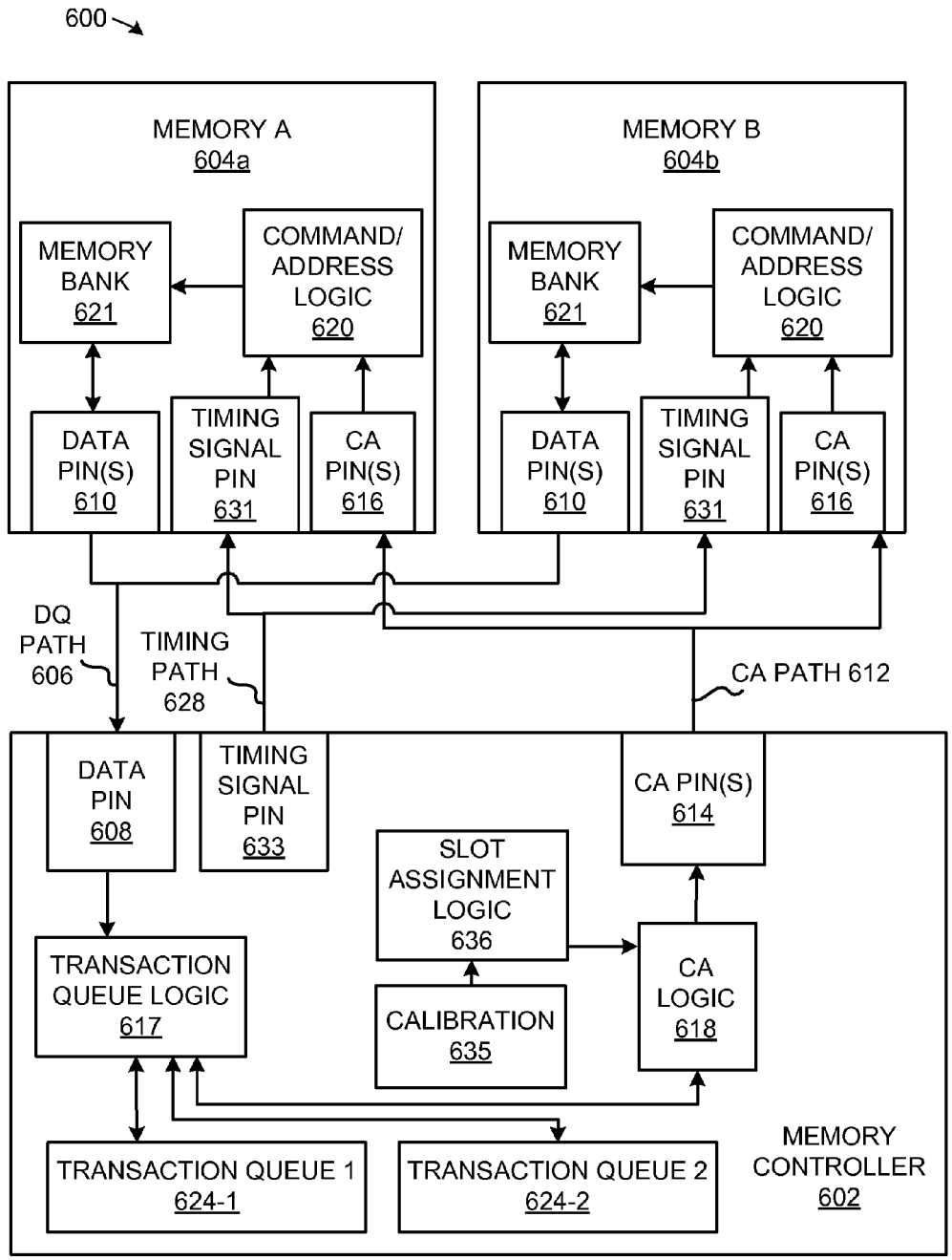
FIG. 6B shows an embodiment that uses command bit slot assignment as described generally in reference to FIG. 6A to send commands to each memory rank.

FIG. 6B illustrates a low power memory system that employs the CA-stretching technique described in reference to FIG. 6A to mitigate inter-rank clock drift. Many of the elements in FIG. 6B are similar to those shown in earlier embodiments; that is, for example, the system 600 includes a memory controller 602 and memory arranged into two ranks A and B, respectively. As before, each rank can be a single memory device, for example, stacked together as a system in-package or other form of multiple chip assembly; the ranks A and B in FIG. 6B can be assumed for purposes of this discussion to be individual DRAM memory devices 604a and 604b. These devices are coupled with the memory controller have a shared DQ path 606, a shared CA timing path 628 and a shared CA path 612. Each of these paths is a conductive path, for example subsisting in packaging that mounts the individual integrated circuits, in a printed circuit board, or otherwise, and each is configured as a point-to-multipoint connection, that is, coupling the one memory controller 602 with multiple memory devices 604a/604b. Again, while two devices 604a/604b are shown as respective ranks, it is possible to add more memory devices, configured as two, three, four, or still larger numbers of ranks, using the principles set forth herein. The memory controller 602 has a number of pins 608, 633 and 614 which respectively convey the DQ, timing and CA signals to the aforementioned paths, and similarly, each memory integrated circuit includes reciprocal pins for receiving these signals 610, 631 and 616, respectively. As with the embodiment of FIG. 5A, the timing signal can be a clock signal distributed by the memory controller to both memory devices 604a/604b.

As before, the memory controller includes two transaction queues 624-1 and 624-2, one for each of the memory ranks A/B, respectively. These queues are used to keep track of transactions in-progress and scheduled for each rank of memory, and for related purposes such as error detection, load/store conflict resolution and so forth. Because the two ranks share a common command path (CA path 612), transaction queue logic 617 is used to sequence commands that make up each read, write or other transaction, for multiplexed, fine-interleaved transmission over the common command path. Again, because of the PtMP configuration, these commands are transmitted to all ranks, even though only a single, addressed rank will process those commands (as determined by each rank according to an address field in the specific rank). If desired, in some embodiments, one or more chip select or rank enable signals can be used to effect or assist with rank selection. The transaction queue logic 617 then sends the sequenced, fine-interleaved commands to CA logic 618, which packetizes and otherwise formats those commands for transmission to memory for command servicing. Note that, as before, each memory has internal timing which is subject to drift, and being a low power memory system, this drift is managed from the side of the memory controller, such that the memory controller can enable or disable operations in each rank in accordance with various power modes. Thus, the system 600 includes means for correcting for or accommodating inter-rank skew so as to permit proper interpretation of commands and fine-interleaving, without excessive CA idle times which could otherwise impact performance. As contrasted with the embodiments presented earlier, the system of FIG. 6B runs its CA path 612 at a reduced effective speed relative to DQ rates. That is, if the DQ paths for example transmit 3.2 Gbps at double data rate (DDR) using a 1.6 Ghz clock, then the CA path would transmit different commands using a an effective transmission rate of less than 3.2 Gbps. In this specific embodiment, the CA path is run so as to have multiple command bit slots—that is, more than one timing signal edge that could be used to sample an incoming command bit. Depending on inter-rank skew, the different ranks can be assigned the same slot to look for commands, or different slots. Note that in one embodiment, it is possible to only transmit bits to an addressed rank in a designated slot; in other embodiments, each command bit is repeated in each and every slot. Each set of slots is referred to as an interval, and different command bits are inserted in different intervals.

In a first example corresponding to that shown in FIG. 6A, command bits can be transmitted twice for each of multiple slots that make up an interval until an address field is transmitted. If two slots are used, the transmission takes twice as long, because each bit has to be transmitted twice, halving the effective command rate. However, while this effective command rate is slower than the command rate for other embodiments, this technique provides for substantially increased tolerance to inter-rank clock skew in the respective clock trees for the ranks, and so permits inter-rank multithreading. Note that both ranks can be assigned the same slot in the command frame architecture or different slots, depending on detected inter-skew. For example, if rank B is determined to have timing skew relative to rank A by one-half unit interval (or to be more precise (2n−1)/2 unit intervals, where n is any integer), then each rank can be assigned a different one of the two command slots. If rank B is determined to have timing skew relative to rank A on the other of n unit intervals where n is any integer, then the two ranks can be assigned the same slot. Note that this architecture permits both ranks to sample the CA path without needing to reload phase codes when the CA command path includes a fine-interleaved command to a new rank. The timing signal forwarded by path 628 to both ranks, or equivalently, CA phase codes used for transmission to both ranks is also adjusted in this example, so as to center the CA sampling points of each rank of memory as evenly as possible about the ideal sampling point or points of the shared or respective bit slots. This operation will be further explained below, but for purposes of FIG. 6B, it should be noted that the memory controller 602 performs calibration to identify inter-rank skew and properly adjust the sampling times, as represented by numeral 635, with a bit slot being assigned to each rank as appropriate as represented by numeral 636. As mentioned for embodiments earlier, the calibration logic also performs per-rank, per-direction DQ link phase calibration, such that the respective memory ranks can perform both sampling of write data and transmission of read data at times indicated by transitions of the forwarded timing signal (i.e., via path 628). For its part, each rank includes command and address logic 620 that receives commands addressed to the specific rank, and routes those commands for processing, as appropriate. The use of one or more banks (in the case of individual memory devices 604a/604b) is represented by numeral 621.

Reflecting on the methods identified with respect to FIG. 6B, it is noted that the provision of an increased timing budget for the CA path provides increased tolerance to inter-rank skew, and still permits immediate recognition of commands by each rank when it is addressed without time delays for switching CA phase codes; this facilitates fine-interleaving of commands between multiple ranks. The direct use of a forwarded clock for CA sampling, with the dividing down of this clock for framing purposes, permits relatively simple circuitry to be used on-board each memory device without adding to controller pin-count. Notably, the memory controller still will incur as part of its calibration process some minor overhead to determine the optimum CA command bit slot for each rank of memory and to assign the selected rank a command bit slot (e.g., via a side band signal), and each of the memory controller and the memory device will incur some minor additional circuitry for command bit slot replication and processing. Also, the repetition of commands does result in some CA path inefficiency;

however, as mentioned, this inefficiency is relatively minor and still permits effective inter-rank microthreading of commands. The repetition of commands between slots is used by some embodiments to perform termination switch for deselected ranks; that is, for embodiments that replicate command bits in all slots, memory device logic can be configured to snoop all commands to detect a rank switch. In the event of such a detected switch, automatic protocols can be invoked for driver and termination configuration. In other embodiments, it is possible to transmit certain commands only in individual slots, that is, without command repetition. Finally, note that with or without additional ranks, greater or fewer slots can optionally be used depending on embodiment, such that the number of ranks and slots do not have to be equal to one another. That is, it is possible to design systems that use three slots for two ranks, or two slots for three ranks, for example. In the context of FIG. 6B, two slots represents an advantageous design, because the clocking circuitry used within the memory device to create two alternate clocks (e.g., including an inverted version of an input clock) is relatively simple. Once again, in such embodiments, the raw information is transmitted at the same rate on both the CA path and the DQ path on a per-link basis, but the effective rate of the CA path is reduced by an integer amount in inverse proportion to the number of predefined slots—if two slots are used, then the effective rate of the CA path is one-half.

Figure 6C:
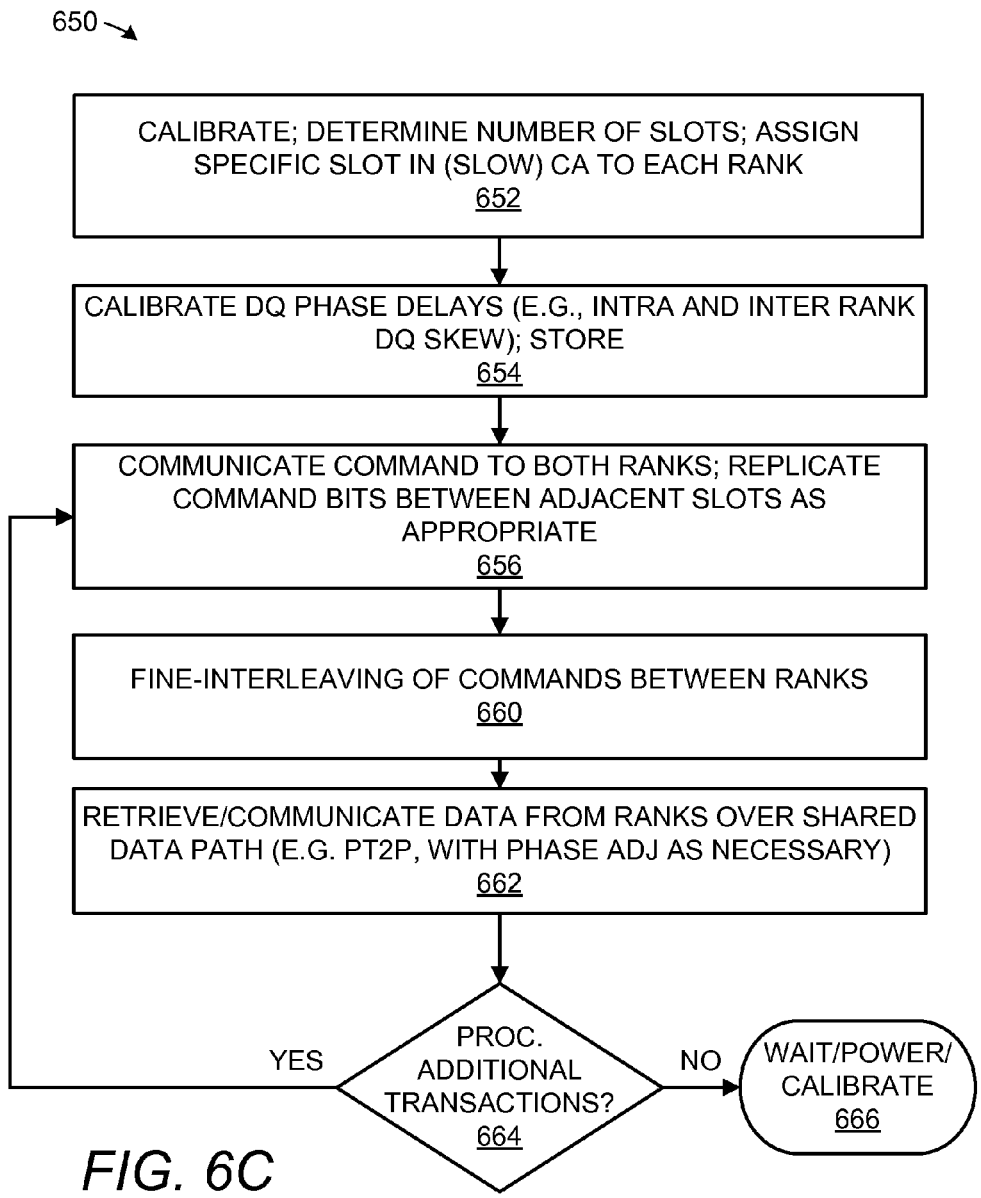
FIG. 6C shows a block diagram of a method used by the embodiment of FIG. 6B.

FIG. 6C is a method diagram used to additionally explain the techniques introduced by FIG. 6B. The method 650 includes calibrating multiple ranks of memory in an off-line static or dynamic calibration process, per method block 652, and assigning each rank (or each memory device) a slot within a command frame at which to sample command bits. Note that the objective of the calibration process is once again to measure inter-rank offset, and the use of slots effectively represents a digital approach to addressing that offset, effectively rounding it to the nearest half-UI; for example, if skew is such that CA sampling by two respective ranks is separated by 70 degrees of phase and two slots are used, then both ranks can be assigned different slots, with the controller using CA phase code adjustment to center the respective sampling times about this skew (e.g., with slots representing 90 degrees separation, the forwarded clock or CA phase codes can be adjusted such that one rank effectively samples 10 degrees off of UI center, e.g., 10 degrees late, while a second rank effectively samples also 10 degrees off of UI center, or 10 degrees early). If the skew is such that the ranks are separated in CA sampling by less than 45 degrees of phase, then memory controller could assign the ranks the same bit slot, once again centering CA sampling timing in a manner that centers sampling by both ranks.

Note that more than two slots can be used, or a variable number of slots can be used. For example, the memory controller can calibrate inter-rank skew and use a single slot if skew is small, two slots if skew is between, e.g., 45 degrees and 135 degrees, and more slots if still greater inter-rank skew exists. In some implementations, these techniques can be applied on a one-time basis, to compensate for manufacturing differences in the memory system or in the individual memory devices. For example, it may be in a particular system that the "data eye" for one or more CA signals has an optimal sampling different for the two ranks (e.g., irrespective of drift). In such a system, a memory controller can be configured in a static process to determine whether one slot or multiple slots should be used, and to effectuate associated mode/register programming for the system (e.g., for the memory controller as well as individual memory devices or memory ranks). Alternatively, to address drift, this calibration can be performed on a dynamic basis, e.g., every few microseconds, or more or less frequently depending on embodiment.

As denoted by numeral 654, the calibration process also will typically calibrate each DQ link so as to determine per-rank, per-direction (i.e., transmit or receive), per-link timing phases, so as to align data receipt at each memory device (both across lanes and relative to each other rank); optionally, intra-lane CA skew can also be measured at the time of DQ link calibration to the extent correlated across ranks, e.g., to center the sampling of skewed ranks as has just been discussed. Whether or not this centering is used, each CA link can be assigned a transmit phase that it will use irrespective of addressed rank.

With the calibration process completed, the system can resume normal data operations (i.e., including the reading and writing of "live" data and other memory operations, such as refresh. During this time, commands are transmitted to both ranks over the shared CA path, per numeral 656, with command bits replicated between slots as appropriate. Because each rank receives and immediately interprets commands without the need for the memory controller to reload phase codes for the shared CA, commands can be fine-interleaved without allowing for substantial DQ idle time, effectively permitting microthreading between ranks, per numeral 660. Note that as implied, a DRAM operation involving a rank switch for example can include activating a row (to sense row contents within a memory) and then accessing a column within that row to latch out or replace contents of the row, via sequential commands in one memory device or rank; interleaved between these two commands, operations within another rank of memory not involving concurrent use of the DQ path may be initiated or completed with an activate command or a precharge command (for example; it is also possible to perform other memory operations, such as by issuance of a refresh command). Because operations in the second rank are ongoing in parallel with the mentioned-DRAM operation (row activation and column read or write access), efficiency is significantly enhanced; in a low power memory system, this permits substantial expansion in memory capacity notwithstanding the absence of memory device on-board phase regulation circuitry, such as using a PLL. The pipelined data communications with the memory controller are represented by method box 662, where the memory controller retrieves and/or communicates data with both ranks via a Pt2P connection, with DQ phase code reload as necessary for rank switches and transmit/receive directional switches. Finally, as represented by numerals 664 and 666, the method either continues with additional operations (including fine-interleaving of commands), or enters an idle state, or otherwise performs calibration or changes power mode state.

Figure 6D:
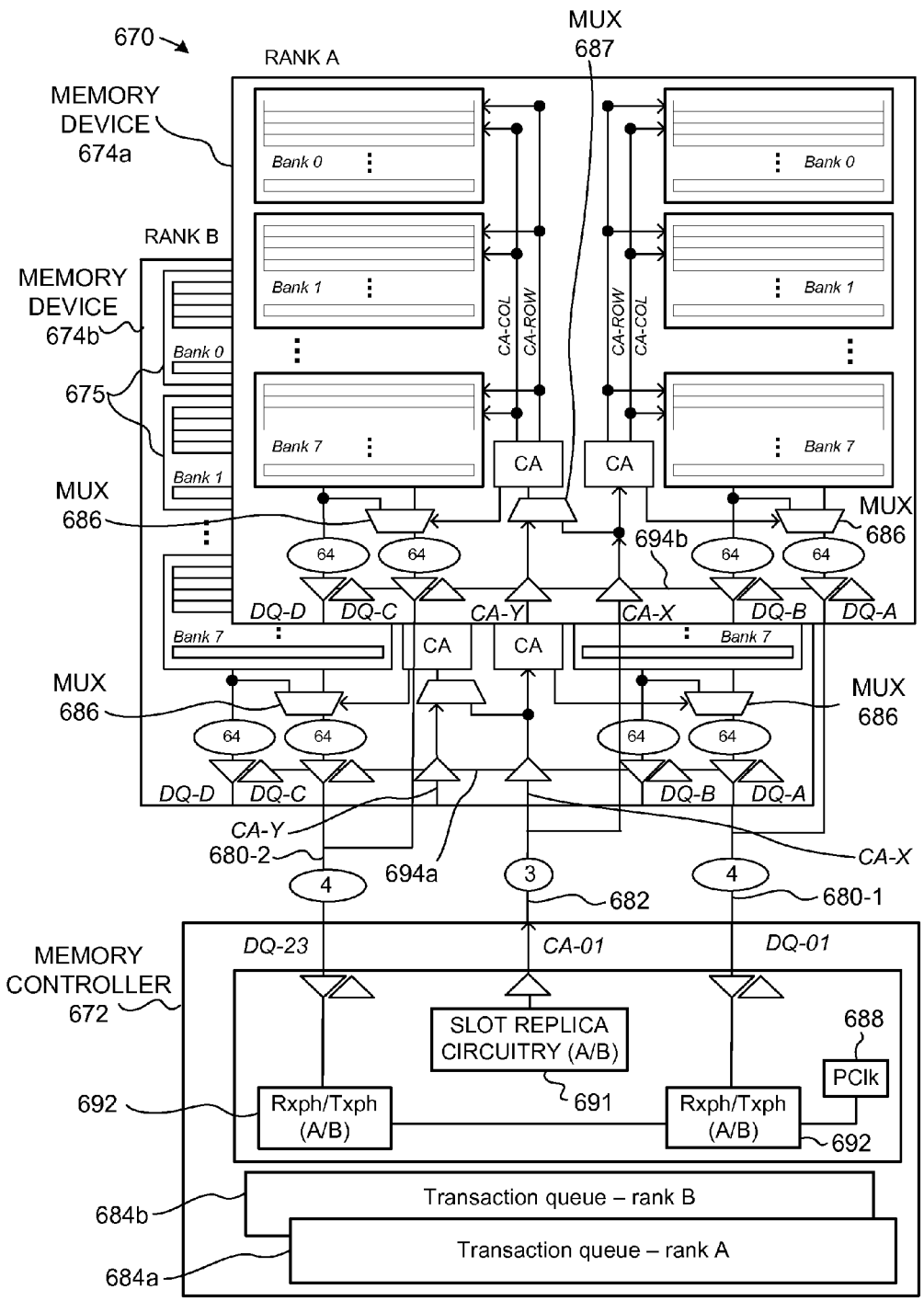
FIG. 6D shows another embodiment that uses command bit slot assignment to send commands to each memory rank.

FIG. 6D provides a detailed layout of a memory system 670, once again rooted in a single memory controller 672 and two memory devices 674a/674b, each implemented as a separate rank. Note first that the memory controller 672 is connected to the memory ranks in a PtMP configuration for both CA and DQ paths (682 and 680-1/680-2, respectively). It is noted that the memory controller 672 also forwards other signals (such as a clock, sent in common to both memory ranks (as indicated in FIG. 6B), but this is omitted from the Figure and discussion here for brevity. The received clock is distributed within each memory bank as indicated by numerals 694a/694b and is used for both transmission of data and receipt of data and commands. Note that because a single timing signal is used as the basis for these operations for both memory devices, these signals are subject to relative skew at the points where they are used for sampling and transmission, and different numbers 694a/694b are used to underscore this point. As was the case earlier, three CA links are used in this embodiment per memory device, with each of left and right sets of banks being operated at half-width (that is, with 64 bits/four serialized DQ link outputs instead of the 128 bits/eight links introduced by FIG. 1A). Note again that each memory device in this example is coupled to thread commands to either the left or right sets of banks received via CA port CA-X, while CA port CA-Y is left uncoupled. As will be presented below, this permits flexibility in the memory configurations supported, e.g., additional capacity can be provided in this system in the form of independently addressed groups of memory devices, or the use of slices or sub-ranks for each transaction. As was the case for embodiments discussed earlier, each memory device 674a/674b uses sixteen banks 675 and internal multiplexers 686 and 687 for reconfiguring the routing of inbound commands and bidirectional data; thus, if one of the CA ports (CA-X, CA-Y) of the memory device is to be left unconnected, this is preferably the CA-Y port and multiplexer 687 is used to route inbound commands from the CA-X port for processing by both left and rights sets of banks. Each memory device is separately configured for its data connections—if all four DQ ports are to be connected to the memory controller (e.g., in full-width mode), then the multiplexers 686 use a first setting, and if only two DQ ports are to be used in half-width mode (with the other two DQ ports being left open), then the multiplexers 686 use a second setting. Note that it is possible (as will be shown below) to use quarter-width or still more granular modes; that is, instead passing 64 bits of parallel data (for serialization prior to transmission) to one or two ports as in the half- and full-width modes, the multiplexer can have feature two-bit or more granular selection that pass 32 or fewer bits data to a single port for each bank set (the DQ-C and DQ-A ports). In this regard, the use of 32 bits represents the quarter-width mode, 16 bits represents the one-eighth-width mode, and so on. More on this topic will be presented further below. Note, however, that if these modes are used, the memory banks are ideally reconfigured in terms of their organization for a greater row- or bank-depth as appropriate. That is, if column size is halved through progression to a narrower width data word, the number of columns per row can be doubled, or the number of rows per bank can be doubled, or the number of banks can be doubled, through reconfiguration of array control circuitry for the device in-question and its various banks.

As was also the case before, the memory controller 672 uses two transaction queues 684a/684b, one for each rank (ranks A/B). In addition, as indicated by numerals 688 and 692, a processor clock is used as the basis for a timing signal sent to a memory device, and also for per-link, per-rank, per-direction DQ path transmission. Per-link phase adjustment can also be used for the CA path to correct for inter-link CA skew correlated amongst the ranks.

Because one timing signal is used as the basis for operations of both memory devices 674a and 674b, and because these devices do not have clock phase regulation circuitry (such as PLL circuitry, rendering distributed clocks susceptible to inter-rank drift), an inter-rank skew mechanism is used to mitigate this drift and permit immediate rank-recognition of transmitted commands in the event of a rank switch. In this specific embodiment, this mitigation is provided in part by bit slot replica circuitry 691. As before, raw data transmitted on the CA path 682 is transmitted at the same rate as data transmitted on the DQ path (DDR using a 1.6 Ghz PCLK, or at a 3.2 Gbps bit rate), but the slot circuitry creates longer bit intervals than represented by this raw transmission rate. Thus, if two slots are used, the CA path effective rate is halved to 1.6 Gbps; the memory controller 672 still transmits at a rate of 3.2 Gbps over the CA path 682, but the effective command rate is halved. Note that in one embodiment, command bits are transmitted only in select slots, and in a second embodiment, command bits are repeated for every slot. The effect of this embodiment is to provide increased tolerance to inter-rank clock skew.

To provide an example, if it is assumed that one rank experiences skew on the order of ninety degrees of phase relative to the other rank, and that a DDR transmission scheme is used, this amount of skew could conventionally render commands at rank switch unintelligible by the new rank (absent substantial CA idle time to switch CA phase codes, for example, hindering microthreading). This unintelligibility would arise because if one rank was centered about the proper sampling time, the other rank would be sampling exactly at the data transition time (i.e., 90 degrees offset from the proper sampling point). However, by repeating each command bit in two adjacent slots and shifting which clock edge one of the memory devices samples on, with any attendant processor-forwarded clock phase (or CA phase code) adjustment as necessary, it becomes possible for a newly-commanded rank to immediately interpret transmitted commands notwithstanding the current skew. Note that while the use of phase-alignment circuitry such as PLLs on a memory device hinders low power application, by contrast, the use of digital logic to implement sampling on what effectively is a single data rate (SDR) basis for a DDR signal, and to change which edge is used by the memory device, does not present a substantial power sink. To again provide an example, if it is assumed that the clock skew is such that a first rank samples the CA path 110 degrees of phase later than a second rank, then the first rank is assigned a different slot than the second rank (i.e., meaning that the first rank is inherently told to sample 90 degrees later than the second rank, using calibration and simple digital logic). The memory controller can then optionally shift its CA phase codes for both ranks to be 10 degrees behind the forwarded clock, i.e., such that the first rank samples the CA path 10 degrees early, while the second rank samples the CA path at 100 degrees, closely corresponding to the arrival of command bits intended for it at a 90 degree sampling point.

As discussed in reference to FIG. 6A, more than two bit slots can be used, and that variation in the number of slots can be made dynamic; the use of more than two slots is particularly useful for situations where inter-rank skew exceeds roughly 1.5 UI. For example, if inter-rank skew is about 180 degrees, then three slots can be used, with two ranks sampling dead center in the first and third slots—command bits in this embodiment would be repeated three successive times, with the "late" rank being assigned the last slot interval. As this discussion implies, memory slots assignment can be made dynamic, and multimodal, a corollary function of the memory controller calibration process, system topology (and operating mode) and detected skew. A memory controller such as memory controller 672, if implemented with only one rank of memory, can operate at the full CA rate (that is, with no use of multiple slots to transmit individual bits of a command, and no related configuration or processing). Depending on the setting of a mode register (see FIGS. 4A/4B), the memory controller can invoke the use of slots, with the number of slots either fixed dependent on mode, or adjustable in view of calibration. To cite a corollary example to the one just presented, if the memory controller 672 was used in a multi-rank system, the mode register would then be set so as to cause the memory controller to use slots. In one embodiment, this memory controller would only use two slots with command bit repetition as has just been discussed. Alternatively, in the second mode, the memory controller could use a variable number of slots from one to any number; the memory controller would during calibration measure inter-rank skew, and dynamically adjust framing and the number of slots in dependence on maximum detected skew (e.g., 1 slot for skew less than 45 degrees of skew, 2 slots for skew between 45 and 135 degrees, 3 slots for skew between 135 and 225 degrees, and so on).

Figure 6E:
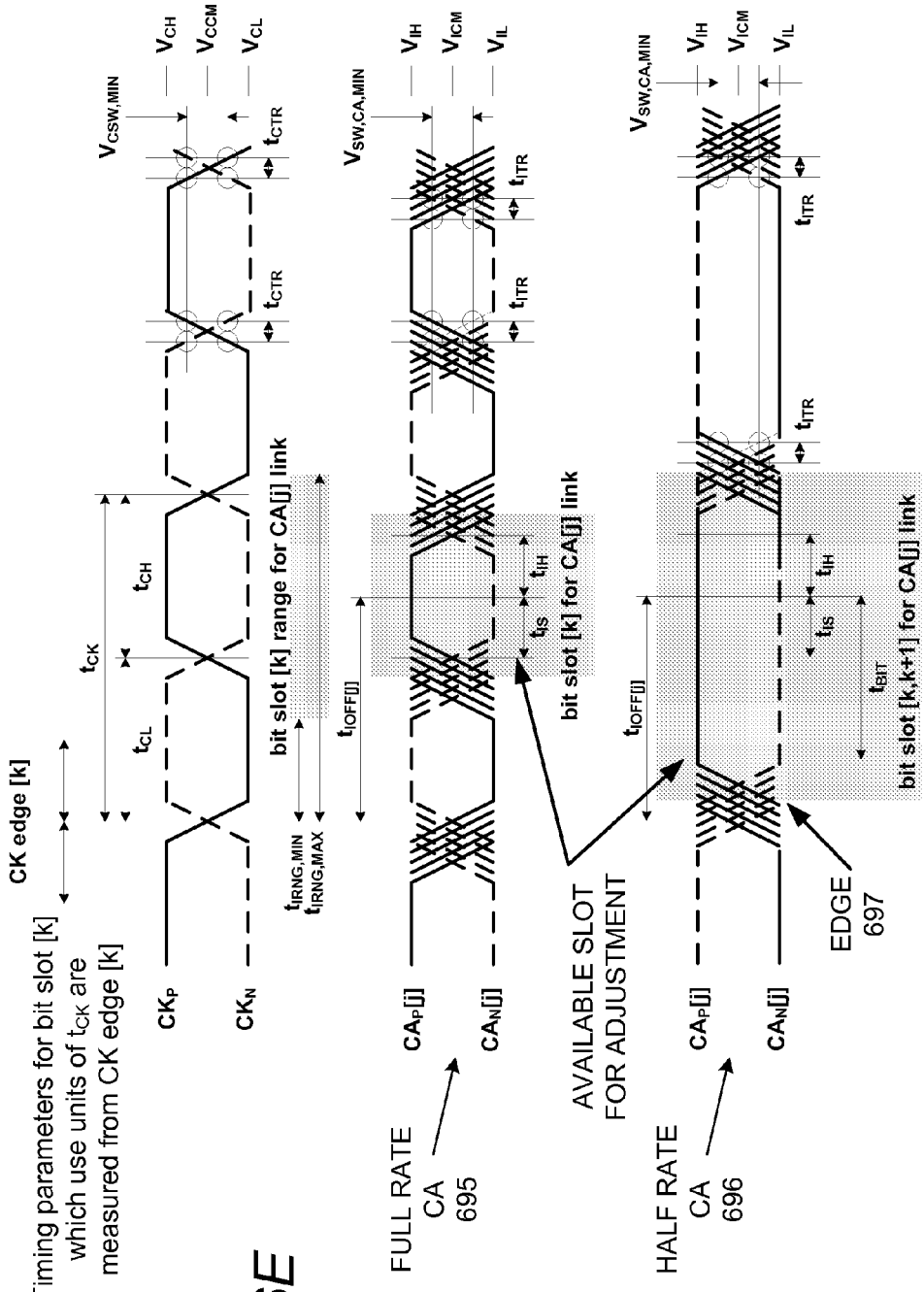
FIG. 6E is a timing diagram used to explain command bit slots and related assignment.

The structure for doing this can also be seen with reference to FIG. 6E, which shows a diagram divided into bit slots for the CA path (topmost waveform), ranges of data symbol eyes associated with CA full rate transmission (695, middlemost waveform), and ranges of data eyes associated with half-rate transmission (696, bottommost waveform). By switching to a "half-rate CA" and effectively telling each memory rank to sample one bit slot or the other, increased tolerance for skew can be accommodated; for example, assuming a particular clock edge 697 (designated in the bottommost waveform), a memory rank that might otherwise sample the CA path late is effectively given a much longer period to sample each command bit, as represented by gray shading in FIG. 6E. Note that as should be apparent, if skew is small, each memory rank can be assigned the same slot by the controller.

Figure 6F:
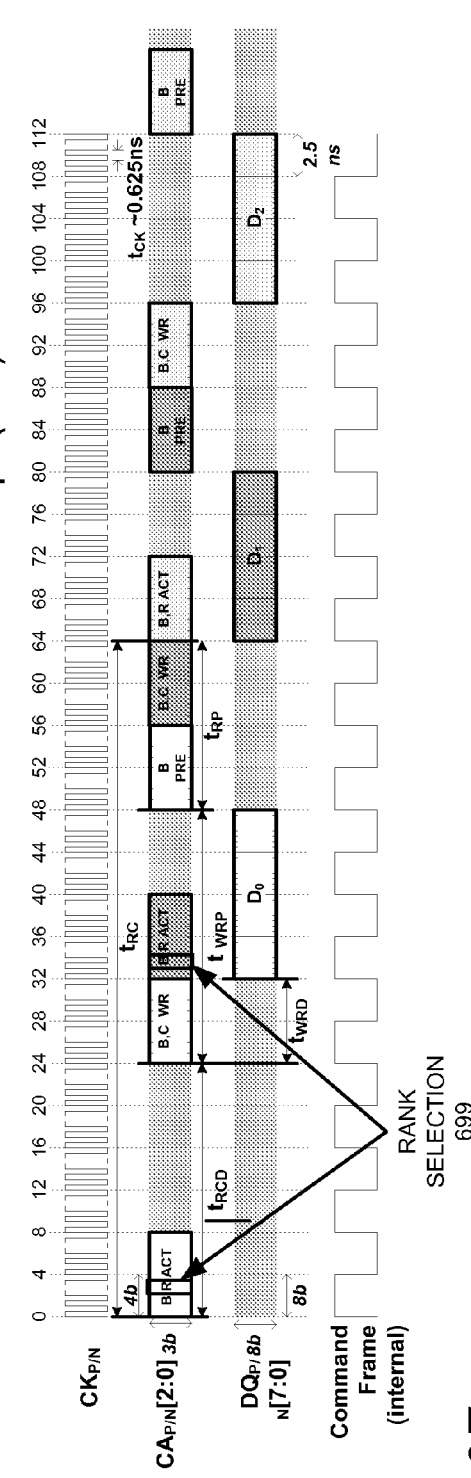
FIG. 6F is another timing diagram used to explain the use of command bit slots.
Figure 6F:
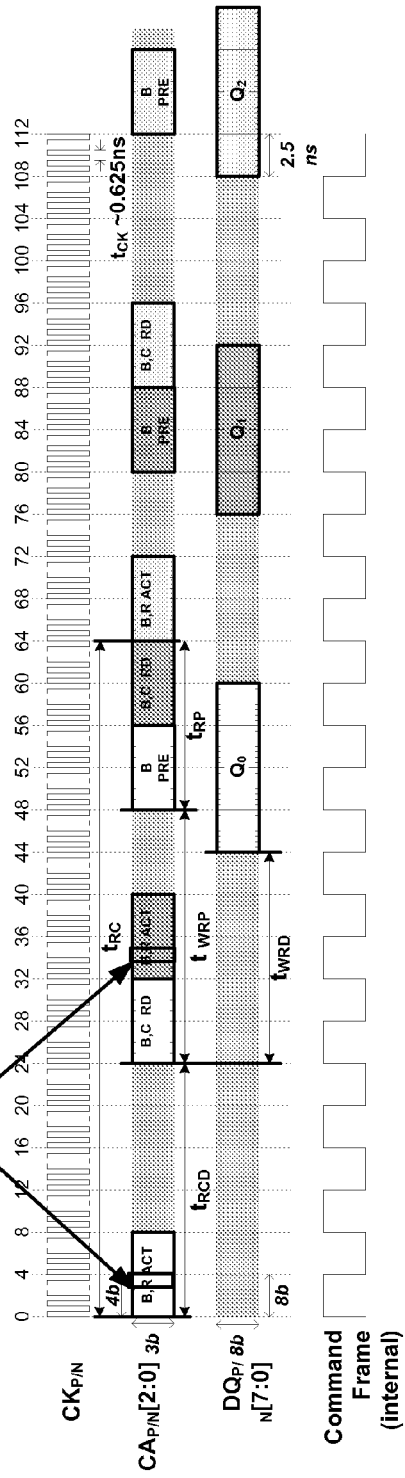

FIG. 6F provides an additional timing diagram 697; this timing diagram is once again divided into upper and lower halves 697a/697b to help illustrate the multi-rank write and read cases, respectively. It should be assumed for purposes of this figure that command bit slots are used, with each command bit repeated in two or more slots. Commands addressed to a first rank (and associated data, D0 in the case of write data and Q0 in the case of read data) are represented with no shading, while commands addressed to a second rank (and associated data, D1 in the case of write data and Q1 in the case of read data) are represented with dark shading. Note that the CA path [$CA_{P/N}$[2:0] and the DQ path $DQ_{P/N}$[7:0] are PtMP, with commands taking twice as long to transmit as was previously the case, i.e., the effective command rate is halved relative to previously-mentioned embodiments or a single rank case. That is, each command (effectively at single data rate because of command slot assignment, assuming two slots) now takes eight clock cycles (three links, SDR, 24 bit packets), while transmit 128 bits of data via 8 DDR DQ links during this same time (note that FIG. 6F represents a mode in which 256 bit columns are transmitted). Although the commands take longer to transmit, the command path can be kept reasonably occupied with fine-interleaving between ranks.

Figure 7A:
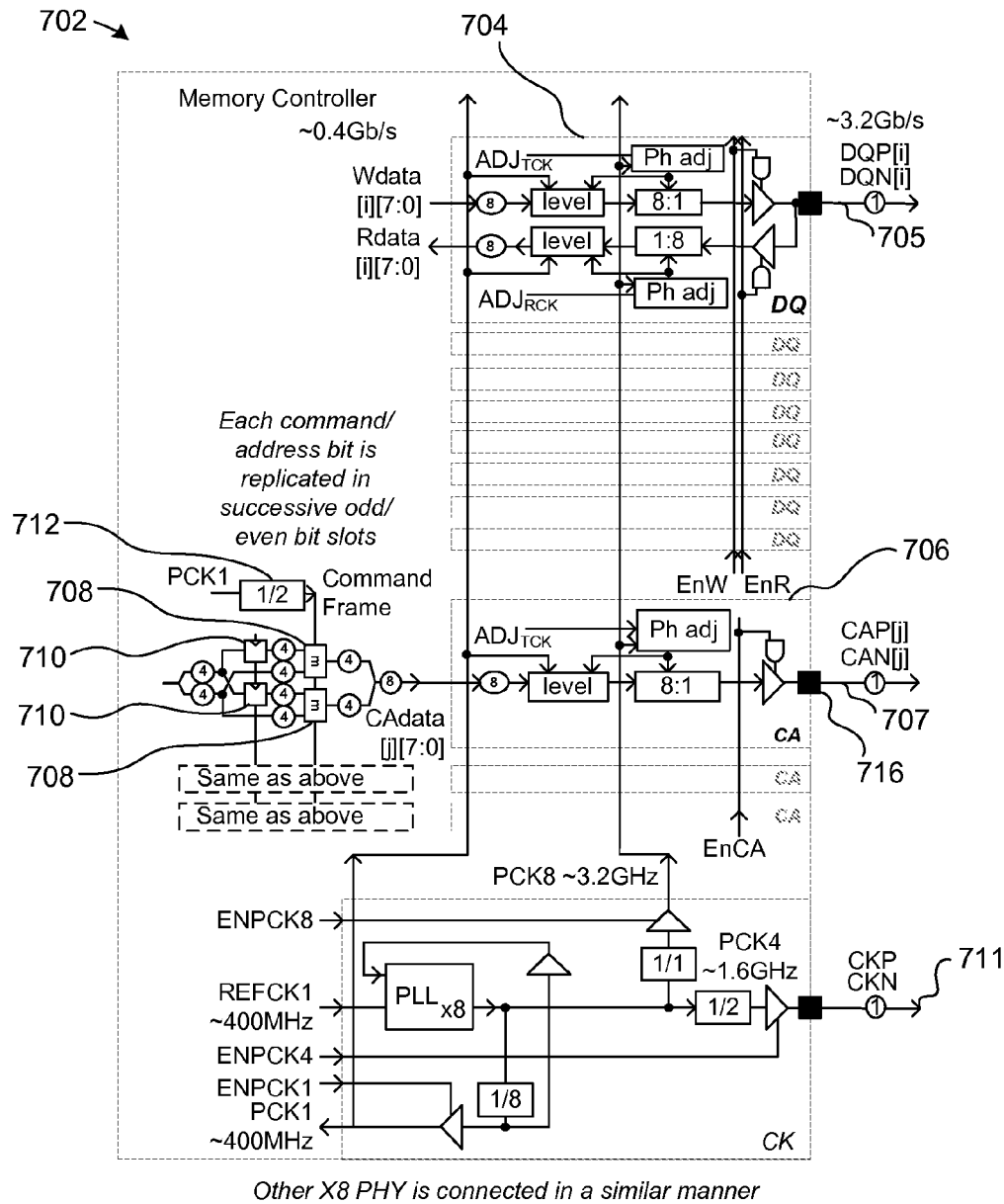
FIG. 7A shows per-link circuitry of a memory controller, such as the one seen in FIG. 6D, and circuitry used to perform command bit replication in multiple slots.

FIG. 7A provides more detail on the design of the memory controller and, in particular, the circuitry used to support command slot division, for the instance where two bit slots are used. Note that the memory controller is designated using number 702 in FIG. 7a, and that the phase adjustment circuitry per DQ lane is designated using numeral 704; while the circuitry for only one link is shown in expanded detail, note that each link has the same structure, and that the boxes labeled "Ph adj" represent a per-lane, per-direction phase interpolator controlled by a phase adjustment signal (AD-$J_{TCK}$/$ADJ_{RCK}$) as appropriate, which programmatically writes a value into a register of the particular phase interpolator circuit to store phase codes as appropriate. Also, the mnemonics labeled Wdata and Rdata, [i][7:0] should be understood to represent "the" one of the data bits corresponding to the respective "i-th" link (e.g., first link, second link, etc). Note further that each indicated link (705 for DQ links, 707 for CA links, and 711 for the forwarded clock), are each differential signals, as represented by the use of positive and negative signal components (e.g., DQP[i]/DQN[i]). As with the DQ links, phase adjust circuitry for a single CA link is seen in enlarged detail at box 706. This circuitry similarly includes a level adjustment signal ($ADJ_{TCK}$) that is used to offset inter-link CA skew, although as noted previously, it is desired to have a single transmit phase per CA link that is used for all ranks for this embodiment. Each CA link signal is similarly a differential signal, as depicted by numeral 707, with outgoing signals being coupled to a CA path via a controller signal pad (represented as a black square, 716).

The circuitry used to assign command bits to slots is represented by numerals 708, 710, and 712. In particular, a 400 megahertz internal signal (PCK1) is received and divided down by two by element 712, to form a 200 megahertz byte framing signal. At the same time, a group of four command bits is copied with each per-bit-copy delayed by flipflops 710 and interleaved with its parent to form an aggregate group of eight bits. The effect of this delay is that 400 megahertz commands are received, with bits being duplicated and latched out via multiplexers 712 on opposite edges of a 200 megahertz clock, with the flipflops sampling and holding the command bits through complete cycles of the 200 megahertz clock; the CA phase circuitry 706 receives eight bits at a time (i.e., four bits that are replicated and interleaved) and sends these out in serialized manner as has been described, on opposite edges of a 1.6 Ghz clock (seen in this figure as PK4). Note that while the memory controller includes a phase-locked loop (PLL) for clock regulation, this is consistent with a low power context, i.e., the principle used in many low power systems is to concentrate the power consuming circuitry and calibration and other "smarts" on the memory controller, rendering it easier to freeze the clock used by each memory device. Note that there are many different power modes that can be implemented, including different levels of power conservation within the memory controller and other system components.

Figure 7B:
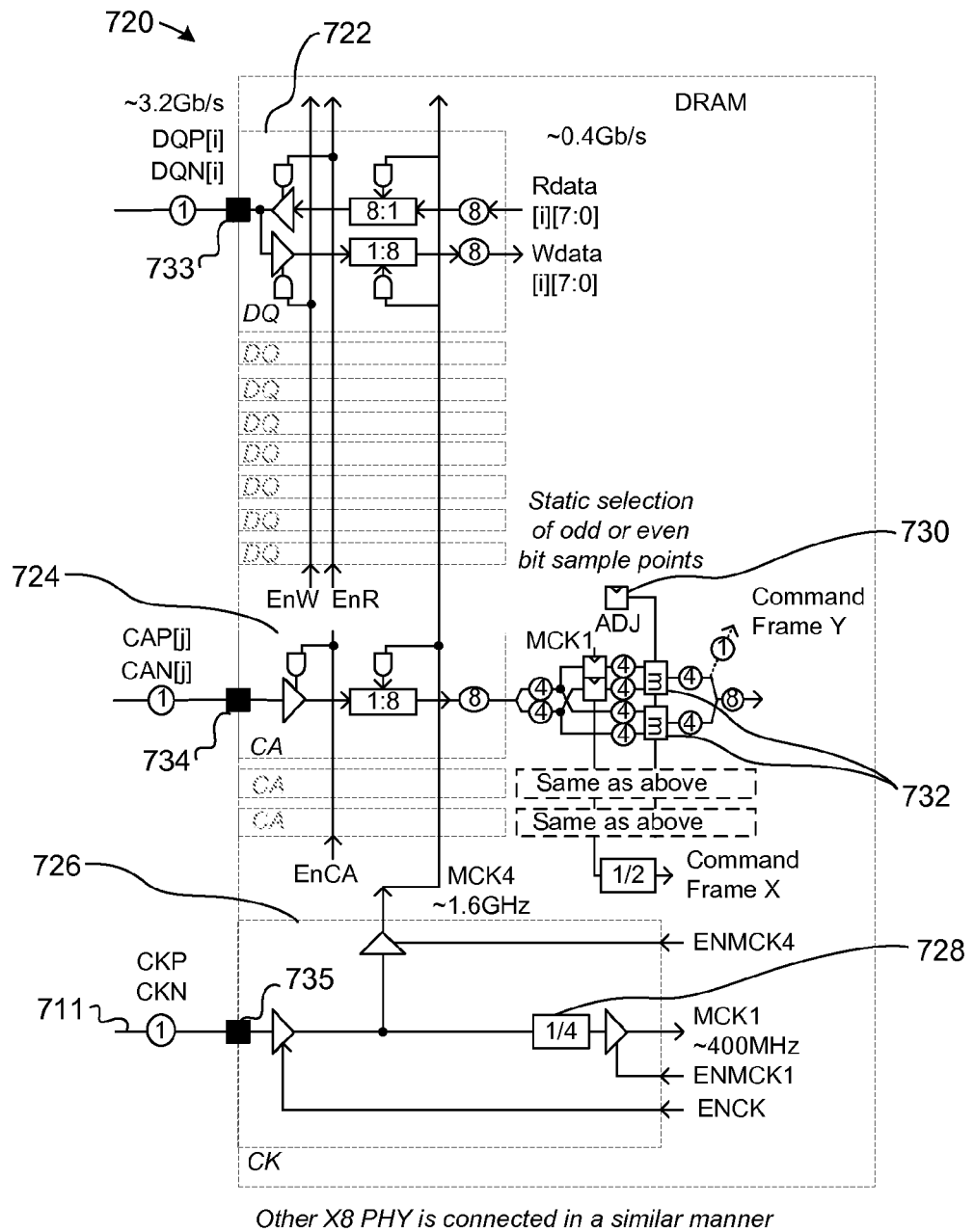
FIG. 7B shows per-link circuitry of a memory device, such as the one seen in FIG. 6D, and circuitry used for command bit slot assignment and command processing.

The memory side is represented in FIG. 7B, with the memory device being represented by numeral 720. Note that the memory similarly has many sets of DQ and CA phase circuitry, with only the circuit for one DQ link and one CA link being shown in expanded detail, at boxes 722 and 724. These respective boxes do not include phase adjustment circuitry, but rather, they use the clock 711 received from the memory controller for both transmitting and sampling of data, with at most simple logic processing. Clock amplification circuitry and rate dividers used for framing and other purposes are represented by box 726, with a 400 megahertz clock being derived by divider 728 for purposes of command framing. Note that because of inter-rank clock skew is presumed reflected in the distributed clock with the memory device, the samplers for the CA path (729) will sample at some delay relative to memory controller transmission; the particular sampling instant corresponding to an assigned slot is determined by the memory controller and programmed into each memory device during calibration (e.g., via a side band link). The bit replication permits this sampling to occur in a manner that is tolerant to inter-rank skew. As each bit is serially received, it is fed to a 1:8 deserializer, and fed as a command byte to adjustment circuitry, which then de-interleaves bits and effectively gates the output of a selected 4 bits of command data according to the identified command slot. More specifically, the static selection of command slot is stored in a register as represented by numeral 730, with this selection then being use to affect the output of two multiplexers 732 to effectuate appropriate slot selection.

Note that as with the memory controller, each signal path is coupled to the memory device via a signaling pad, such as pads 733, 734 and 735.

While circuitry showing the use of two bit slots is illustrated above, it is considered straightforward to modify the illustrated circuitry to support more than two slots, if desired for the specific embodiment.

Reflecting on the approach presented by FIGS. 6A-6F and 7A-7B, relative inter-rank skew can be corrected through assigning specific command bit slots to memory devices, which effectively cause those devices to look for specific commands at different times, essentially responsive to the same clock (with presumed skew) but with a potentially-different, programmed interval being used to initiate sampling of the CA path. Thus, one clock can be forwarded to multiple ranks without the need for any pin increase on the part of the memory controller or memory devices to support fine-interleaving. Circuitry can be dedicated in each of the memory controller and memory devices to support the use of these slots. Note once again that one or both of these devices can be bimodal—that is, use of slots can be disabled in a single rank mode and enabled in a multirank mode to mitigate inter-rank skew. Through the provision of a mitigation structure and mitigation techniques, the disclosed embodiments permit immediate command recognition, notwithstanding potentially independent timing drift in the distributed clock in each memory device or rank. That is, for low power devices, these structures and techniques permit inter-rank timing skew mitigation and thus facilitate fine-interleaving, notwithstanding the absence of one or more PLLs to regulate clock phase on the memory devices.

III. Other Alternatives

It was stated at the beginning of this disclosure that a solution ideally provides a single memory controller design and/or memory device design that can support different layout implementations, architecture widths, capacities and platforms. For example, with the right architecture, a given memory controller design and DRAM or other memory technology could be used for smart phones, portable games or other portable devices, as well as in high performance products and future roadmap designs. Embodiments were then presented showing how multiple ranks can then be operated and fine-interleaved, notwithstanding the low power environment, with most examples showing one to two memory devices to explain the rank expansion concepts.

FIGS. 8A-8D are used to show how memory architectures can be expanded to eight or more memory devices, all using the same basic component architecture (i.e., the same memory controller and/or memory device). For example, the aforementioned memory controller and memory device designs (i.e., for any of the embodiments indicated above) can be used for any of the configurations of FIGS. 2A-2E, and more.

Figure 8A:
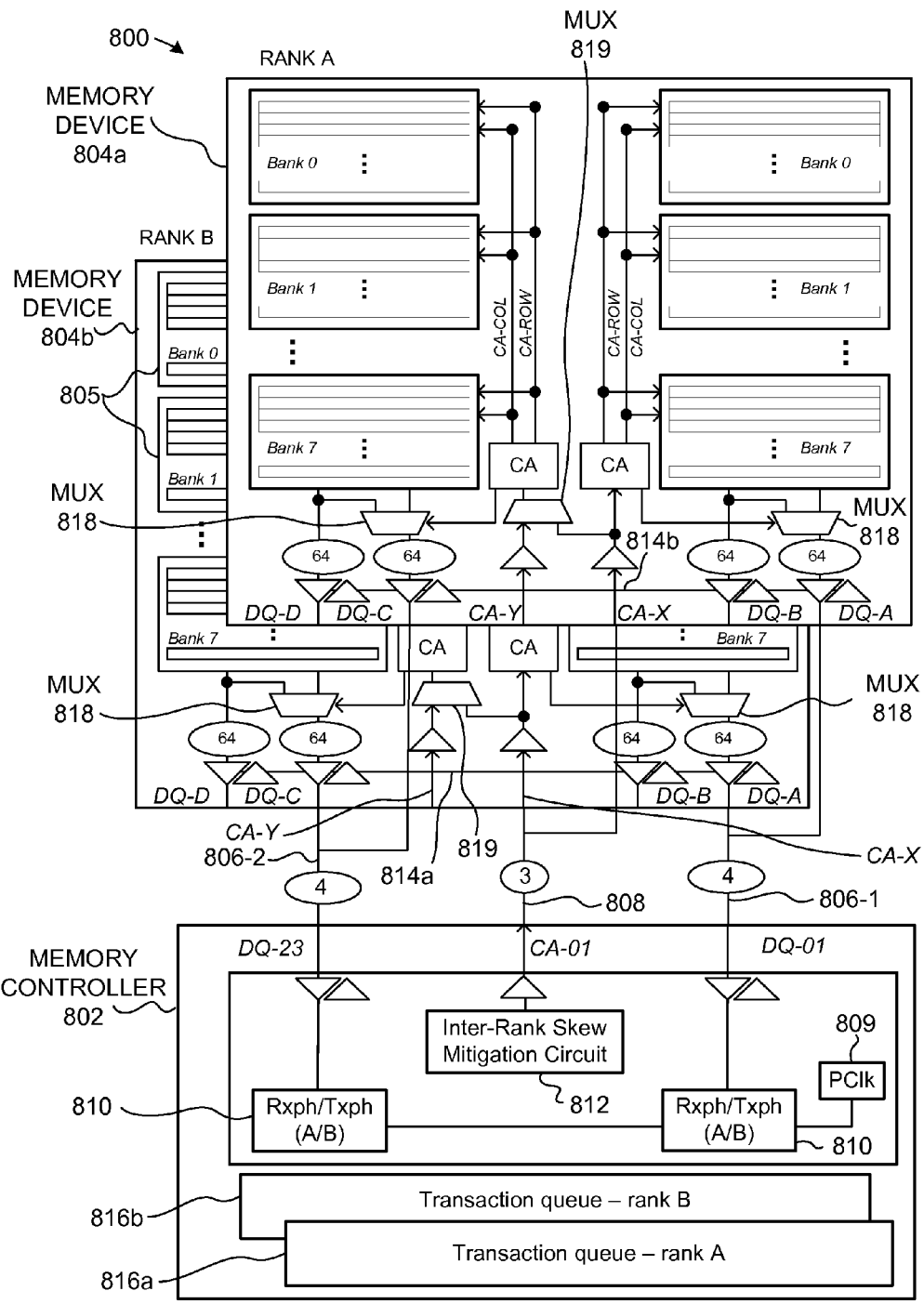
FIG. 8A shows a detailed layout for a memory system that uses techniques inter-rank skew mitigation, where the system includes a memory controller and two ranks of memory, depicted as respective memory devices operating in half-width mode.

FIG. 8A shows a first, general embodiment 800, where inter-rank skew mitigation is provided for using circuit 812. This design is highly similar to those explained earlier, where the skew mitigation circuit 812 can take the form of rank-specific clock circuitry, rank-specific CA path circuitry, or slot assignment circuitry; other techniques can also be used. Collectively these techniques can be referred to as part of the means for inter-rank skew mitigation. The memory controller 802 has four four-link DQ ports (DQ-0, DQ-1, DQ-2, DQ-3 and DQ-4, and two four-link CA ports (CA-0 and CA-1), each of which can be coupled to memory in a number of different configurations. Note that the memory controller also includes a processor clock 809, which depending on configuration, can be forwarded to one or more of the memory ranks for processing. The memory controller also has individual per-rank, per-link, per-direction phase adjustment circuitry 810 and transaction queues sufficient for managing the parallel threads (816a/816b). For its part, each memory device 804a/804b is a DRAM device with sixteen memory banks 805, an internally distributed clock signal 814a/814b (which can be derived from a forwarded processor clock and impacted differently for each rank by drift), four DQ ports, DQ-A, DQ-B, DQ-C and DQ-D, and two CA ports, CA-X and CA-Y. Note that these various ports can also be coupled in many different configurations, i.e., depending on memory capacity, the desired amount of threading, the proposed stacking thickness, packaging and other factors, the design of these components support many different layouts. Note that during configuration (at manufacture, power up or dynamically), the memory devices are programmed in a manner compatible with the specific topology or layout; note further that programming can be by software, by blowing a fuse, or wiring a component a certain way, or in any other manner that effectuates configuring the memory devices for a particular implementation. Depending on the programmed parameters, CA and DQ multiplexers 818 and 819, respectively are configured to perform appropriate path routing, and depending on embodiment, the size of the various paths may be reconfigured, for example, reducing outputs from each of left and right sets of banks from 128 bits wide to 64 bits wide to 32 bits wide or even smaller widths, by appropriately configuring array control circuitry for each bank and supporting 10 path circuitry. As mentioned, as width is reduced, reconfiguration preferably increases columns per row or rows per bank or the number of banks (in embodiments where the sense amplifier structure supports this). Per FIG. 8A, each memory device is seen to be in half-width mode, meaning that each memory bank is configured to output column of half-size (relative to the case where all four DQ ports are used), via either the DQ-A or DQ-C ports, depending on whether the left or right bank set is being accessed. The memory ranks are seen here coupled to the memory controller in a Pt2P configuration, with CA path 808 coupling either memory controller port CA-0 or port CA-1 with port CA-X of both memory ranks (A/B), DQ path 806-1 coupling one of memory controller ports DQ-0 or DQ-1 with ports DQ-A of both memory devices, and DQ path 806-2 coupling one of memory controller ports DQ-2 or DQ-3 with ports DQ-C of both memory devices.

Figure 8B:
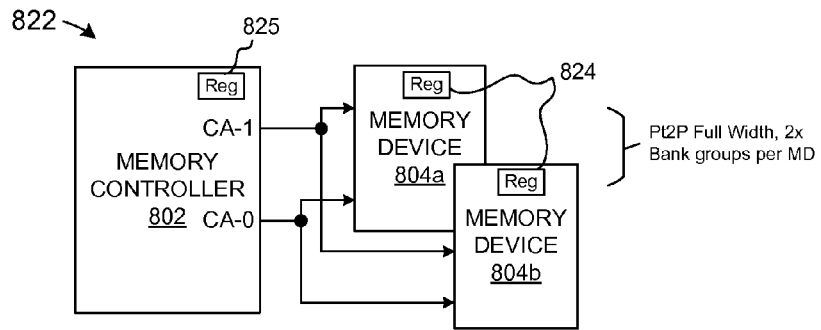
FIG. 8B shows a layout for a memory system having two memory ranks of memory, e.g., respective memory devices operated in full-width mode.

If desired, both memory devices 804a and 804b could be operated in full-width mode, that is, by using both memory controller CA ports (CA-X and CA-Y) and memory rank CA ports (CA-0 and CA-1) and running each set or group of memory banks (left and right sets) at 128 bits wide (or a different width, e.g., 256 bits as introduced earlier), with threading between memory bank sets as well as between ranks (e.g., each memory controller CA port would couple to both of the two respective CA-X or CA-Y memory device ports in a Pt2P configuration); in this case, four transaction queues might be used to track four parallel threads. This relationship is seen in FIG. 8B, which shows a system 822 in this configuration. Note the presence of respective mode registers 824 and 825 in the memory devices and controllers which are used to configure these integrated circuit devices for operation determined by the programmed mode.

Figure 8C:
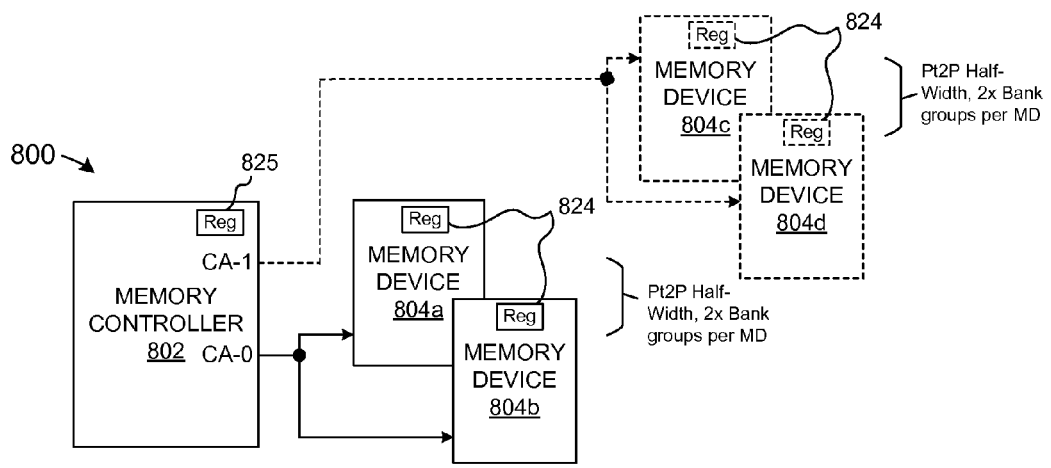
FIG. 8C shows a layout for a memory system having two groups of memory, each with two ranks, e.g., where each rank has a respective memory device operated in half-width mode. Dashed-lines indicate optional capacity increases for some implementations beyond two memory ranks (i.e., beyond a single, multirank group of memory).

FIG. 8C illustrates a system 800 which has twice the memory capacity of the system illustrated in FIG. 8B. Note that this system is labeled 800, because it presents the same basic topology as seen in FIG. 8A. This is to say, the memory controller 802 connects to memory devices 804*a* and 804*b* in a Pt2P configuration using a single CA, and each of left and right sets of memory banks is operated at half-width mode (64 bit columns) coupled to either DQ ports DQ-0/DQ-2 or DQ-1/DQ-3 of the memory controller. As represented in dashed lines, this permits the addition of another two memory devices (or ranks), 804*c*/804*d*, operated as a different but similarly configured set of memory, using the CA-1 port of the memory controller. These devices couple their DQ ports to the other of DQ ports DQ-1/DQ-3 or DQ-0/DQ-2. Thus, all four DQ ports and both CA ports of the memory controller are fully occupied, and the memory controller can run eight threads simultaneously, two in each memory device (804*a*/804*b*), with threading between both memory devices (or ranks in this case), and with another four similarly concurrent threads in memory devices 804*c*/804*d*. Note that, in this case, the memory controller uses eight transaction queues to track these threads. If desired, individual devices or bank sets can be operated in lock-step, reducing the number of threads, but increasing data exchanged per operation, which may or may not be desirable depending on application. Once again, configuration of memory controller and memory devices is performed by appropriately programming the respective registers 825/824.

Figure 8D:
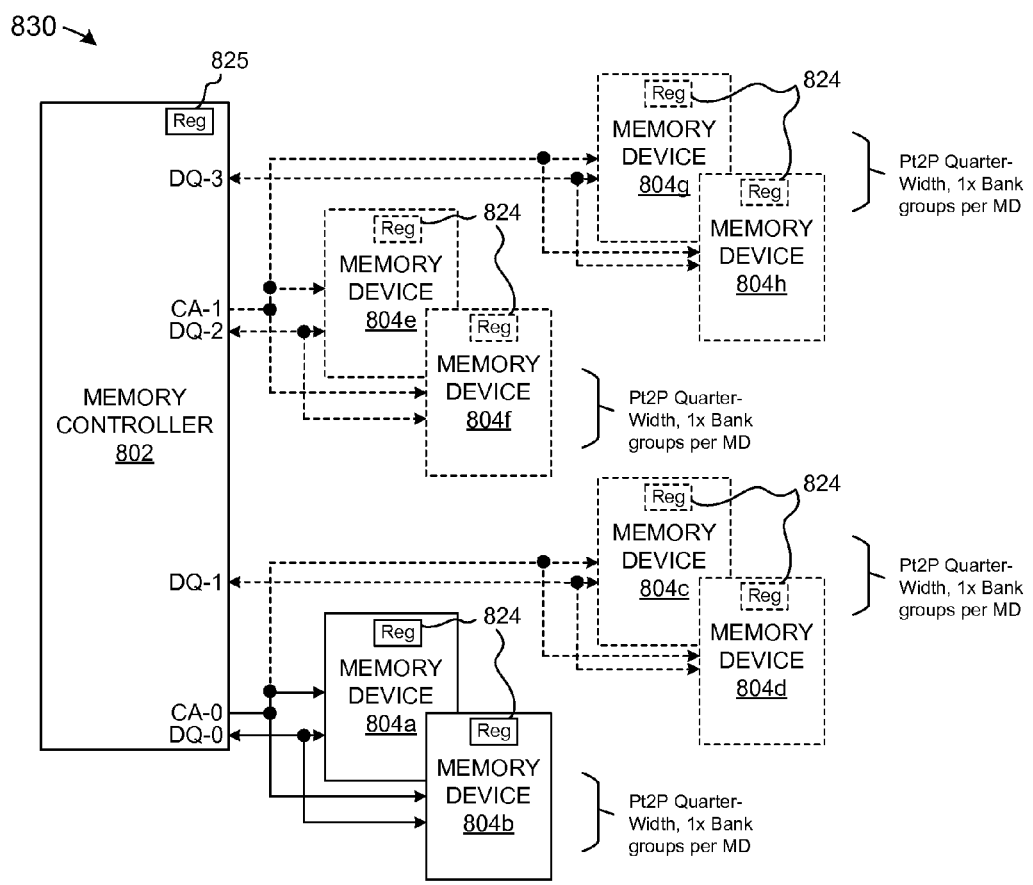
FIG. 8D shows a layout for a memory system having four groups of memory, each with two ranks, e.g., where each rank has a respective memory device operated in quarter-width mode. Dashed-lines indicate optional capacity increases for some implementations beyond two memory ranks (i.e., beyond a single, multirank group of memory.

FIG. 8D shows expansion of this basic system to interact with eight memory devices 804*a*/804*b*/804*c*/804*d*/804*e*/804*f*/804*g*/804*h*. This system is labeled using numeral 830, because its configuration is different than the configurations discussed previously. That is, the designs for the memory controller 802 and memory devices are identical to the designs seen earlier, but here, the routing is different, with each four-link DQ path from the memory controller split horizontally into two subsets, with two of the four links going to one bank set of each memory device, and the other two of the four links going to the other bank set. Thus, if there are four groups of two ranks, 804*a*/804*b*, 804*c*/804*d*, 804*e*/804*f*, and 804*g*/804*h*, each DQ port of the memory controller (DQ-0, DQ-1, DQ-2 and DQ-3) goes to a different one of these groups, with four memory devices linked to each of the two memory controller CA-ports (CA-X and CA-Y). Note that in this arrangement, each DQ link is coupled in a Pt2P configuration, while each CA link is coupled in a Pt4P configuration; the arrangement of FIG. 8D provides potential for up to sixteen concurrent threads, and eight times the memory capacity of a single thread, single device, single-rank embodiment. Further, while the arrangement of FIG. 8D features each memory device or rank run at quarter-width (i.e., 2 DQ links at 16:1 serialization), it is possible to further divide the DQ path and run these devices at one-eight width, i.e., with 16 bit column retrieval (using 1 DQ link at 16:1 serialization) and up to sixteen memory devices. Also, while the CA path is illustrated here as run in a Pt4P configuration, there are also alternatives here too, e.g., the three link CA path per memory controller CA port can be split, with one link going to each group of two memory devices, e.g., one CA link for devices 804*a*/804*b* versus one CA link for devices 804*c*/804*d*, and so on. It is possible also to use multiple inter-rank skew mitigation techniques together, e.g., a per-device forwarded clock can also be used with a partially-split CA (e.g., with two CA links going to each two-device group, one link shared, and one of the three overall CA links dedicated to a specific group of two devices, such as devices 804*a*/804*b* versus 804*c*/804*d*). Note once again the presence of registers 824 and 825 for configuration purposes. If eight devices are used as illustrated, devices in respective ranks (e.g., devices 804*a* and 804*c*) can optionally be operated in lock-step, with each device respectively providing a slice or subrank's worth of a single data word. Alternatively viewed, each rank can, depending on embodiment, be implemented to extend across multiple two-device groups, with multiple memory devices per rank.

Figure 8E:
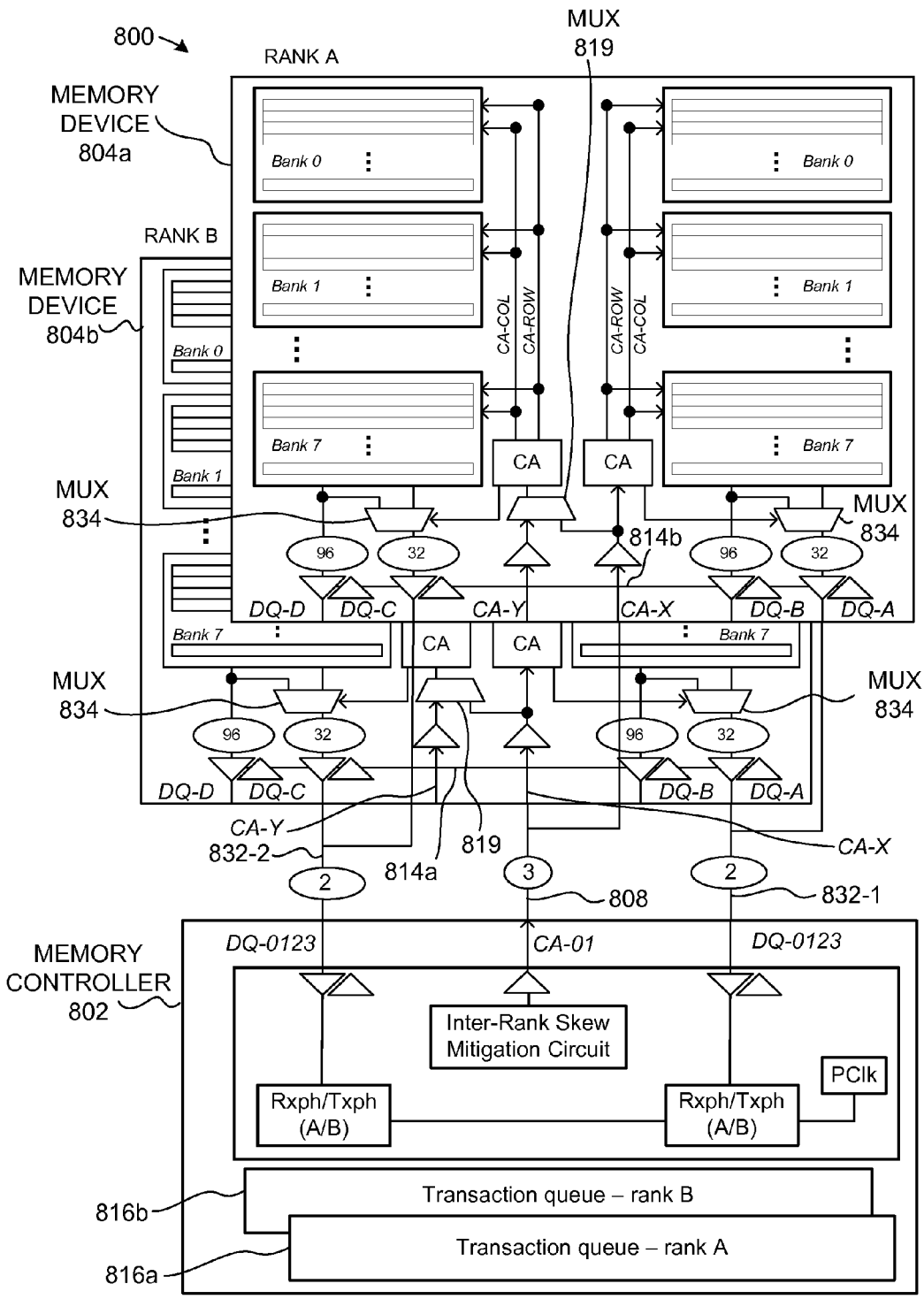
FIG. 8E shows a detailed layout for a memory system that uses techniques for inter-rank skew mitigation, where the system includes a memory controller and two ranks of memory, depicted as respective memory devices operating in quarter-width mode.

FIG. 8E illustrates the embodiment of FIG. 8A, configured to quarter-width mode. Generally speaking, the same elements from FIG. 8A (such as the CA path 808, transaction queues 816*a*/*b*, and so forth) are depicted with the same numbers in FIG. 8E. However, in FIG. 8E, several elements have been changed relative to FIG. 8A. First, it should be noted that the DQ path is now labeled 832-1/832-2, each consisting of two DQ links, and that this DQ path is now seen as connecting to any one of four memory controller DQ ports, DQ-0, DQ-1, DQ-2 or DQ-3 (i.e., this is represented by the notation "DQ-0123" within the memory controller 802). That is, the memory controller 802 and memory devices 804*a*/804*b* are the same, but the paths connecting them have been changed with the two links originating from both memory device ports DQ-A, coupling as a Pt2P path to one memory controller port (any one of ports DQ-0123), and with the two links originating from both device ports DQ-C coupling as a Pt2P path as the remaining two links for the particular memory controller port, four links in total. As mentioned above in connection with FIG. 8D, this permits two memory devices to be coupled as respective ranks to each of the four memory controller DQ ports, for a total of eight memory devices, with the three links of the CA path 808 either coupled to four memory devices in a Pt4P configuration (with threading between groups of two devices, and within each group, between ranks and between left and right banks sets for a total of eight threads), or in another manner (e.g., one or two CA links per group of two devices or ranks, as presented above). Note that within each memory device, the multiplexers for the DQ path have been renumbered as 834, indicating that they are now performing 4-to-1 selection, i.e., relative to full width mode where 128 bits was retrieved from each bank set, only 32 bits columns are retrieved in the quarter-width mode. With 16-to-1 serialization being used for transmission over the differential DQ path, this is consistent with the use of two DQ links from each memory device-side DQ port. If desired for the specific embodiment, each memory device can have its separate bank sets (left and right) operated in lock-step, to effectively provide respective slices of a single data word. If these bank groups or sets are operated independently (e.g., in a threaded manner), the memory controller 802 is configured to mask and perform appropriate shifting for the inbound sets of four DQ links for each DQ port, so as to obtain properly-formatted 32 bit columns of data from the pertinent set of four DQ links. Multiplexers 834 may be configured within the memory devices, and controller hardware provided with suitable transaction queue support, for each concurrent thread.

Quarter-width mode permits use of eight memory devices in a two-rank configuration, twelve memory devices in a three-rank configuration, sixteen memory devices in a four-rank configuration, and so on. As mentioned previously, the specifically-disclosed embodiments can be extended to one-eighth mode (e.g., one DQ link coupling to each of left and right bank sets in each memory device). For example, in a Pt2P configuration, up to four or more memory devices may be coupled to each memory controller DQ port, and this can be extended even further for other embodiments (e.g., such as where more than four DQ links are used per memory controller port). It is believed that use of a Pt2P configuration presents certain advantages, as providing a suitable reconciliation between complexity and the need to support additional memory capacity with fine-interleaving, i.e., the techniques presented above provide for at least two-fold increase in memory capacity for portable and other applications with a minimal impact on pin count and on memory controller and memory device architecture. However, further increases can also be obtained relying on the techniques provided herein.

IV. Termination Control

Figure 9A:
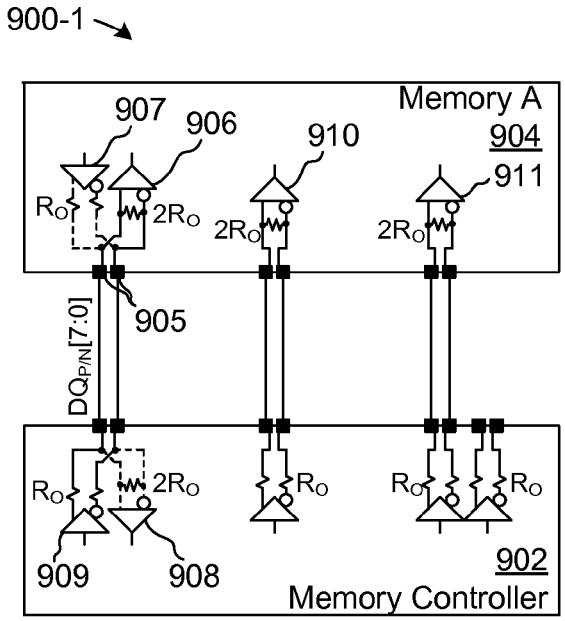
FIG. 9A shows a termination scheme for a memory system having a memory controller and a single rank of memory, with PtP connections.
Figure 9B:
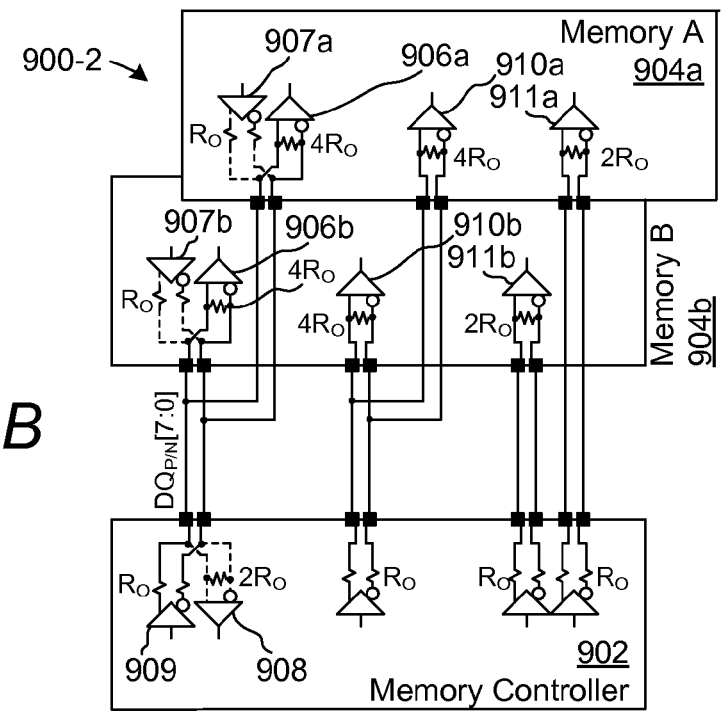
FIG. 9B shows a termination scheme for a memory system having a memory controller and two ranks of memory, with both PtP and Pt2P connections.
Figure 9C:
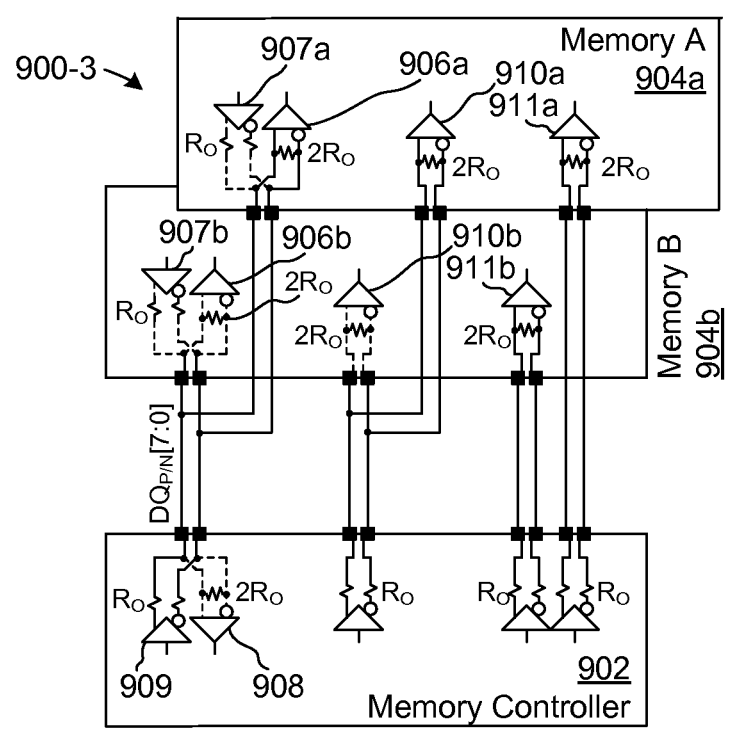
FIG. 9C shows an alternate termination scheme for a memory system having a memory controller and two ranks of memory, with both PtP and Pt2P connections.

It was earlier mentioned that some bubble time is allowed in certain embodiments for DQ and/or CA link driver and termination switch. FIGS. 9A-9C are provided to elaborate on these points. Generally speaking, when a memory controller addresses two devices or ranks at the same time, a consistent, line-matching impedance is maintained at the other end, i.e., at the collective ranks. What this implies is that when the memory controller address one rank only, a first impedance is used for that rank, and the other rank is set to an infinite (or second) impedance; when both ranks are addressed at the same time, double (the first) impedance is used at each rank, such that both ranks collectively present the first impedance from the perspective of the DQ link and the memory controller. Note also that each side generally has a transmitter and a receiver (for a bidirectional link, such as each link the DQ path); when one of these transmitters or receivers is used, the counterpart receiver or transmitter at the opposite end of the link is set to infinite input impedance, and this relationship is switched as the direction of transmission is switched. In addition to termination changes, note that this link turnaround (i.e., change in signaling direction) is tied to relative driver activation; if a rank switch involves both a directional change (e.g., read to write or vice-versa) and a rank switch, care is taken to ensure that one memory device (for example) is not driving a signal out while the receiver of the other rank of memory is still set to a relatively low termination, as this wastes power and can affect the ability of the memory controller to properly interpret the signal. There also exist other examples of potential conflict. For all of these reasons, termination switch and driver switch is regulated in a manner that avoids conflict and many embodiments will still allow a small (e.g., 2 clock cycle) link idle time or "bubble" to ensure that the changes are adequately completed. FIGS. 9A-9C address the differential case, per many of the embodiments above, and are easily extended to the single-ended case.

In particular, FIG. 9A shows a single rank system diagram 900-1 with a single memory controller 902 and a single memory device 904. Note that a single bidirectional link, i.e., a DQ link, is shown at the left-side of the figure (this can be any of eight links $DQ_{P/N}[7:0]$, which can of course be varied depending on embodiment). Two unidirectional links extending from the memory controller to the memory device are seen at the middle and right-side of the figure. As should be apparent, each connection in this Figure represents a PtP connection, where a output impedance of "$R_O$" is used for the transmitter (e.g., 907 or 909) and an input impedance of "$2R_O$" is used for the receiver (e.g., 906, 908, 910 or 911). Note that although the middle and right-side links between memory controller and memory device are not labeled, these could be for example a forwarded timing signal and a CA link respectively, or vice-versa. These links can also represent other various types of signals extending between the memory controller and memory device. Also, it should be appreciated that the transmitter and receiver on one side of a link are generally not active at the same time. That is, as seen for the DQ path, memory-side transmitter 907 has its path coupling to signal pads 905 turned "off" (or set to infinite impedance) when the memory-side receiver 906 is receiving data; similarly, memory controller-side receiver 908 has its coupling to memory controller signal paths turned "off" when the memory-controller-side transmitter 909 is actively transmitting data. This relationship is inverted when the transmission direction is switched.

FIG. 9B shows a memory system 900-2 with the same components as before, but now having multiple ranks, that is, with two memory devices 904a and 904b and one or more PtMP connections. Because only one transmitter is active at any one point in time per-link, that output impedance "$R_O$" is still used (e.g., see transmitters 907a/907b/909). Similarly, because there is only one memory controller, its receiver still uses a receive termination of "$2R_O$;" the same is true for any receiver still representing only a single active destination at a time (see, e.g., receivers 911a/911b, i.e., representing a PtP CA link or a PtP dedicated timing signal, borrowing from two of the examples introduced earlier). However, where the direction is Pt2P, e.g., where multiple receivers are listening at the same time, such that two receivers are active as parallel destinations, the input impedance is set to "$4R_O$" (see, e.g., receivers 906a/906b and 910a/910b). Again, per the embodiments earlier, these Pt2P links can be DQ/CA/timing signals or other links, depending on implementation and, once again, the framework is easily extended to a single ended case. If more than two ranks are used, the receiver termination for multiple, concurrent active destinations is further changed to reflect the parallel paths (for example, "$6R_O$" for Pt3P configurations, "$8R_O$" for Pt4P configurations, and so on). Link idle times are provided to accommodate these various switches, enabling and disabling of drivers and receivers (see for example signals "EnW/EnR/EnCA" see in FIGS. 7A-7B), phase-code switches pertinent to the component and embodiment, and so forth.

FIG. 9C underscores the tailoring of termination depending on the number of destinations. In this configuration 900-3, it is noted that both receiver and transmitter (906b/907b) of memory B (904b) are turned "off" (i.e., set to infinite impedance) as represented by dashed lines. Because only one receiver is active (906a), the input impedance of this receiver is set to "$2R_O$" Note that the other labeled elements are unchanged relative to FIG. 9B.

The termination control scheme presented above is for illustration only, and will vary according to embodiment. Termination may vary depending on signal routing used, path length, type, driver and sampler type, number of ranks, whether the link in question is single ended or differential, depending on the drive and sense logic used, and many other factors. The design of termination control suitable to the specific embodiment is well within the skill of one familiar with digital logic.

V. Conclusion

The techniques and embodiments presented above have illustrated how multiple ranks can be used to increase system capacity and accessed in a manner that addresses inter-rank clock skew. These techniques and embodiments are particularly advantageous in low power applications, where memory devices may not possess phase alignment circuitry or other mechanisms to compensate for drift in the distributed clock. The techniques and embodiments presented above are examples only. That is, while the use of (a) rank specific, phase-calibrated timing signals, (b) a split CA, part of the path being PtP and part being PtMP, and (c) the use of CA slots provide three specific mechanisms for inter-rank skew, there are many variants of these techniques that can be applied to other links. Note that one advantage provided by using these techniques is to facilitate fine-interleaving of commands, and thus, continued high performance as capacity is increased. These techniques, however, may be applied even where fine-interleaving is not performed, and similarly, fine-interleaving can be performed without using these techniques (e.g., through the use of large CA rank switch timing bubbles that can interfere with performance). Note that it would be possible to, without the techniques provided herein, simply use conventional circuitry, live with any inability to effectively interleave commands back and forth between ranks, and use very large burst lengths to mask the incidence of rank switch delays. Also, while these techniques are especially useful for low power and/or portable systems, they can be provided for other systems as well, e.g., large scale computer systems; recall that one benefit from having a memory controller design and/or memory device design that can support multiple configurations is the ability to base different products' design platforms on a single memory controller and/or memory device design. The techniques presented above provide solutions useful for all of these applications.

It should also be noted that the various circuits disclosed above may be described using computer aided design tools and expressed (or represented), as data or instructions embodied in various machine-readable media (i.e., storage media recognizable by computers, such as in electronic memory, CD-ROM, DVD, optical, magnetic or other formats used to read data by machines). In particular, machine-readable media may be used by a computer, such as a personal computer, to design or fabricate an integrated circuit using data stored on the machine-readable media. If desired, the media may alternatively reside internal to the computer (e.g., in the form of data stored on internal electrical, magnetic or optical storage circuitry). The data stored on the media defines a circuit and is ideally in a form which may be used and modified by a designer and applied to the fabrication of physical devices (e.g., chips, such as flash memory chips embodying the principles discussed above). The data may be expressed in terms of their behavioral, register transfer, logic component, transistor, layout geometries, or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES. Other suitable formats and languages may also be used. When received within a machine such as a computer system, such data or instructions may be processed in connection with execution of one or more computer programs including, without limitation, net-list generation programs, place and route programs and the like, to generate a representation or image of a physical manifestation of such circuits. The representation or image may thereafter ideally be used in fabrication, for example, by enabling generation of one or more masks that are used to form various components of the circuits, for example, as represented by the designs presented above. Resultant devices may be evaluated, with desired changes incorporated back into the data describing the device, as part of a manual design (change) process. Once the design is suitably refined, the data stored on machine readable media may be converted to a format used in the direct control of circuit manufacturing devices.

The embodiments discussed above are primarily couched in terms of DRAM, but the teachings of this disclosure may be applied to other forms of memory, both volatile and non-volatile. For example, a number of designs for non-volatile memories are currently proposed or are in development, including designs based on flash memory, phase or state change memory, magnetic random access memory ("magnetic RAM" or "MRAM"), resistive RAM, metallized RAM, nanowire RAM and other technologies. Although known by a wide number of acronyms and names, these designs usually are based on a material (usually a metal or semiconductor) that reversibly changes a physical or electrical state under the application of a voltage, field, current, or other effect; the state can be nondestructively sensed, thereby permitting use of the state for information storage. In many of these forms, a general transaction (e.g., a "programming" command) can in fact be broken into microcommands (such as for example, individual program and verify operations for flash memory, in multiple cycles that make up each write command). The same can be said for SDRAM and many other forms of volatile memory. It should be possible to apply teachings from this disclosure to all such forms of memory.

In the foregoing description and in the accompanying drawings, specific terminology and drawing symbols have been set forth to provide a thorough understanding of disclosed embodiments. In some instances, the terminology and symbols may imply specific details that are not required to practice every embodiment. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. The term "coupled" is used herein to express a direct connection as well as a connection through one or more intervening circuits or structures. The term "exemplary" is used to express an example, not a preference or requirement.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

We claim:

1. A memory controller adapted for use in a memory system in which the memory controller is to issue commands, each command to an addressed one of a first rank of memory or a second rank of memory, over a command/address bus having (i) at least one shared link that couples the memory controller with both of the first rank of memory and the second rank of memory in a point-to-multi-point configuration, (ii) one or more first dedicated links that couples the memory controller with the first rank of memory but not the second rank of memory, and (iii) one or more second dedicated links that couple the memory controller with the second rank of memory but not the first rank of memory, where each rank of memory has an open loop clock distribution architecture that defines a respective sampling instant used to sample each shared link of the command/address bus, and the respective first or second dedicated links, the memory controller comprising:

logic operable to generate a first command/address signal and to transmit the first command/address signal to an addressed one of the first rank of memory or the second rank of memory over the respective one of the one or more first or second dedicated links, according to a unique clock phase corresponding to offset experienced by the addressed one of the first or second ranks of memory relative to the other of the first or second ranks of memory; and logic operable to generate a second command/address signal and to transmit the second command/address signal over the at least one shared link to either one of the first or second ranks of memory.

2. The memory controller of claim 1, wherein the logic operable to generate and transmit the first command/address signal is operable to issue select commands over the one or more first or second dedicated links, depending on command-type, and wherein the logic operable to generate and transmit the second command/address signal is operable to issue commands other than the select commands over the at least one shared link.

3. The memory controller of claim 1, where the memory controller further comprises calibration circuitry operable to calibrate transmit timing of each of the first command/address signal and the second command/address signal, on a dynamic basis, to compensate for variation in at least one of voltage or temperature.

4. The memory controller of claim 1, where:
the memory controller further comprises a mode register;
the memory controller is to operate in a first mode or a second mode depending on content of the mode register;
the memory controller is operable in the first mode to issue the first calibrated command/address signal to the first rank of memory and the second calibrated command/address signal to the second rank of memory, each via a dedicated, respective signal pin;
the memory controller is, in the second mode, adapted for use in a memory system with only one rank of memory; and
the memory controller is operable in the second mode to issue the commands only to the one rank of memory, and to disable issuance of the second calibrated command/address signal via the respective signal pin.

5. The memory controller of claim 1, where the at least one shared link comprises plural shared links that couple the memory controller with both of the first rank of memory and the second rank of memory, each in a point-to-multi-point configuration, and where the memory controller further comprises:
a command/address bus interface having per-link phase adjustment circuitry operable to adjust transmit phase for each of the plural shared links in a manner that is rank-dependent.

6. The memory controller of claim 1, where the memory controller is operable to transmit activate commands over the one or more first dedicated links or the one or more second dedicated links, and column access commands over the at least one shared link.

7. The memory controller of claim 1, where the memory controller is operable to transmit precharge commands over the one or more first dedicated links or the one or more second dedicated links, and column access commands over the at least one shared link.

8. The memory controller of claim 1, where the logic operable to transmit the first command/address signal includes circuitry operable to fine-interleave one of an activate command or a precharge command intended for the first rank of memory in between two otherwise temporally-successive commands intended for the second rank of memory.

9. A method of accessing memory in a system having a first rank of memory and a second rank of memory, using a command/address bus having at least one shared link that couples a memory controller with both of the first rank of memory and the second rank of memory in a point-to-multi-point configuration, where each rank of memory has an open loop clock distribution architecture that defines a respective sampling instant used to sample a link of the command/address bus, the method comprising:

measuring relative offset between the respective ranks' sampling instants;
transmitting at least one command/address signal to either one of the first and second ranks of memory over the at least one shared link; and
compensating at least one of (a) transmission of at least one command/address signal to the first rank or the second rank by an amount correlated with the measured relative offset between the respective ranks' sampling instants or (b) sampling by the respective ranks of at least one command/address signal by an amount correlated with the measured relative offset between the respective ranks' sampling instants.

10. The method of claim 9, where the relative offset is relative drift, and where the measuring is dynamically performed during run-time of the memory controller.

11. The method of claim 9 further comprising:
determining, in a loopback-based timing calibration operation, respective loopback times required for (i) a first signal transmitted on the at least one shared link to propagate from the memory controller to the first rank of memory and back to from the first rank of memory to the memory controller, and (ii) a second signal transmitted on the at least one shared link to propagate from the memory controller to the second rank of memory and back from the second rank of memory to the memory controller; and
determining the measured relative offset between the sampling instants of the first and second ranks of memory in accordance with a difference between the respective loopback times for the first and second ranks memory.

12. The method of claim 11 wherein determining the respective loopback times and determining the measured relative offset between the sampling instants of the first and second ranks of memory comprises iteratively determining the respective loopback times and determining the measured relative offset to compensate for phase drift between desired sampling instants of the first and second ranks of memory.

13. The method of claim 11 wherein the command/address bus comprises at least a first dedicated signaling link coupled point-to-point between the memory controller and the first rank of memory devices, and at least a second dedicated signaling link coupled point-to-point between the memory controller and the second rank of memory devices, and wherein compensating comprises transmitting phase information via at least one of the first dedicated signaling link or the second dedicated signaling link.

14. The method of claim 13 wherein transmitting phase information via at least one of the first dedicated signaling link or the second dedicated signaling link comprises transmitting information indicative of the measured relative offset between the sampling instants of the first and second ranks of memory devices.

15. The method of claim 9 wherein compensating transmission of at least one command/address signal to the first rank or the second rank comprises delaying transmission of the at least one command/address signal to the first rank or the second rank by a time correlated with the measured relative offset between the sampling instants of the first and second ranks.

16. The method of claim 9 wherein compensating sampling of at least one command/address signal comprises delaying sampling of the at least one command/address signal within receiver circuitry of the first rank or the second rank by a time correlated with the measured relative offset between the sampling instants of the first and second ranks.

17. The method of claim 9 wherein the memory system comprises a plurality of shared links, including the at least one shared link, that couple the memory controller with both of the first rank of memory and the second rank of memory, each in a point-to-multi-point configuration, the method further comprising: adjusting a respective transmit phase for each shared link of the plurality of shared links independently of the transmit phases of the others of the plurality of shared links.

18. A non-transitory machine readable medium that stores data representative of an integrated circuit memory controller adapted for use in a memory system in which the memory controller is to issue commands, each command to an addressed one of a first rank of memory or a second rank of memory, over a command/address bus having (i) at least one shared link that couples the memory controller with both of the first rank of memory and the second rank of memory in a point-to-multi-point configuration, (ii) one or more first dedicated links that couples the memory controller with the first rank of memory but not the second rank of memory, and (iii) one or more second dedicated links that couple the memory controller with the second rank of memory but not the first rank of memory, where each rank of memory has an open loop clock distribution architecture that defines a respective sampling instant used to sample each shared link of the command/address bus, and the respective first or second dedicated links, the memory controller having:
 logic operable to generate a first command/address signal and to transmit the first command/address signal to an addressed one of the first rank of memory or the second rank of memory over the respective one of the one or more first or second dedicated links, according to a unique clock phase corresponding to offset experienced by the addressed one of the first or second ranks of memory relative to the other of the first or second ranks of memory; and
 logic operable to generate a second command/address signal and to transmit the second command/address signal over the at least one shared link to either one of the first or second ranks of memory.

* * * * *